(12) United States Patent
Kimura et al.

(10) Patent No.: US 8,564,741 B2
(45) Date of Patent: Oct. 22, 2013

(54) DISPLAY DEVICE

(75) Inventors: Hajime Kimura, Kanagawa (JP); Hideaki Shishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/834,152

(22) Filed: Jul. 12, 2010

(65) Prior Publication Data

US 2010/0277671 A1 Nov. 4, 2010

Related U.S. Application Data

(63) Continuation of application No. 11/645,072, filed on Dec. 22, 2006, now Pat. No. 7,755,715.

(30) Foreign Application Priority Data

Dec. 28, 2005 (JP) ................................. 2005-379956

(51) Int. Cl.
*G02F 1/1335* (2006.01)
*F21V 29/00* (2006.01)

(52) U.S. Cl.
USPC .................. 349/65; 349/62; 349/64; 362/294

(58) Field of Classification Search
USPC .................. 349/62, 64, 65; 362/294
See application file for complete search history.

(56) References Cited

U.S. PATENT DOCUMENTS

| | | | |
|---|---|---|---|
| 5,980,306 A | 11/1999 | Tanaka et al. | |
| 6,219,117 B1 * | 4/2001 | Nagakubo et al. | 349/65 |
| 6,519,146 B2 | 2/2003 | Nagashima et al. | |
| 6,542,308 B2 | 4/2003 | Hirata et al. | |
| 6,737,790 B2 | 5/2004 | Seki et al. | |
| 6,798,655 B2 | 9/2004 | Nagashima et al. | |
| 7,057,894 B2 | 6/2006 | Chang | |
| 7,157,838 B2 | 1/2007 | Thielemans et al. | |
| 7,185,995 B2 | 3/2007 | Hatanaka et al. | |
| 7,318,664 B2 | 1/2008 | Hatanaka et al. | |

(Continued)

FOREIGN PATENT DOCUMENTS

| | | |
|---|---|---|
| CN | 1525810 A | 9/2004 |
| CN | 1658744 A | 8/2005 |

(Continued)

OTHER PUBLICATIONS

Nomura et al., Room Temperature fabrication of transparent flexible thin-film transistors using amorphous oxide semiconductors, Nov. 25, 2004, Nature, vol. 432, pp. 488-492.*

(Continued)

*Primary Examiner* — Mark Robinson
*Assistant Examiner* — Jerry Blevins
(74) *Attorney, Agent, or Firm* — Husch Blackwell LLP

(57) ABSTRACT

A cooling device is provided, where an LED backlight can be efficiently cooled in order to suppress display unevenness caused by heat generated from the LED backlight. In addition, a display device including the cooling device is also provided. A display device is provided, where the LED backlight can be cooled by arranging a coolant pipe on a back surface side of the LED backlight and supplying a coolant to a coolant pipe. Further, a display device is provided, where cooling efficiency of the LED backlight can be more improved by arranging a thermal conductor between the LED backlight and the cooling device.

28 Claims, 63 Drawing Sheets

(56) References Cited

U.S. PATENT DOCUMENTS

| | | | |
|---|---|---|---|
| 7,345,320 B2 | 3/2008 | Dahm | |
| 7,482,636 B2 | 1/2009 | Murayama et al. | |
| 7,489,373 B2 * | 2/2009 | Kim | 349/64 |
| 7,560,741 B2 | 7/2009 | Härle et al. | |
| 7,624,789 B2 | 12/2009 | Minamitani et al. | |
| 7,812,365 B2 | 10/2010 | Murayama | |
| 7,863,641 B2 | 1/2011 | Dahm | |
| 2003/0025854 A1 | 2/2003 | Hosoda | |
| 2003/0052584 A1 | 3/2003 | Matsui et al. | |
| 2004/0180217 A1 | 9/2004 | Inoue et al. | |
| 2004/0196628 A1 | 10/2004 | Hisano et al. | |
| 2004/0212747 A1 | 10/2004 | Saitoh et al. | |
| 2005/0157516 A1 * | 7/2005 | Chen et al. | 362/555 |
| 2005/0158687 A1 | 7/2005 | Dahm | |
| 2005/0275766 A1 * | 12/2005 | Liu et al. | 349/64 |
| 2006/0023127 A1 | 2/2006 | Peeters et al. | |
| 2006/0082271 A1 * | 4/2006 | Lee et al. | 313/35 |
| 2006/0132699 A1 | 6/2006 | Cho et al. | |
| 2007/0047228 A1 | 3/2007 | Thompson et al. | |
| 2007/0047261 A1 | 3/2007 | Thompson et al. | |
| 2007/0063338 A1 | 3/2007 | Chang et al. | |
| 2007/0103908 A1 | 5/2007 | Tabito et al. | |
| 2008/0308774 A1 | 12/2008 | Inoue et al. | |
| 2010/0219736 A1 | 9/2010 | Dahm | |
| 2010/0220472 A1 | 9/2010 | Dahm | |
| 2012/0068130 A1 | 3/2012 | Inoue et al. | |

FOREIGN PATENT DOCUMENTS

| | | |
|---|---|---|
| CN | 1932603 A | 3/2007 |
| EP | 0 959 488 A1 | 11/1999 |
| EP | 1 408 475 A1 | 4/2004 |
| EP | 1 408 476 A1 | 4/2004 |
| EP | 1 422 312 A1 | 5/2004 |
| EP | 1 443 813 A2 | 8/2004 |
| EP | 1 564 626 A1 | 8/2005 |
| EP | 1 681 728 A1 | 7/2006 |
| EP | 2 264 211 A1 | 12/2010 |
| EP | 2 278 041 A1 | 1/2011 |
| EP | 2 280 092 A1 | 2/2011 |
| JP | 61-164623 | 7/1986 |
| JP | 5-275584 | 10/1993 |
| JP | 6-204368 | 7/1994 |
| JP | 7-332883 | 12/1995 |
| JP | 8-179836 | 7/1996 |
| JP | 2006-293182 | 10/1996 |
| JP | 8-305301 | 11/1996 |
| JP | 10-96898 | 4/1998 |
| JP | 10-135653 | 5/1998 |
| JP | 2000-39846 | 2/2000 |
| JP | 2002-81874 | 3/2002 |
| JP | 2002-182796 | 6/2002 |
| JP | 2003-36032 | 2/2003 |
| JP | 2003-209210 | 7/2003 |
| JP | 2004-6603 | 1/2004 |
| JP | 2005-70651 | 3/2005 |
| JP | 2005-117023 | 4/2005 |
| JP | 2005-136224 | 5/2005 |
| JP | 2005150240 | 6/2005 |
| JP | 2005-228695 | 8/2005 |
| JP | 2005-294185 | 10/2005 |
| JP | 2005-303211 | 10/2005 |
| JP | 2005-532587 | 10/2005 |
| JP | 2005-317480 | 11/2005 |
| JP | 2005-534201 | 11/2005 |
| JP | 2005-353498 | 12/2005 |
| JP | 2006-19557 | 1/2006 |
| JP | 2006-58486 | 3/2006 |
| KR | 10-2004-0030889 | 4/2004 |
| KR | 10-2004-0057269 | 7/2004 |
| TW | 200412222 A | 7/2004 |
| TW | I220468 B | 8/2004 |
| TW | I224233 B | 11/2004 |
| WO | WO 2004/005979 A1 | 1/2004 |
| WO | WO 2004/011848 A2 | 2/2004 |
| WO | WO 2004/038759 A2 | 5/2004 |
| WO | WO 2004/077578 A2 | 9/2004 |

OTHER PUBLICATIONS

Office Action re Chinese application No. CN 200610156261.8, dated Nov. 20, 2009 (with English translation).

Office Action re Chinese application No. CN 201010262643.5, dated Sep. 8, 2011 (with English translation).

Office Action re Korean application No. KR 10-2006-0135943, dated Feb. 26, 2013 (with English translation).

Office Action re Korean application No. KR 10-2011-0106195, dated Feb. 26, 2013 (with English translation).

Office Action re Taiwanese application No. TW 095146044, dated Jan. 7, 2013 (with English translation).

* cited by examiner

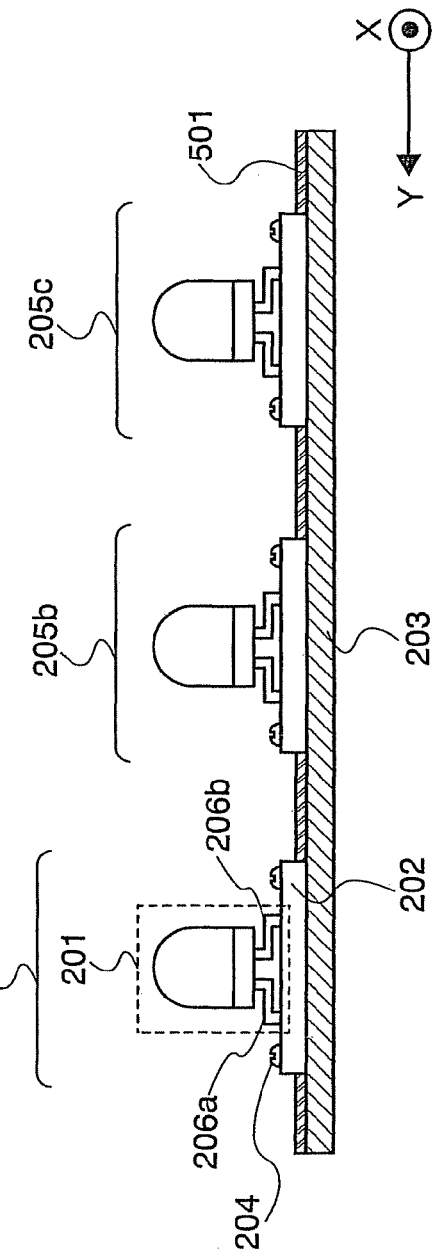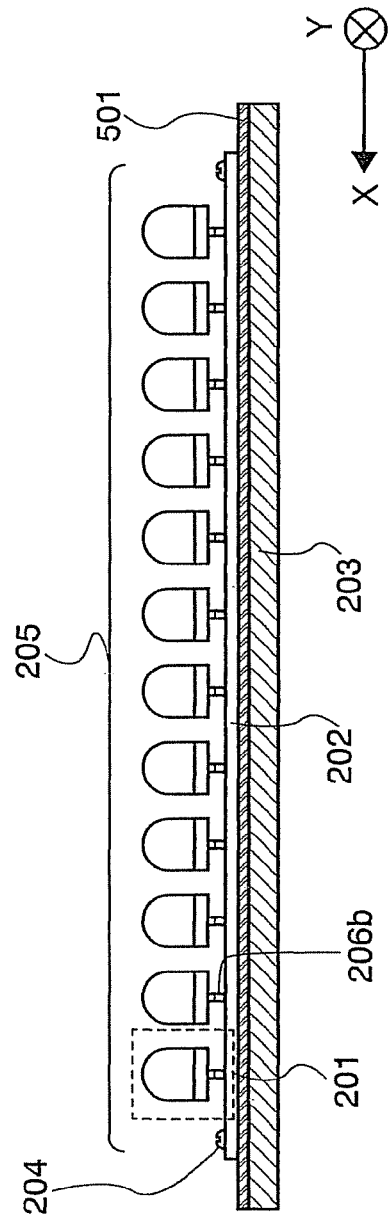

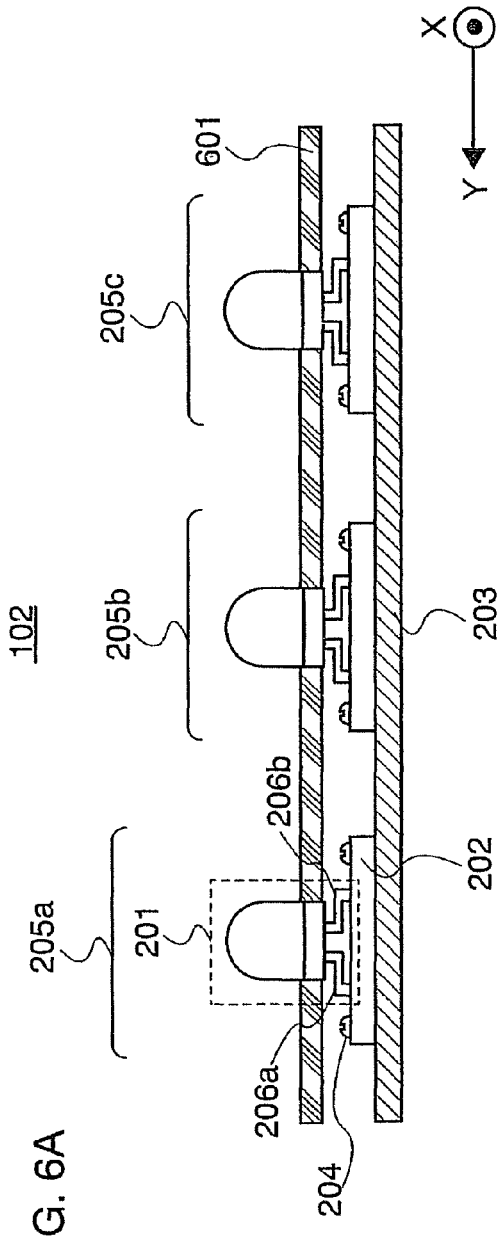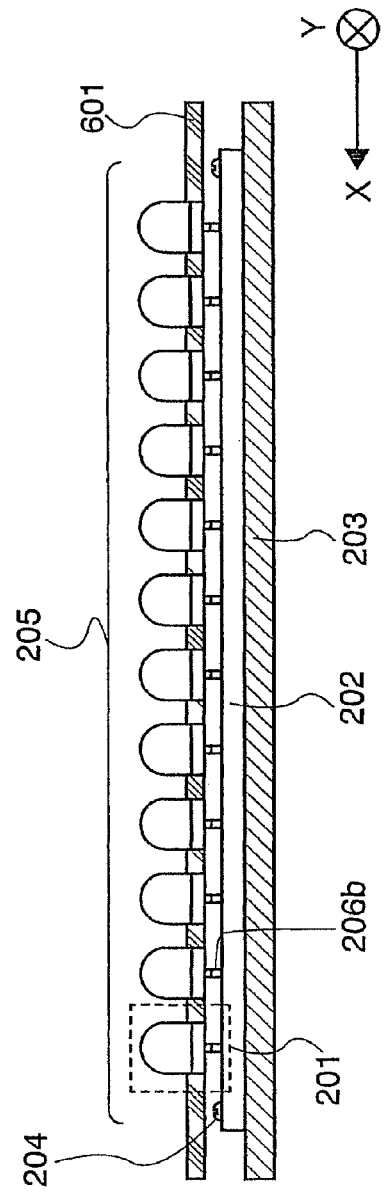

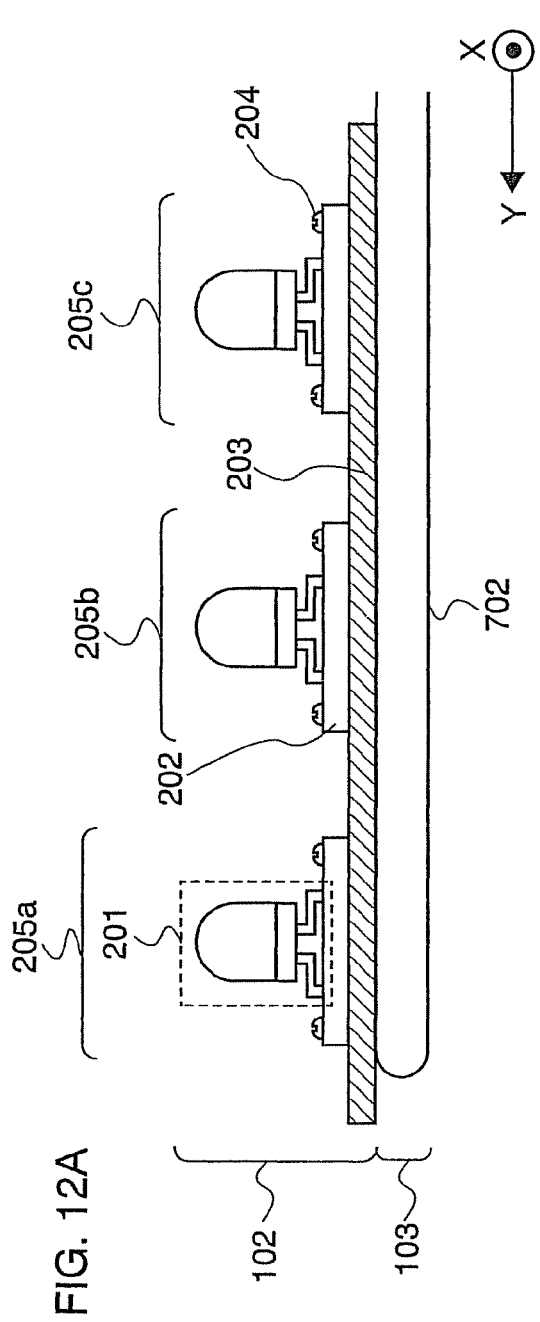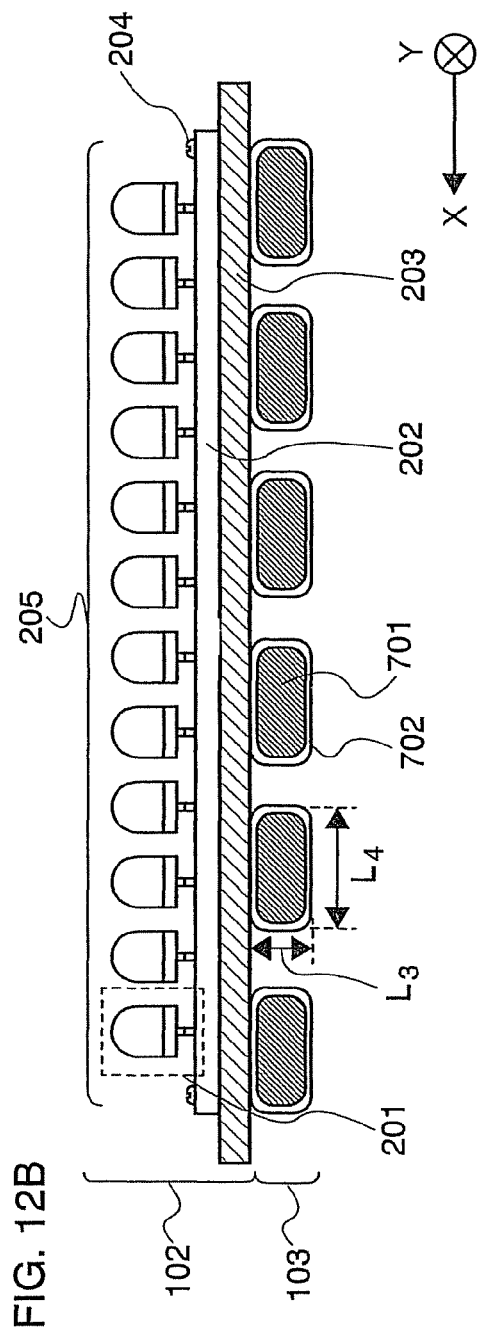

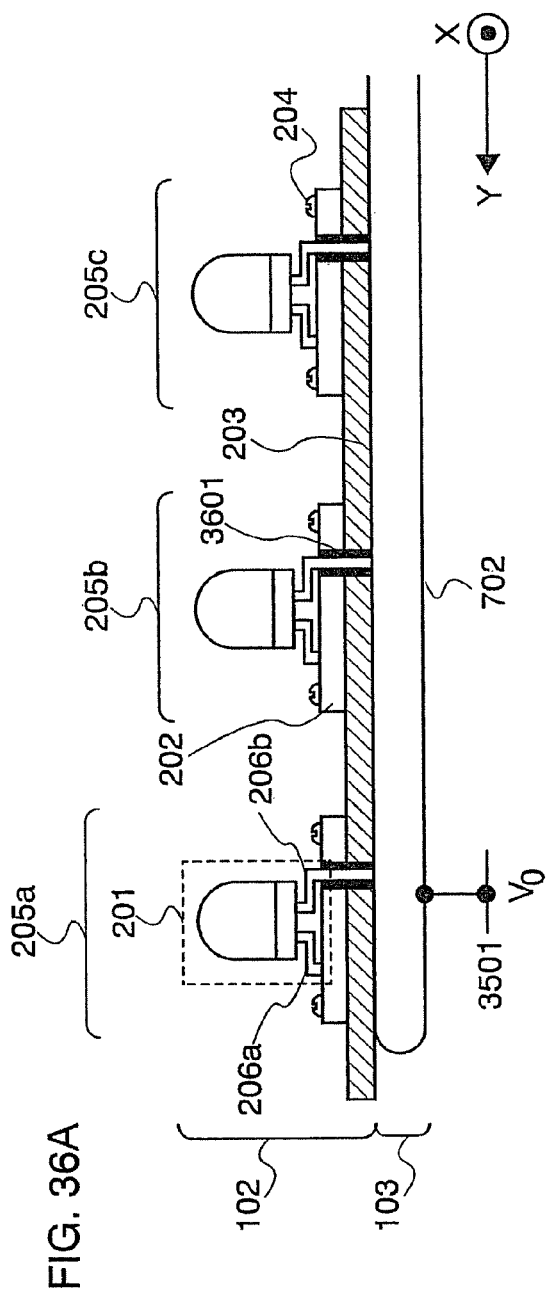
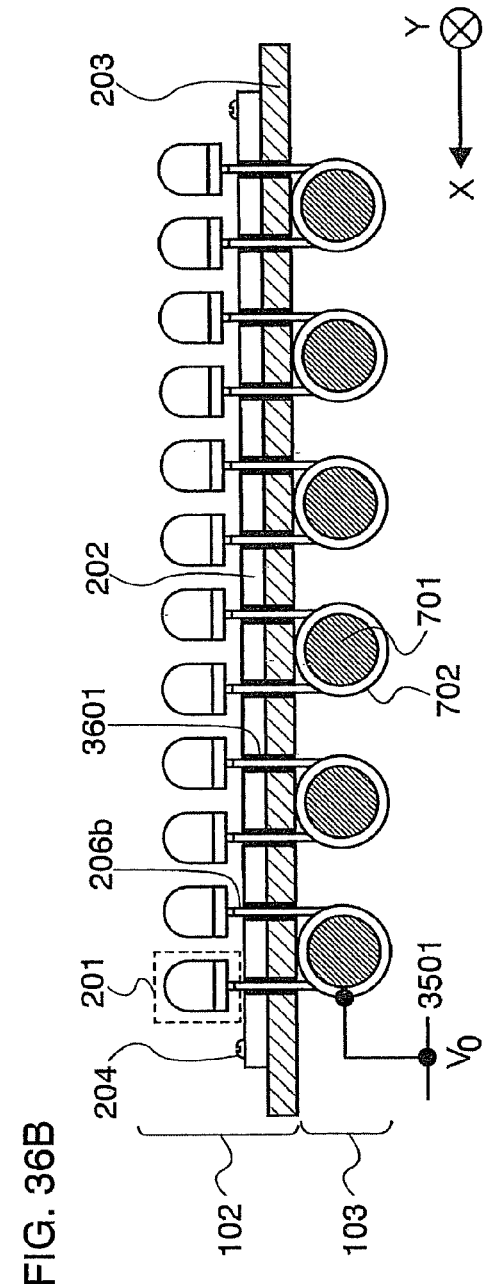
FIG. 36A
FIG. 36B

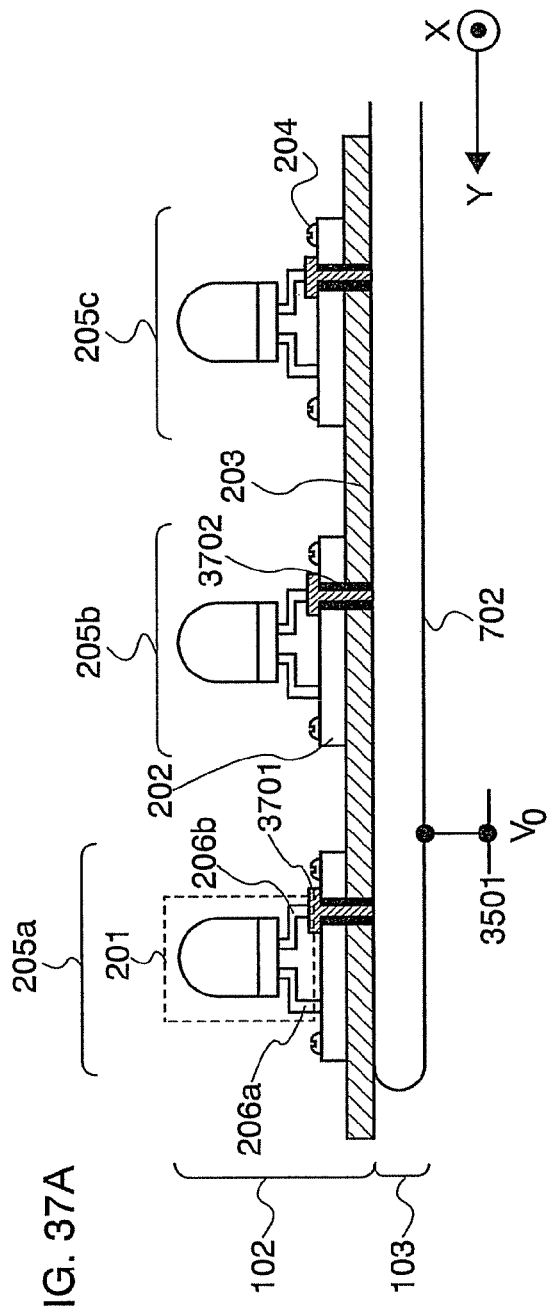
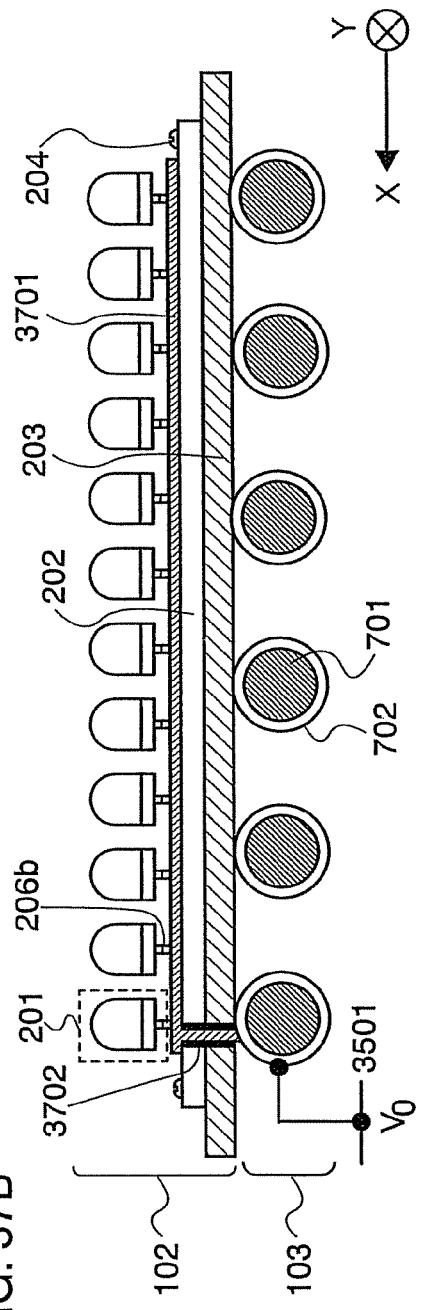
FIG. 37A
FIG. 37B

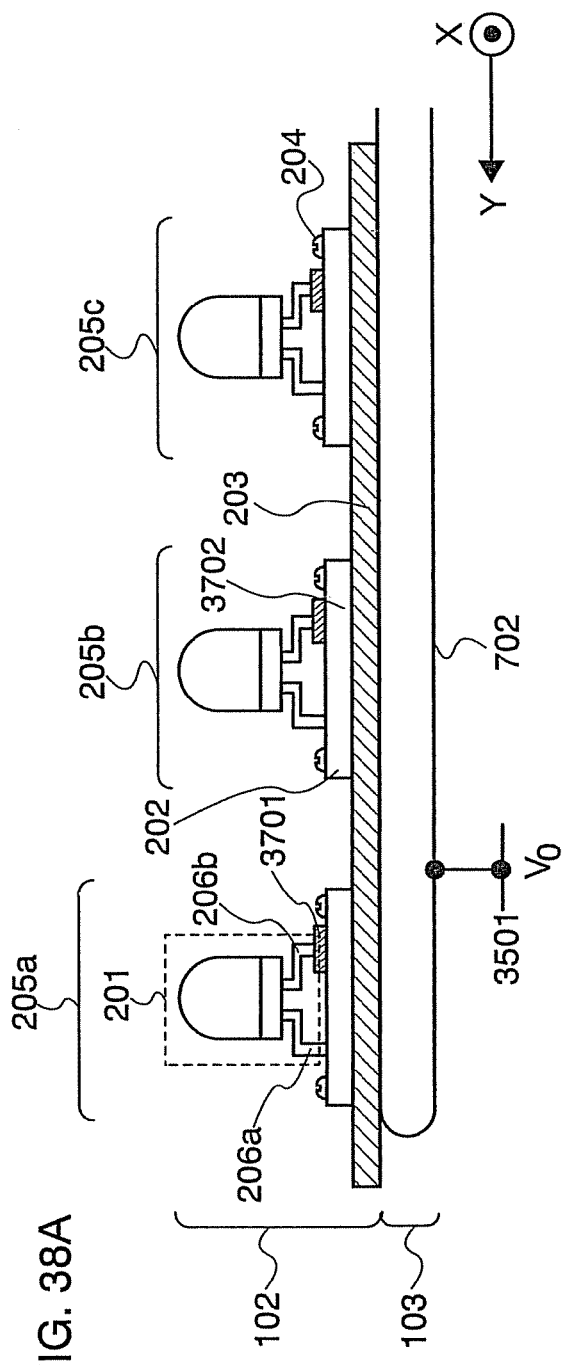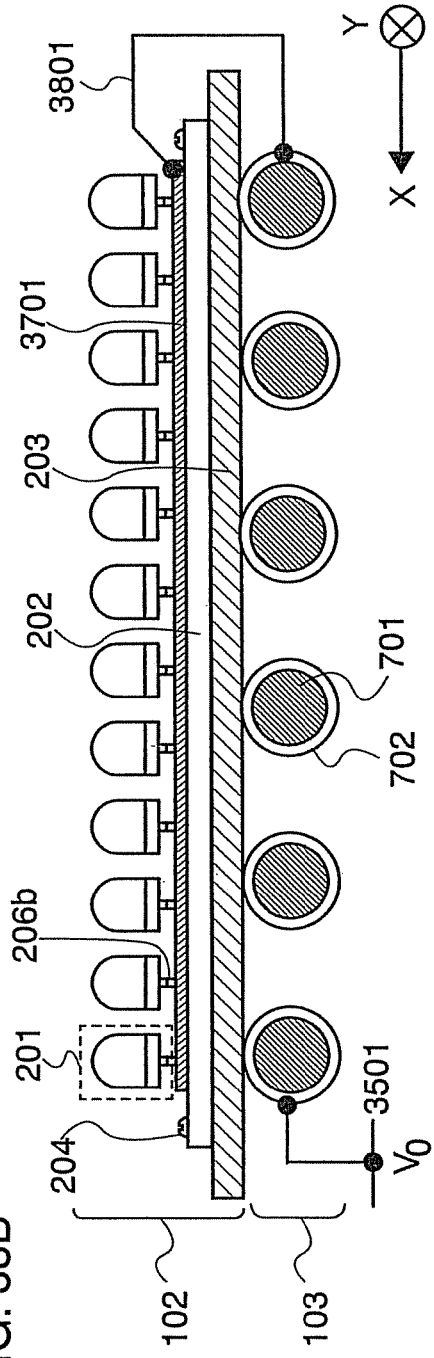

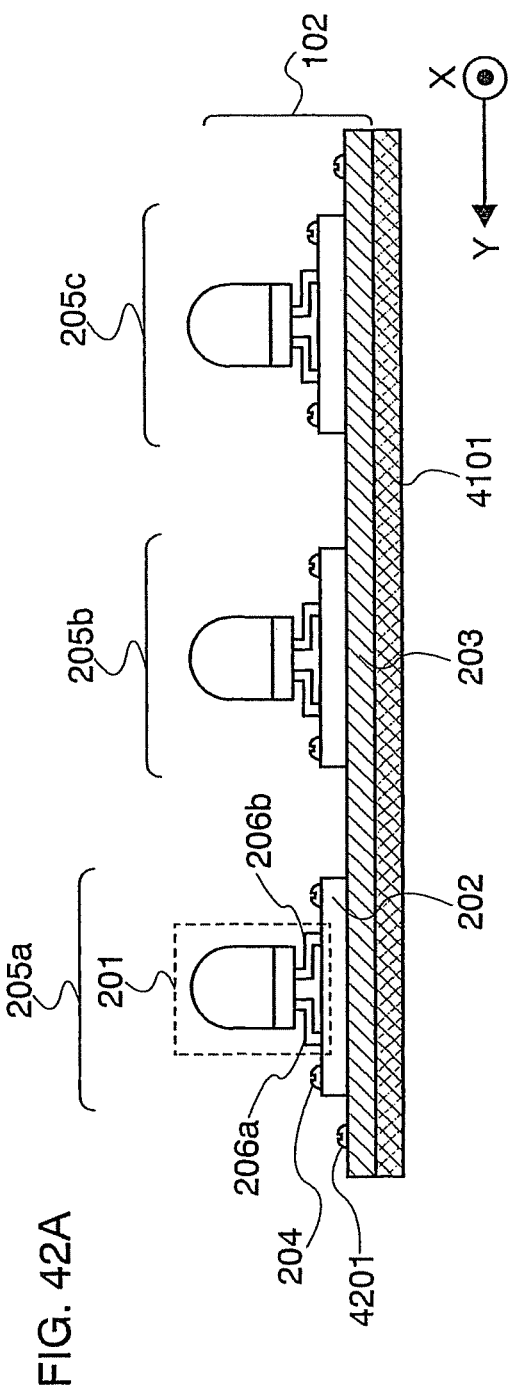
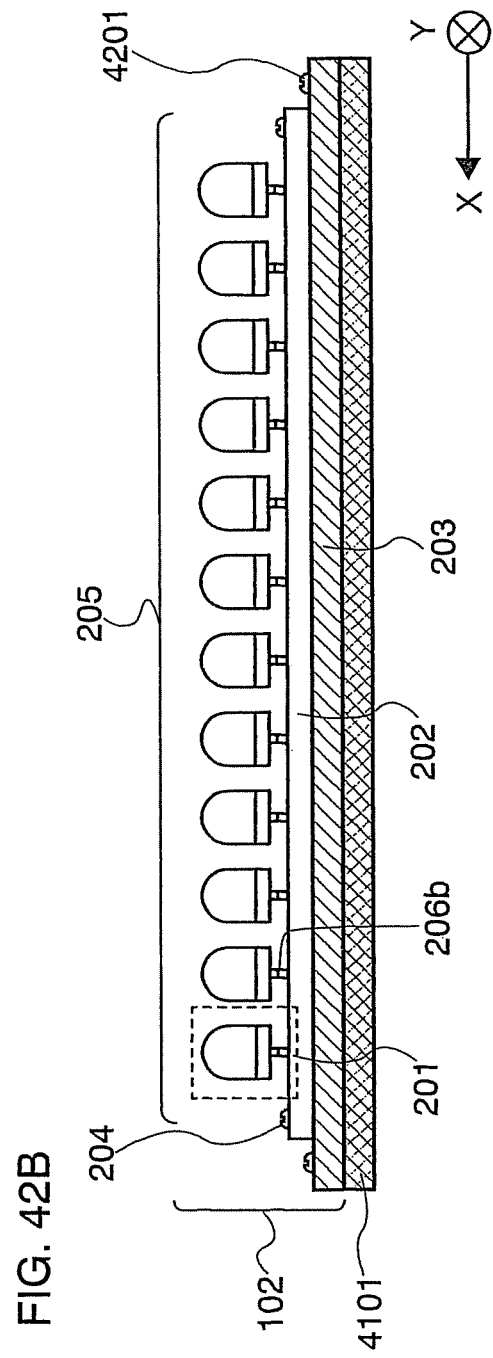

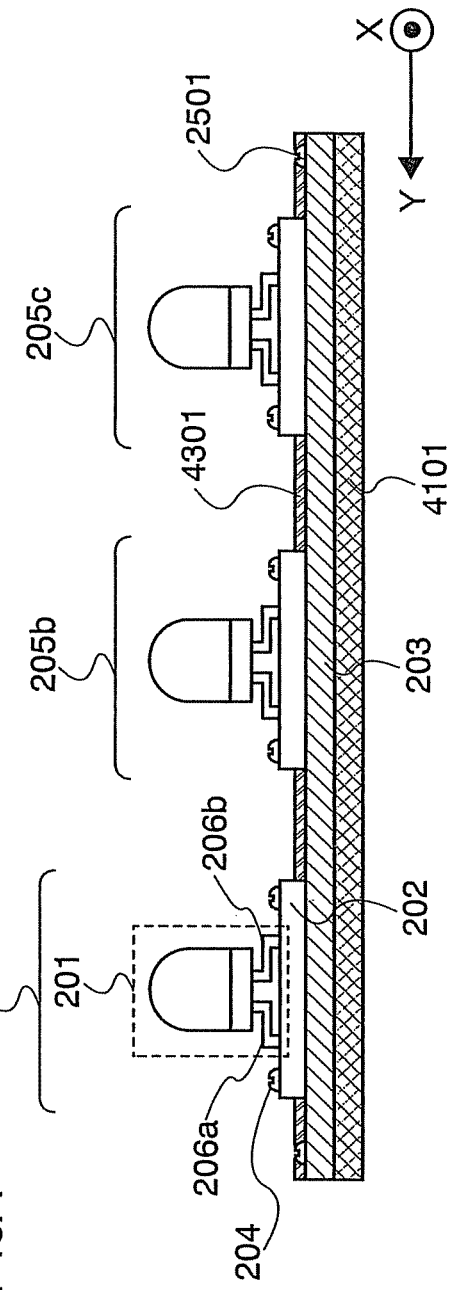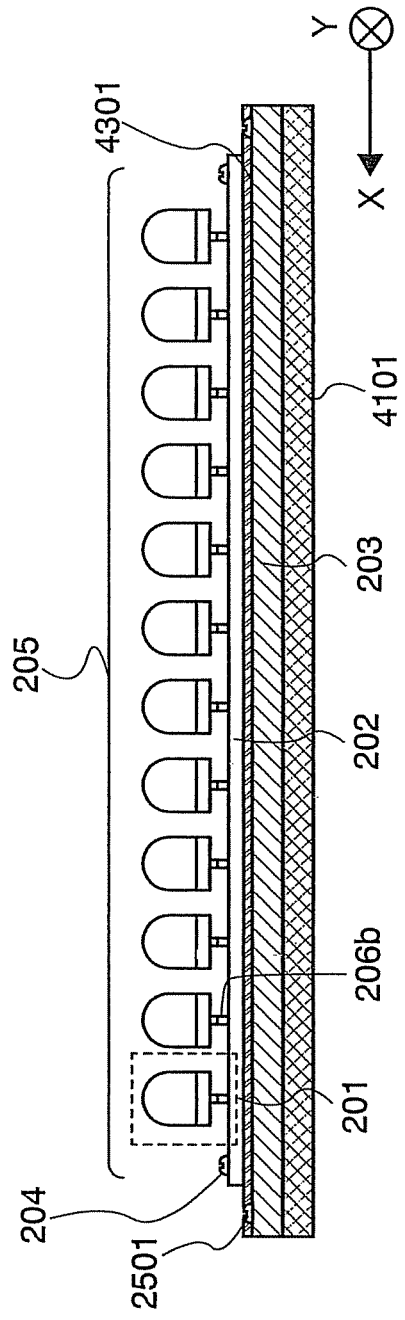

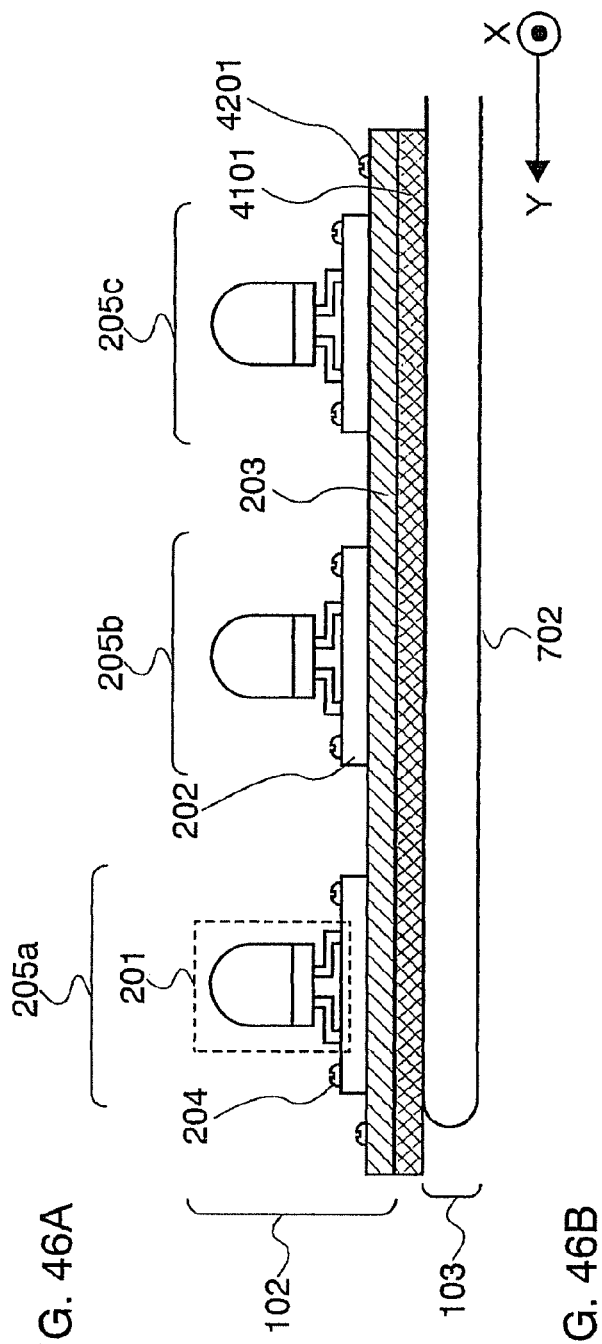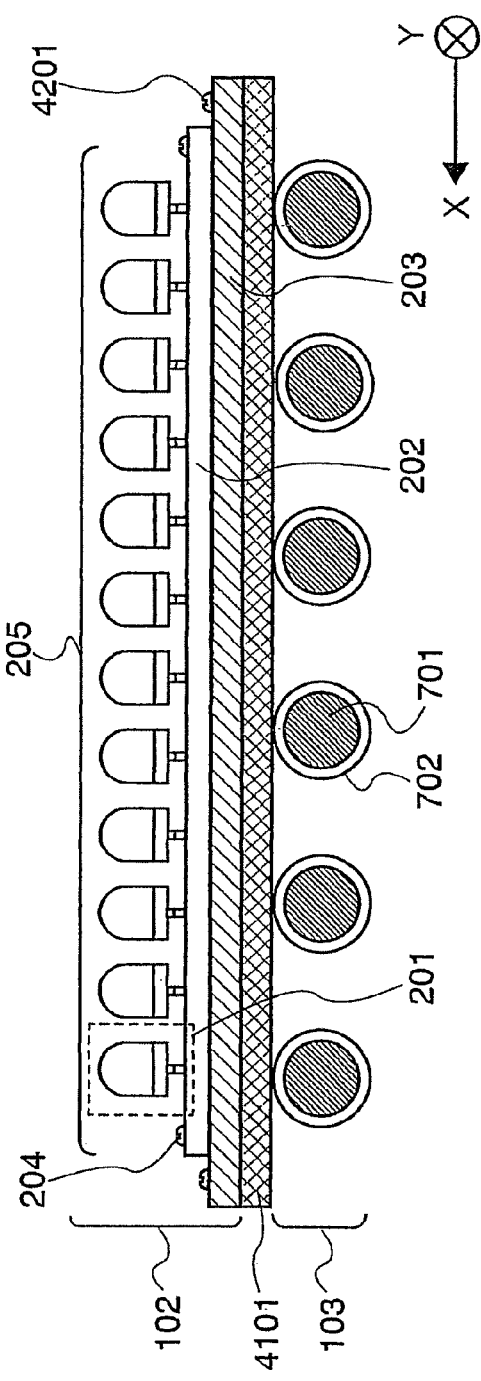

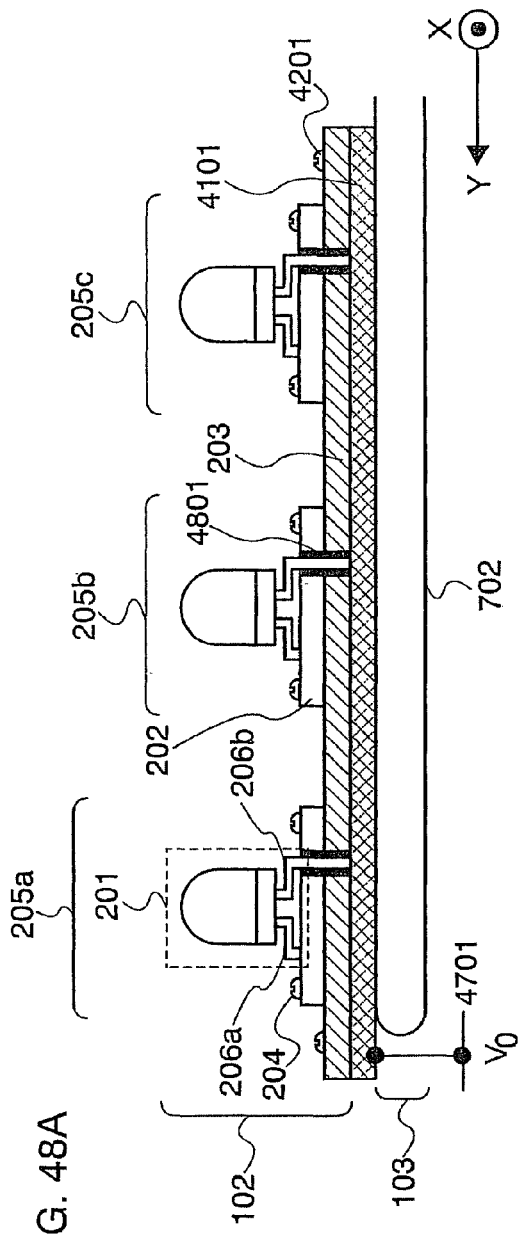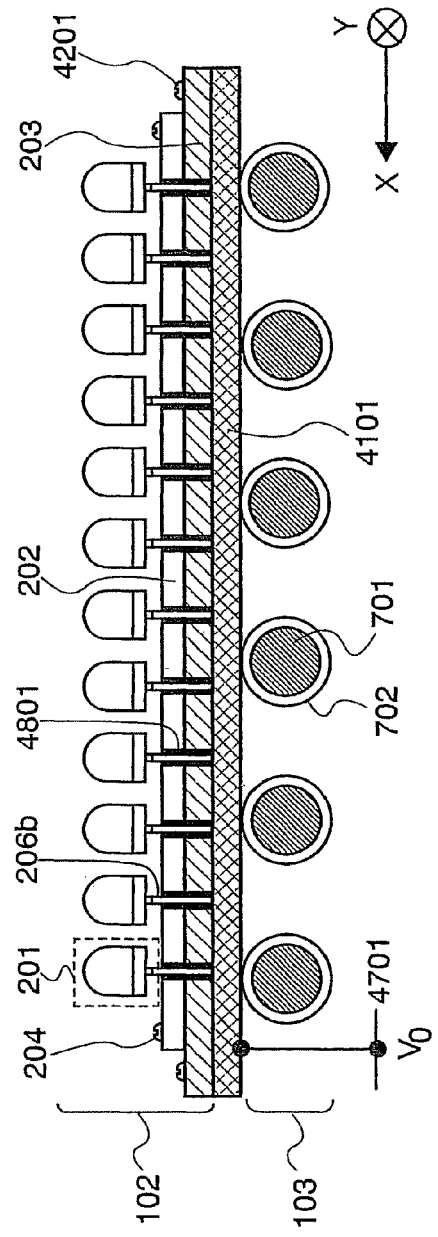

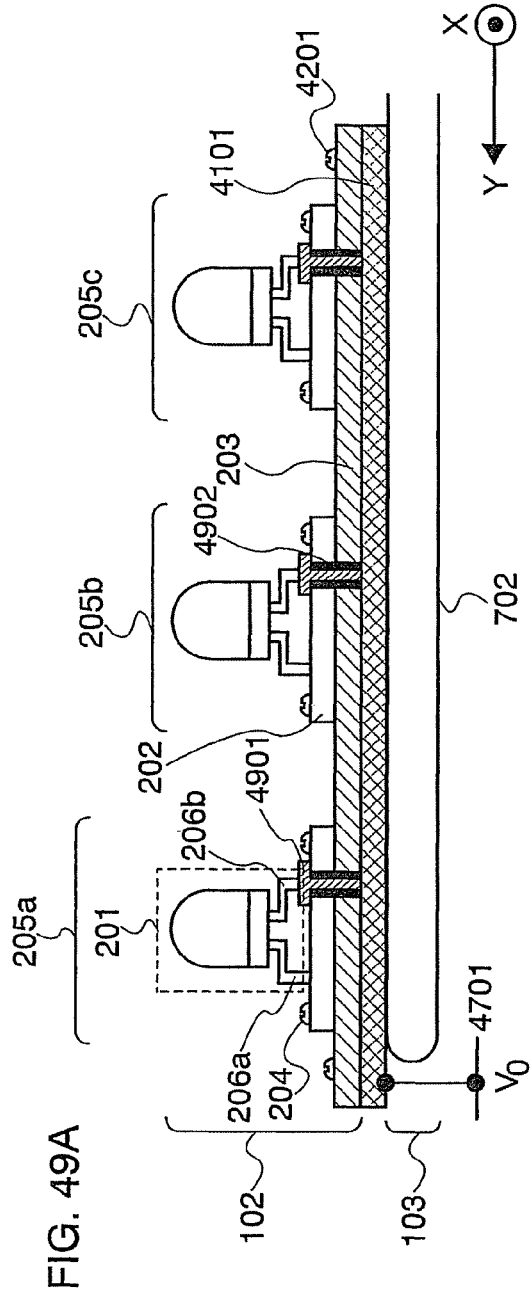
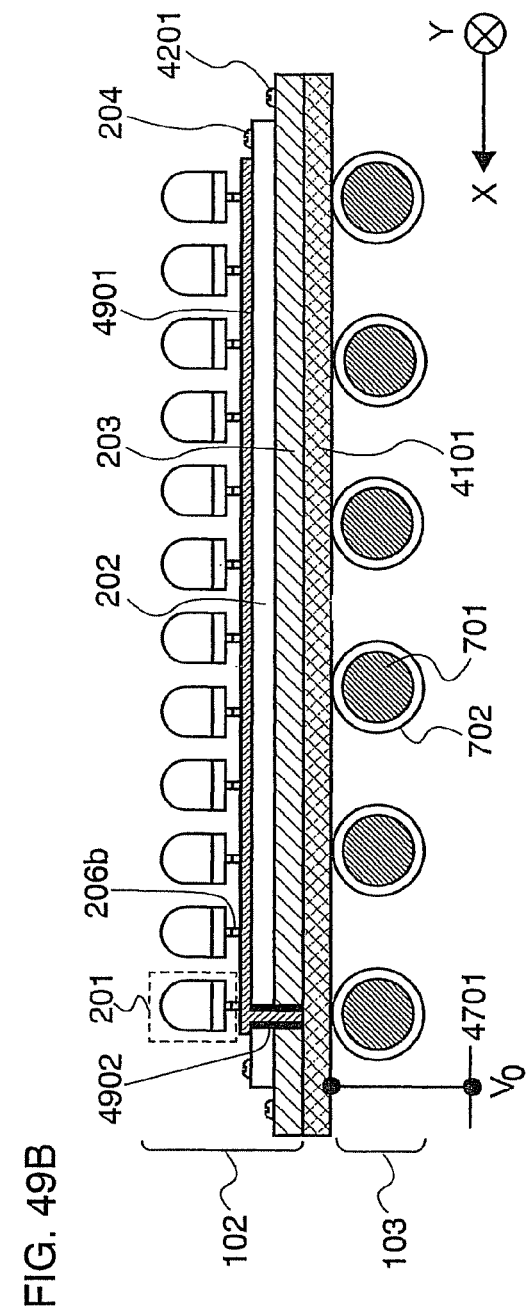
FIG. 49A
FIG. 49B

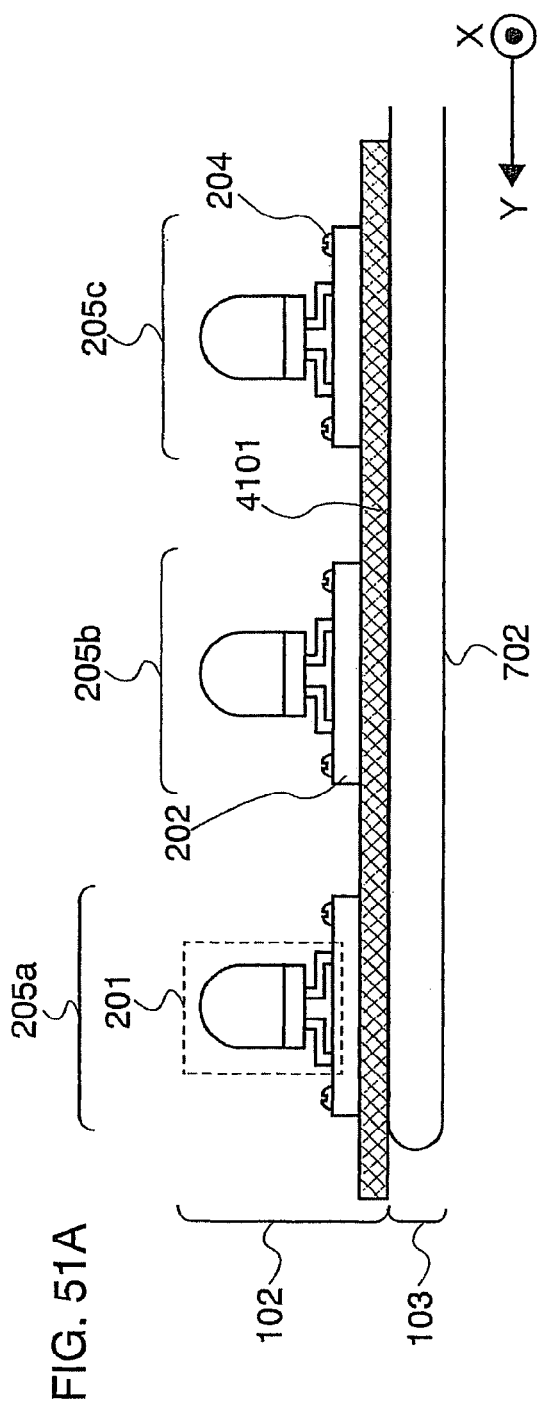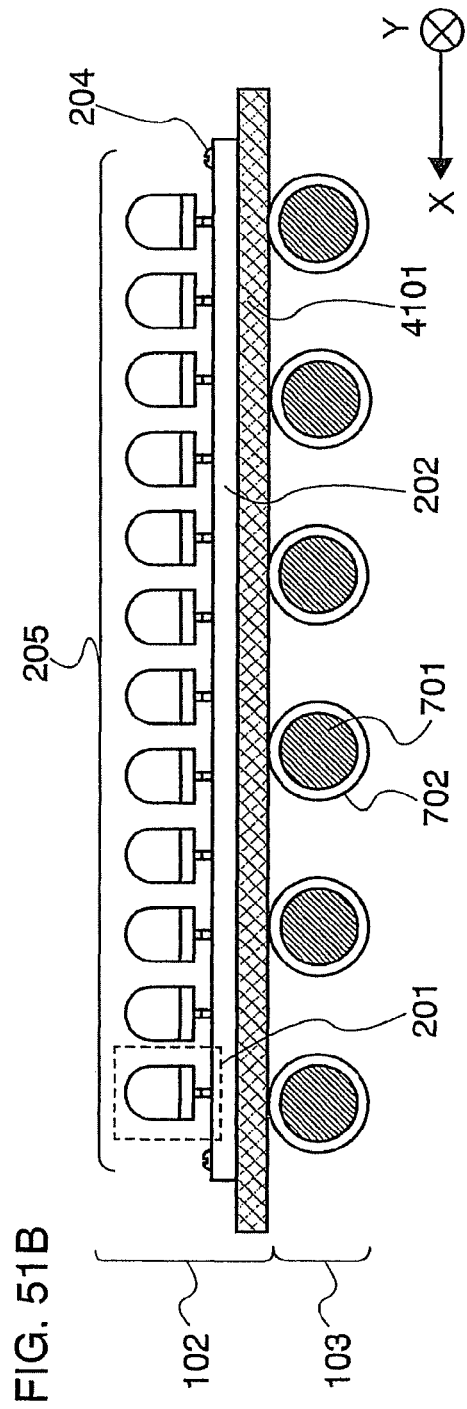

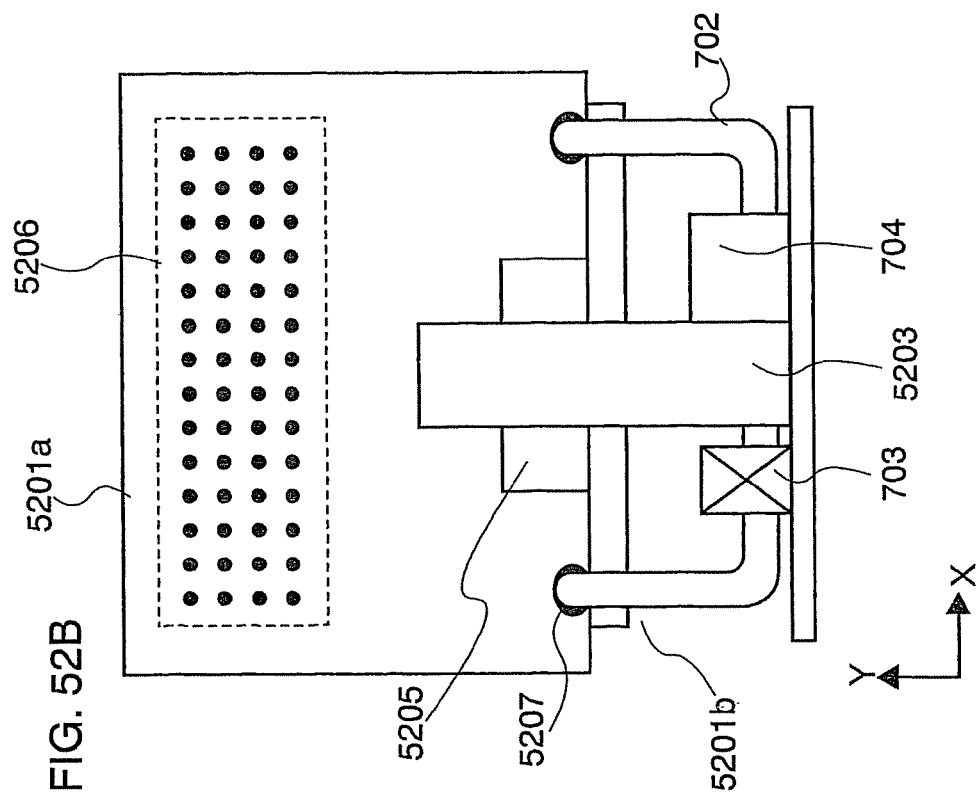
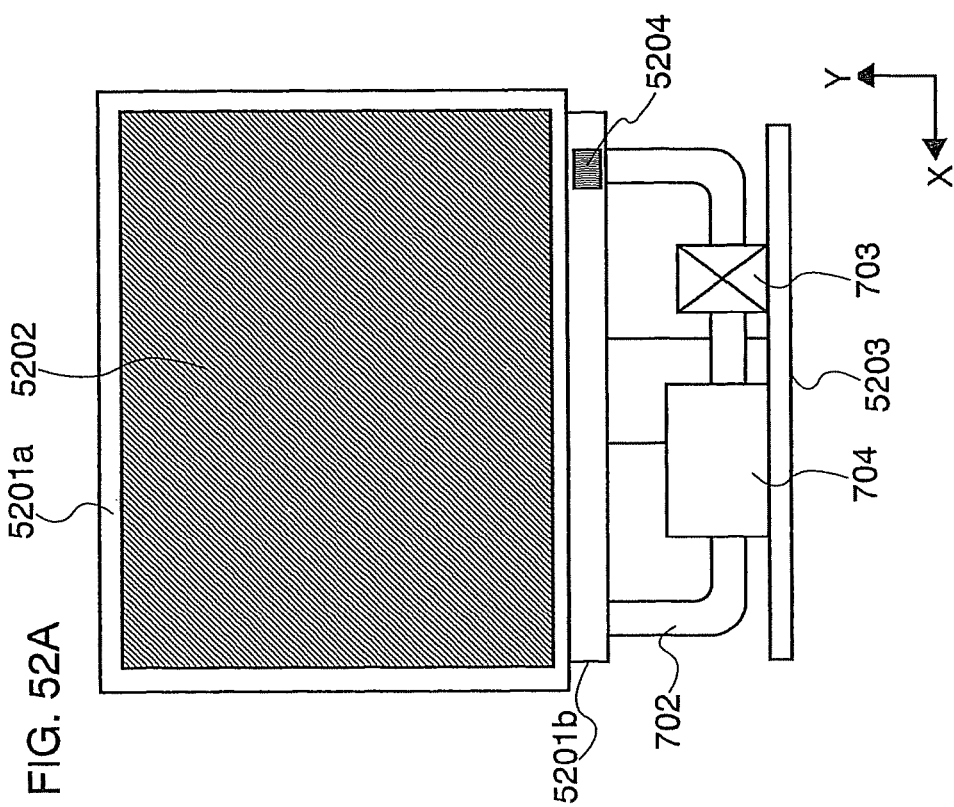

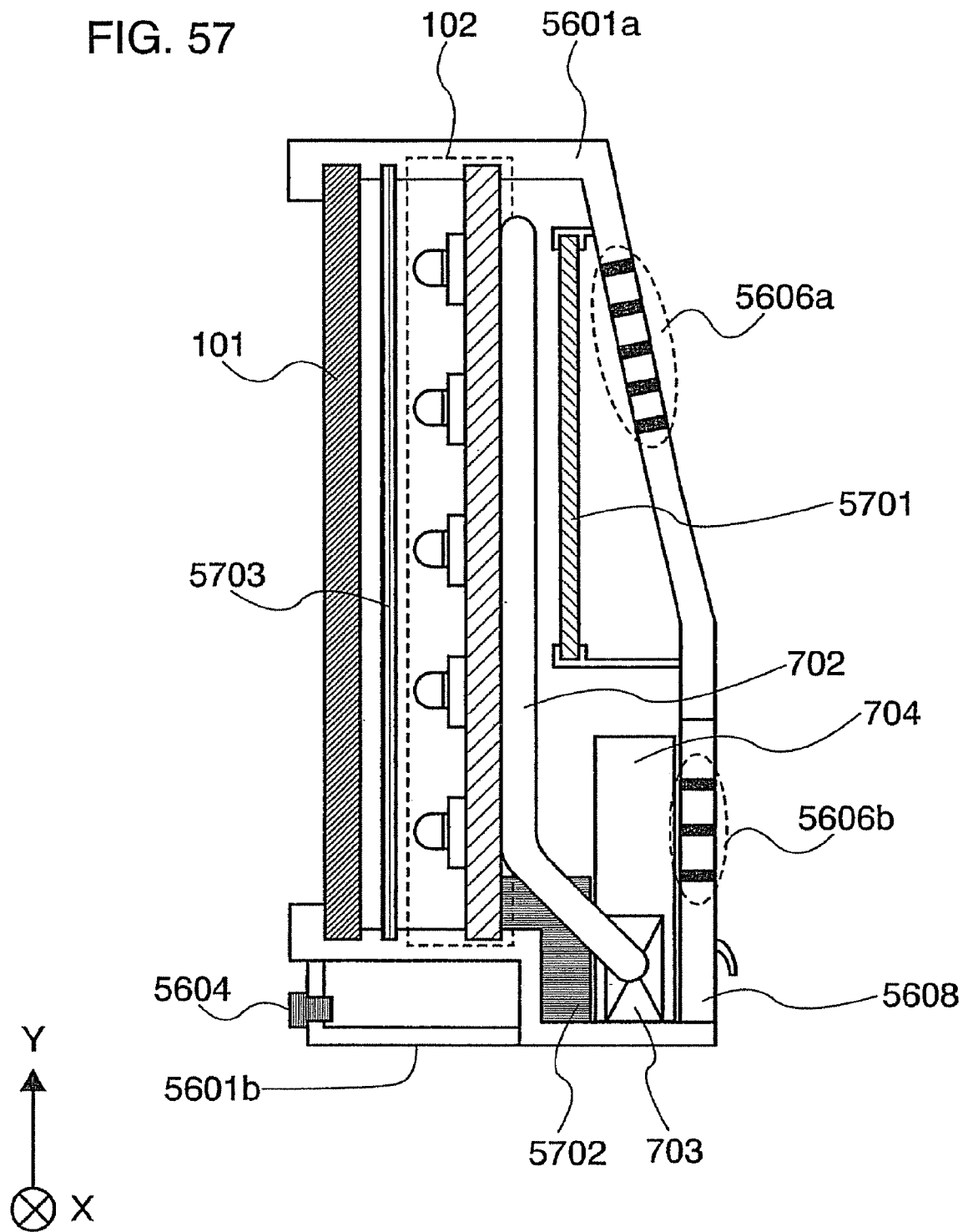

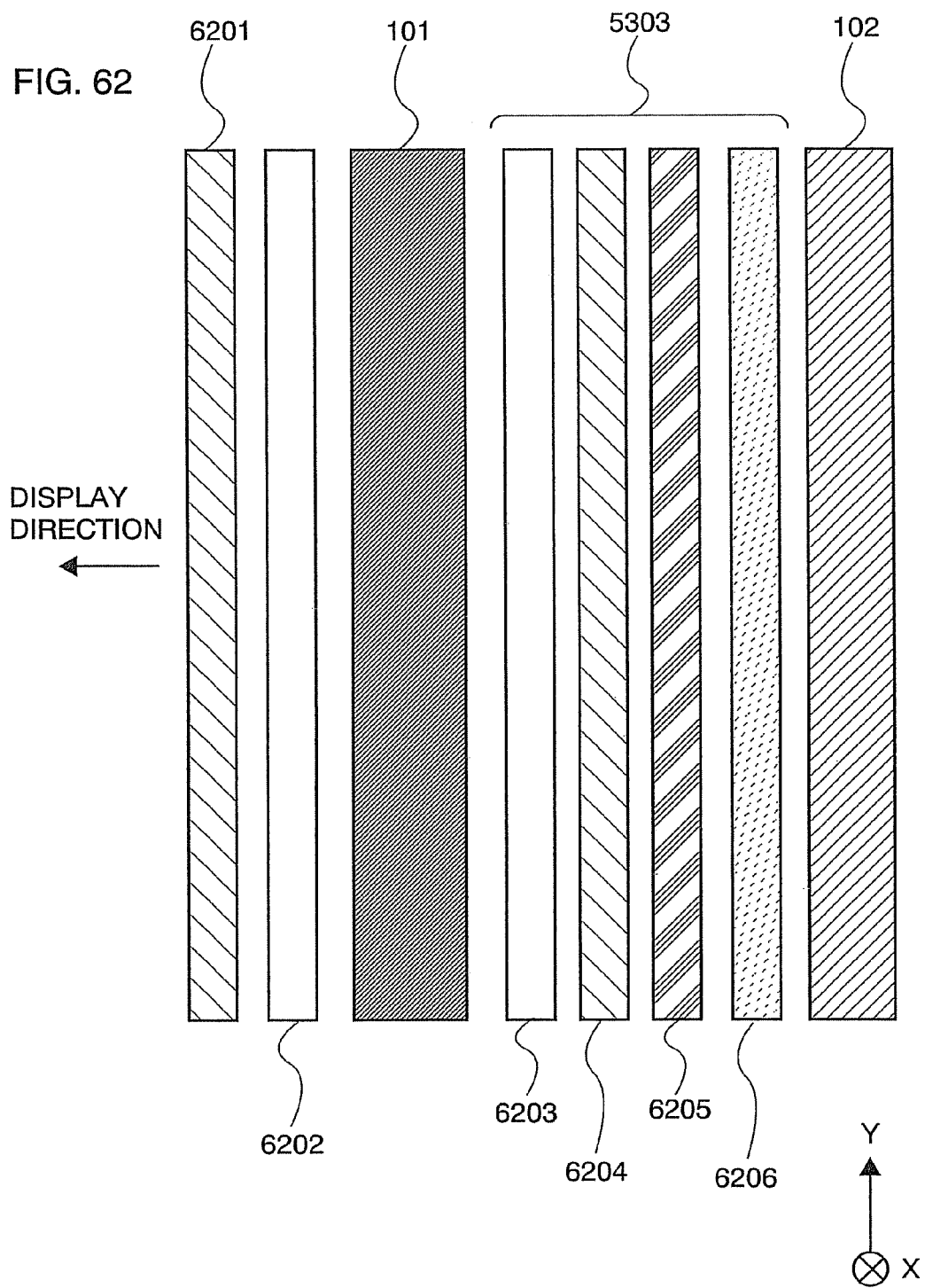

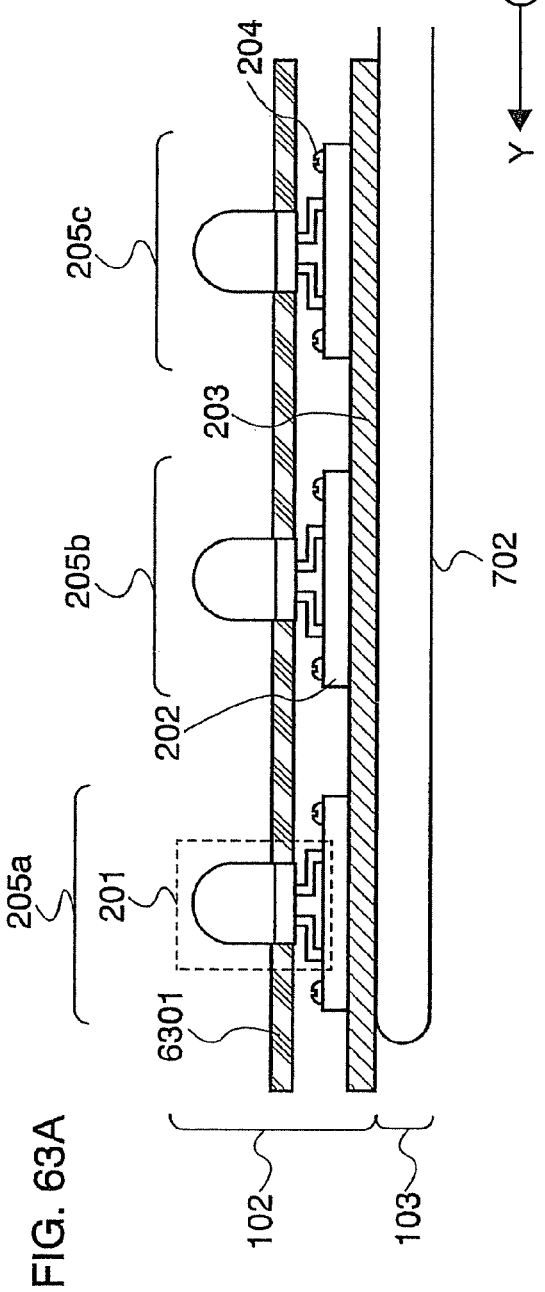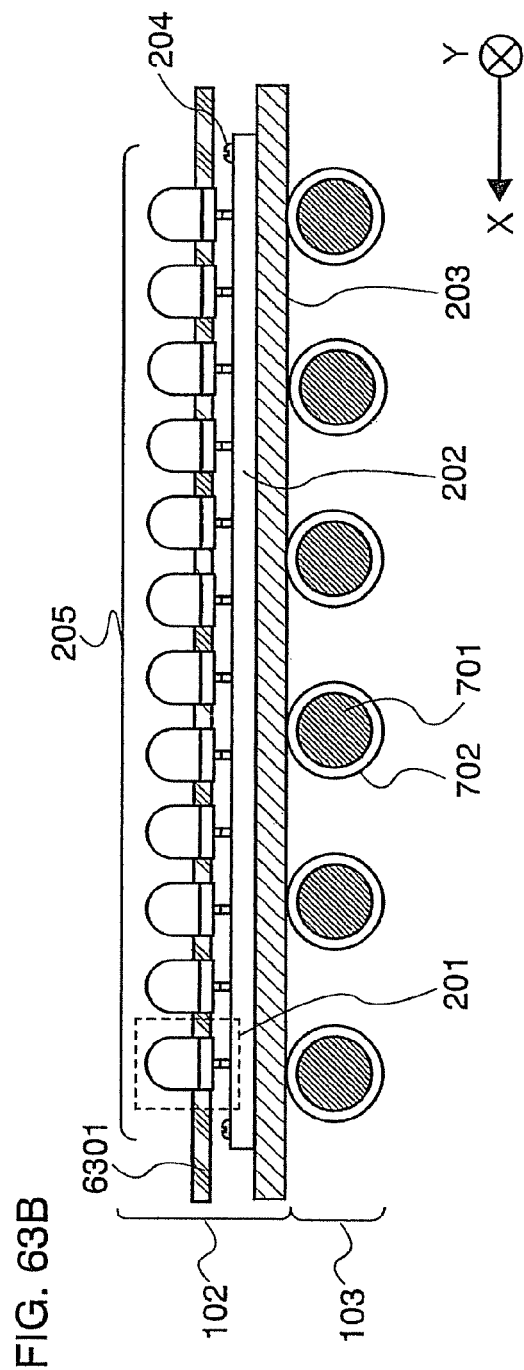

DISPLAY DEVICE

This application is a continuation of application Ser. No. 11/645,072 filed on Dec. 22, 2006 now U.S. Pat. No. 7,755,715.

BACKGROUND OF THE INVENTION

1. Field of the Invention

The present invention relates to a configuration of a backlight which is arranged in a liquid crystal display. In particular, the invention relates to a backlight which is formed of a light-emitting diode and a configuration of a cooling device which is arranged for the backlight. In addition, the invention relates to a configuration of a display device including a backlight which is formed of a light-emitting diode and a configuration of a cooling device which is arranged for the backlight.

2. Description of the Related Art

A liquid crystal display is expected to have a larger screen, and be reduced in weight, thickness, and power consumption compared to a conventional cathode-ray tube (CRT). In recent years, a liquid crystal display has been used for various display devices such as TV and a monitor for a personal computer.

Since liquid crystal elements do not emit light by themselves, for example, a backlight which functions as a light source is arranged on a back surface portion of a liquid crystal panel. Conventionally, although a cold cathode fluorescent tube in which hydrargyrum or xenon is sealed in a fluorescent tube (Cold Cathode Fluorescent Lamp: CCFL) is employed as the backlight, there is a problem in that a color reproduction area is small.

Therefore, in recent years, a technique where three colors of light-emitting diodes (Light Emitting Diode: hereinafter described as LED in this specification), which are red, green, and blue are employed as backlight as a substitute for a cold cathode fluorescent tube has been attracted attention. By employing an LED to a backlight, a color reproduction area is remarkably wider than a conventional cold cathode fluorescent tube and further a color which is difficult to realize in a display utilizing a fluorescent material such as CRT or plasma display can be expressed. In addition, since a driver circuit of the backlight can be simplified compared to a conventional display device, cost can be reduced.

Meanwhile, when a liquid crystal display having a backlight is consecutively used, the large amount of heat is released. Since characteristics of liquid crystal elements or elements such as a transistor which drives the display device change by this heat from the backlight, this becomes a possible cause for a display defect such as color unevenness or a malfunction. In addition, the heat from the backlight becomes a possible cause for deformation of the display device. More particularly, in the case of employing an LED to the backlight, display unevenness or color unevenness is generated since characteristics of LED itself change by heat from the LED.

Thus, in order to radiate the heat from the backlight, various means for radiation of heat are provided. For example, as a conventional technique, an air-cooled cooling device where the heat is radiated by sending cooling air to the backlight with a cooling fan is employed (see Reference 1: Japanese Published Patent Application No. 10-96898).

However, in an air-cooled cooling device, since oscillation is generated by an operation of a cooling fan and noise is generated by hissing sound of a cooling fan, it requires new countermeasures for oscillation and noise. In addition, since the amount of heat generation increases as a liquid crystal panel is enlarged, there is concern in that the heat cannot be cooled enough only by an air-cooled cooling device.

SUMMARY OF THE INVENTION

In view of the foregoing problems, it is an object of the invention to provide a cooling device which can efficiently radiate heat generated from an LED backlight and has a cooling capability, an LED backlight having the cooling device, and a display device including the LED backlight and the cooling device.

A display device in accordance with one aspect of the invention includes a liquid crystal panel, a backlight, and a cooling device for cooling the backlight. The backlight includes a plurality of LEDs. The cooling device includes a pipe and a coolant flowing through the pipe. The backlight and the cooling device are in contact with each other, and the backlight and the cooling device are arranged on one side of the liquid crystal panel.

Note that in a display device of the invention, a backlight may be arranged between a liquid crystal panel and a cooling device.

Note that in a display device of the invention, the cooling device may be arranged between the liquid crystal panel and the backlight.

Note that in a display device of the invention, a backlight is arranged between a liquid crystal panel and a cooling device and the backlight and the cooling device may hold a thermal conductor therebetween.

A display device in accordance with one aspect of the invention includes a liquid crystal panel, a backlight, and a cooling device for cooling the backlight. The backlight is arranged on one side of the liquid crystal panel, and the backlight includes a plurality of LEDs which are arranged on one side of a backboard. The cooling device includes a pipe and a coolant flowing through the pipe. The pipe is arranged on the other side of the backboard.

A display device in accordance with one aspect of the invention includes a liquid crystal panel, a backlight, and a cooling device for cooling the backlight. The backlight is arranged on one side of the liquid crystal panel, and the backlight includes a plurality of LEDs which are arranged on one side of a backboard. The cooling device includes a pipe and a coolant flowing through the pipe. The pipe is arranged on the other side of the backboard and is not in contact with the LED at the same time.

A display device in accordance with one aspect of the invention includes a liquid crystal panel, a backlight, and a cooling device for cooling the backlight. The backlight is arranged on one side of the liquid crystal panel, and the backlight includes a plurality of LEDs which are arranged on one side of a backboard. The cooling device includes a pipe and a coolant flowing through the pipe. The pipe is arranged on one side and the other side of the backboard. The pipe which is arranged on one side of the backboard is not in contact with the LED.

A display device in accordance with one aspect of the invention includes a liquid crystal panel, a backlight, a cooling device for cooling the backlight, and a thermal conductor. The backlight is arranged on one side of the liquid crystal panel, and the backlight includes a plurality of LEDs which are arranged on one side of a backboard. The cooling device includes a pipe and a coolant flowing through the pipe. The thermal conductor is held between the other side of the backboard and the pipe.

A display device in accordance with one aspect of the invention includes a liquid crystal panel, a backlight, a cooling device for cooling the backlight, and a thermal conductor. The backlight is arranged on one side of the liquid crystal panel, and the backlight includes a plurality of LEDs which are arranged on one side of a backboard. The cooling device includes a pipe and a coolant flowing through the pipe. The pipe is arranged on one side of the backboard and is not in contact with the LED. The thermal conductor is arranged on the other side of the backboard.

A display device in accordance with one aspect of the invention includes a liquid crystal panel, a backlight, a cooling device for cooling the backlight, and a thermal conductor. The backlight is arranged on one side of the liquid crystal panel, and the backlight includes a plurality of LEDs which are arranged on one side of a backboard. The cooling device includes a pipe and a coolant flowing through the pipe. A part of the pipe is arranged on one side of the backboard and is not in contact with the LED. The thermal conductor is held between the other surface of the backboard and the other part of the pipe.

Note that in a display device of the invention, a thermal conductor is formed from a material having conductivity and may be electrically connected to a terminal of an LED.

Note that in a display device of the invention, a pipe and a thermal conductor are formed from materials having conductivity. The pipe is connected to the thermal conductor. A terminal of an LED may be electrically connected to at least one of the pipe and the thermal conductor.

Note that in a display device of the invention, at least one of LEDs may be superposed to a pipe with a backboard interposed therebetween.

Note that in a display device of the invention, a backlight may include a reflecting means for reflecting light emitted from an LED. The reflecting means may have unevenness.

Note that in a display device of the invention, one side of a liquid crystal panel is a back surface side of a display surface of the liquid crystal panel.

Note that in a display device of the invention, a diameter of a pipe is greater than or equal to $1/100$ and less than or equal to $1/10$ of a shorter one of vertical length and horizontal length of a backlight.

Note that in a display device of the invention, a backlight is divided into a plurality of cooling regions and a pipe may be arranged in each of the cooling regions.

A lighting device in accordance with one aspect of the invention includes a backlight illuminating light to a liquid crystal panel, and a cooling device for cooling the backlight. The backlight includes a plurality of LEDs. The cooling device includes a pipe and a coolant flowing through the pipe. The backlight and the cooling device are in contact with each other.

Note that in a lighting device of the invention, a backlight and a cooling device may hold a thermal conductor therebetween.

Note that in a lighting device of the invention, a pipe is formed of a material having conductivity and the pipe may be electrically connected to a terminal of an LED.

Note that in a lighting device of the invention, a thermal conductor is formed from a material having conductivity and the thermal conductor may be electrically connected to a terminal of an LED.

A cooling device in accordance with one aspect of the invention cools a backlight illuminating light to a liquid crystal panel. The cooling device includes a pipe and a coolant flowing through the pipe. The backlight and the cooling device are in contact with each other.

Note that in the invention, the description "connection" has the same meaning as the description "electrical connection". Accordingly, in configurations disclosed in the invention, another element which enables an electrical connection (e.g., another element or a switch) may be sandwiched between elements having a predetermined connecting relation.

Note that in the invention, a type of a transistor which can be applied is not limited to a certain type. A thin film transistor (TFT) using a non-single crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be applied. In addition, a type of a substrate over which a transistor is arranged is not limited to a certain type. The transistor can be arranged over a single crystalline substrate, an SOI substrate, a glass substrate, a plastic substrate, or the like.

Note that various types of transistors may be employed in the invention, and such transistors can be formed over various types of substrates. Accordingly, all of the circuits may be formed over a glass substrate, a plastic substrate, a single crystalline substrate, an SOI substrate, or any other substrates. Alternatively, some of the circuits may be formed over a substrate while the other parts of the circuits may be formed over another substrate. That is, not all of the circuits are required to be formed over the same substrate. For example, a part of the circuits may be formed with transistors over a glass substrate while the other parts of the circuits may be formed over a single crystalline substrate, so that the IC chip is connected to the glass substrate by COG (Chip On Glass). Alternatively, the IC chip may be connected to the glass substrate by TAB (Tape Automated Bonding) or a printed wiring board.

Note that a transistor in the invention may have a top gate structure or a bottom gate structure.

In this specification, a semiconductor device means a device having a circuit including semiconductor elements (e.g., transistors or diodes). The semiconductor device may also include all devices that can function by utilizing semiconductor characteristics. A display device includes not only a display panel itself where a plurality of pixels including display elements such as liquid crystal elements or EL elements are formed over the same substrate as a peripheral driver circuit for driving the pixels, but also a display panel attached with a flexible printed circuit (FPC) or a printed wiring board (PWB).

Note that in this specification, when it is described that pixels are arranged in matrix, the description includes not only a case where the pixels are arranged combining a vertical stripe and a lateral stripe, that is, in grid, but also a case where dots of three color elements (e.g., RGB) are arranged in so-called delta pattern in the case of performing a full color display with three color elements. Note that the color elements are not limited to three colors, and color elements with more than three colors may be employed; for example, white may be used in addition to RGB. Further, sizes of light-emitting regions may be different in respective dots of color elements.

Note that in this specification, a lighting device corresponds to a device having a function of illuminating light. In addition, a cooling device corresponds to a device having a function of cooling an object.

Note that following display elements can be applied as appropriate as a display element. For example, a display medium, the contrast of which changes by an electromagnetic action, such as an EL element (e.g., an organic EL element, an inorganic EL element, or an EL element containing both organic and inorganic materials), an electron-emissive element, a liquid crystal element, electronic ink, a grating light valve (GLV), a plasma display (PDP), a digital micromirror device (DMD), a piezoelectric ceramic display, or a carbon nanotube can be applied. Note that display devices using an EL element include an EL display; display devices using an electron-emissive element include a field emission display (FED), an SED-type flat panel display (SED: Surface-conduction Electron-emitter Display), or the like; display devices using a liquid crystal element include a liquid crystal display; and display devices using electronic ink include electronic paper.

Note that in this specification, a front surface corresponds to a surface which is near the display surface. In addition, a back surface corresponds to a surface which is distant from the display surface.

By employing a cooling device of the invention, the heat generated from the LED backlight is radiated very efficiently and the LED backlight can be cooled quickly; thereby, a display defect such as display unevenness or color unevenness caused by the heat generated from the LED backlight can be prevented. Further, by utilizing the thermal conductor which is arranged between the LED backlight and the cooling device as an electrode for applying a voltage to the LED, the heat generated from the LED backlight itself can be decreased and further power consumption can be reduced.

BRIEF DESCRIPTION OF THE DRAWINGS

In the accompanying drawings:

FIGS. 5A and 5B are diagrams showing a configuration of an LED backlight of the invention;

FIGS. 6A and 6B are diagrams showing a configuration of an LED backlight of the invention;

FIGS. 12A and 12B are diagrams showing a configuration of a cooling device of the invention;

FIGS. 36A and 36B are diagrams showing a configuration of a cooling device of the invention;

FIGS. 37A and 37B are diagrams showing a configuration of a cooling device of the invention;

FIGS. 38A and 38B are diagrams showing a configuration of a cooling device of the invention;

FIGS. 42A and 42B are diagrams showing a configuration of an LED backlight of the invention;

FIGS. 43A and 43B are diagrams showing a configuration of an LED backlight of the invention;

FIGS. 46A and 46B are diagrams showing a configuration of a cooling device of the invention;

FIGS. 48A and 48B are diagrams, showing a configuration of a cooling device of the invention;

FIGS. 49A and 49B are diagrams showing a configuration of a cooling device of the invention;

FIGS. 51A and 51B are diagrams showing a configuration of a cooling device of the invention;

FIGS. 52A and 52B are diagrams showing a configurational example of a display device of the invention;

FIG. 57 is a diagram showing a configurational example of a display device of the invention;

FIG. 62 is a diagram showing a configurational example of a display device of the invention; and FIGS. 63A and 63B are diagrams showing a configuration of a cooling device of the invention.

DETAILED DESCRIPTION OF THE INVENTION

Figure 1:
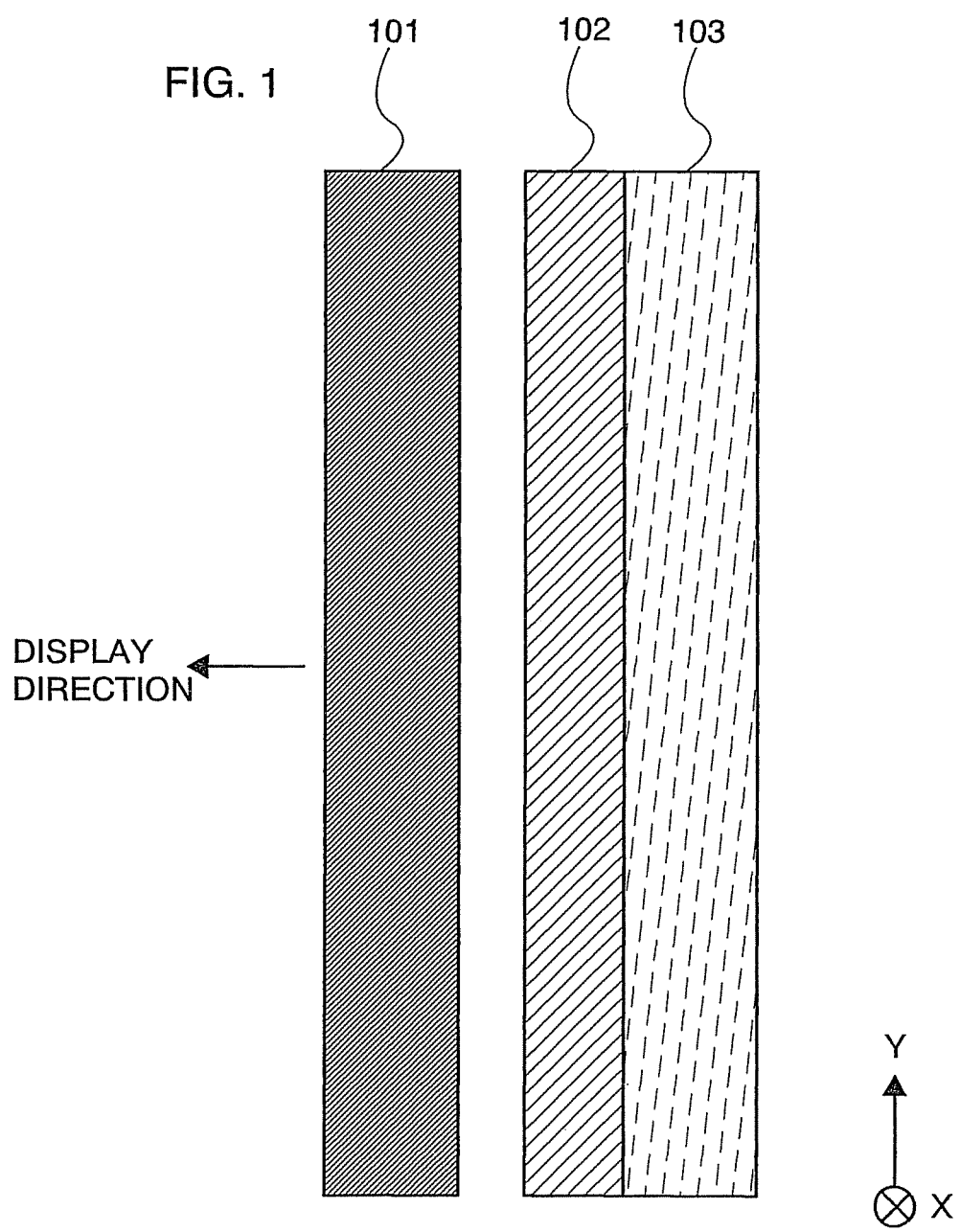
FIG. 1 is a diagram showing, a configuration of a display device of the invention.

Hereinafter, the invention will be described by embodiment modes with reference to the drawings. However, the invention can be implemented by various modes and it is to be understood that various changes and modifications will be apparent to those skilled in the art. Unless such changes and modifications depart from the scope of the invention, they should be construed as being included therein. Therefore, the invention is not limited to the following description.

Note that in the diagrams of this specification, the same portions or portions having the same function are denoted by the same reference numerals and repetitive description is omitted.

Embodiment Mode 1

First, a configuration of a display device in this embodiment mode is described with reference to FIG. 1.

FIG. 1 shows a configurational example of the display device in this embodiment mode. The display device in this embodiment mode includes a liquid crystal panel 101, an LED backlight 102, a cooling device 103, or the like. The LED backlight 102 is arranged on a back surface side of the liquid crystal panel 101 and the cooling device 103 is arranged on a back surface side of the LED backlight 102. Note that the cooling device 103 is arranged so as to be in contact with the LED backlight 102. In addition, a liquid cooling type cooling device is employed as the cooling device 103 in the invention.

Note that in this specification, the liquid crystal panel 101 is a material which needs a backlight, for example, a transmissive type or a semi-transmissive type. In addition, MVA (Multi-domain Vertical Alignment) method, PVA (Patterned Vertical Alignment) method, IPS (In-Plane Switching) method, FFS (Fringe Field Switching) method, and the like are given as specific examples of a driving method. Note that specific examples of the liquid crystal panel 101 are not limited to the aforementioned examples.

Note that in this specification, pixels are arranged in active matrix in the liquid crystal panel 101. In addition, the liquid crystal panel 101 includes a substrate arranged with a transistor. Note that a peripheral circuit may be formed over the same substrate as the substrate over which the transistor is arranged. Further, the transistor which is arranged in the liquid crystal panel 101 may be a transistor formed of amorphous silicon or a transistor formed using polysilicon.

Next, a configuration of the LED backlight 102 in this embodiment mode is described with reference to FIG. 2, FIGS. 3A and 3B.

Figure 2:
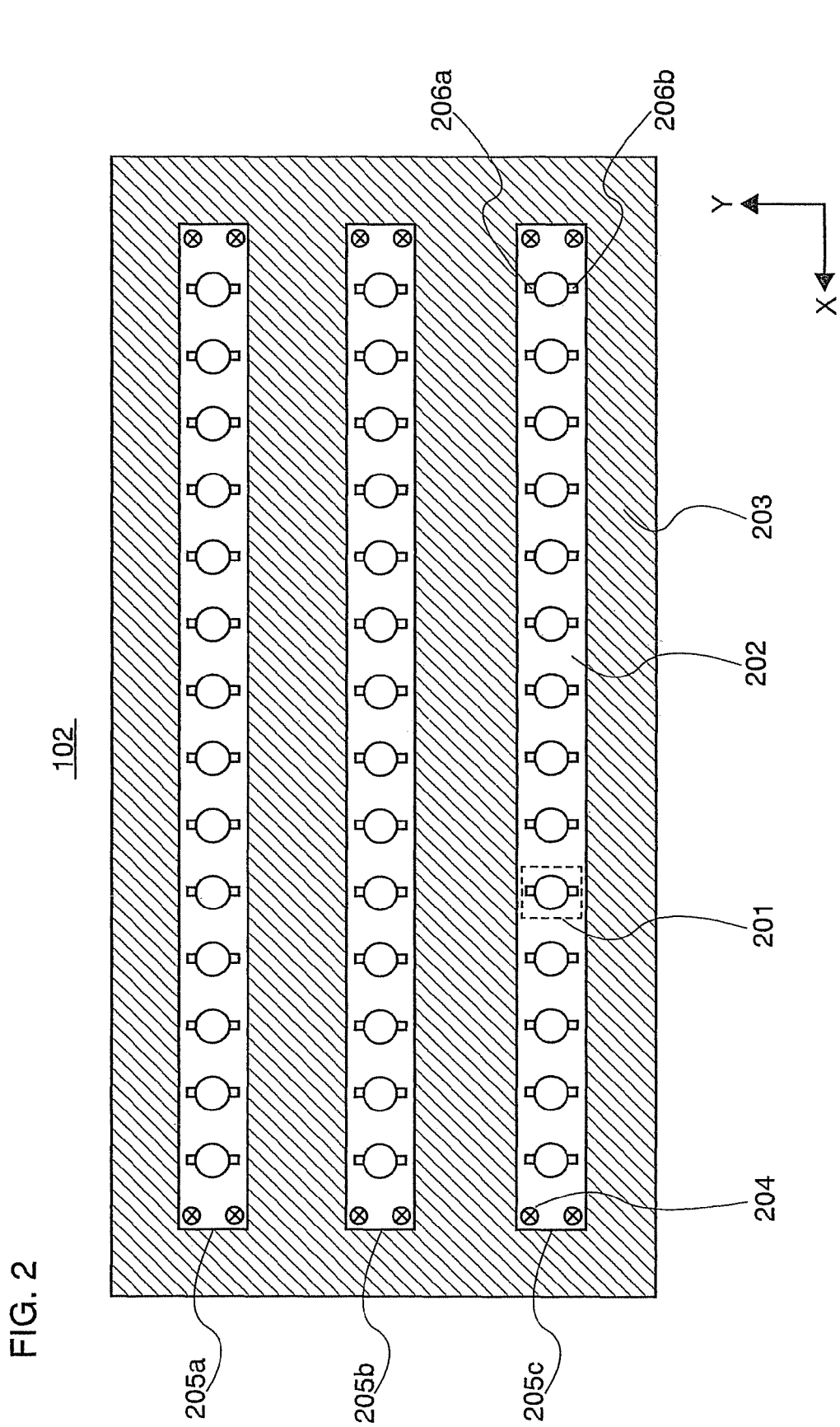
FIG. 2 is a view showing a configuration of an LED backlight of the invention.

FIG. 2 shows a plan view of the LED backlight 102 in this embodiment mode when it is seen from a front surface side of the LED backlight 102. The LED backlight 102 in this embodiment mode includes an LED 201, a wiring board 202, a backboard 203, a screw 204, or the like.

Note that a board in which the LED is arranged is referred to a backboard. Thus, the backboard is provided in a back of a light-emitting direction of the LED.

The LED backlight of this embodiment mode includes an LED array 205 where a plurality of LEDs are arranged from side to side (on an X-axis side in FIG. 2) in one wiring board 202. The LED array 205 is attached to the backboard 203 by using the screw 204. In a configurational example of the LED backlight shown in FIG. 2, three LED arrays (205a to 205c) are provided and arranged up and down (on a Y-axis side in FIG. 2). Each of the LED arrays 205a to 205c is attached to the backboard 203 by using the screw 204.

Note that although the LED are arranged in grid in FIG. 2, the invention is not limited to this. The LED may be arranged in delta pattern.

Figure 3A:
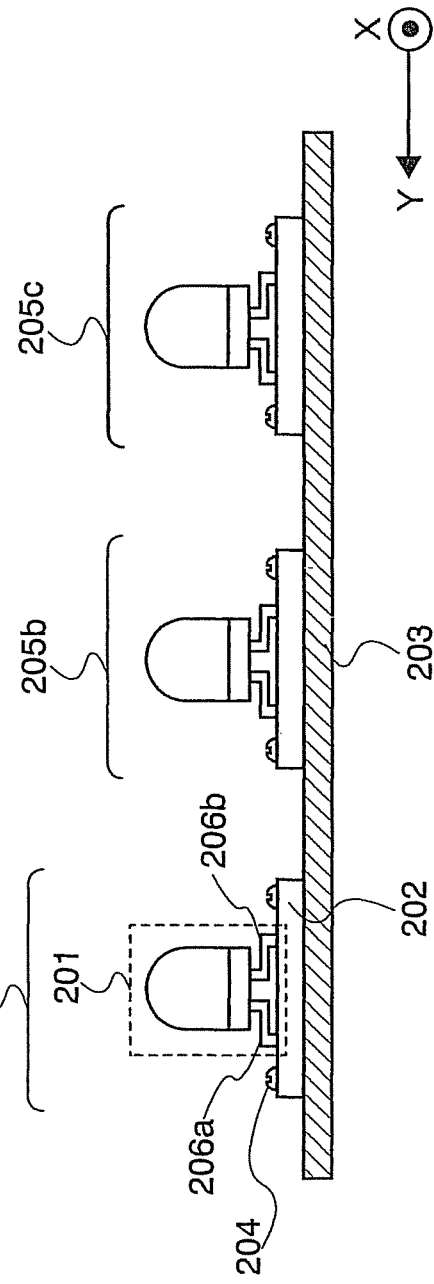
FIGS. 3A and 3B are views showing a configuration of an LED backlight of the invention.
Figure 3B:
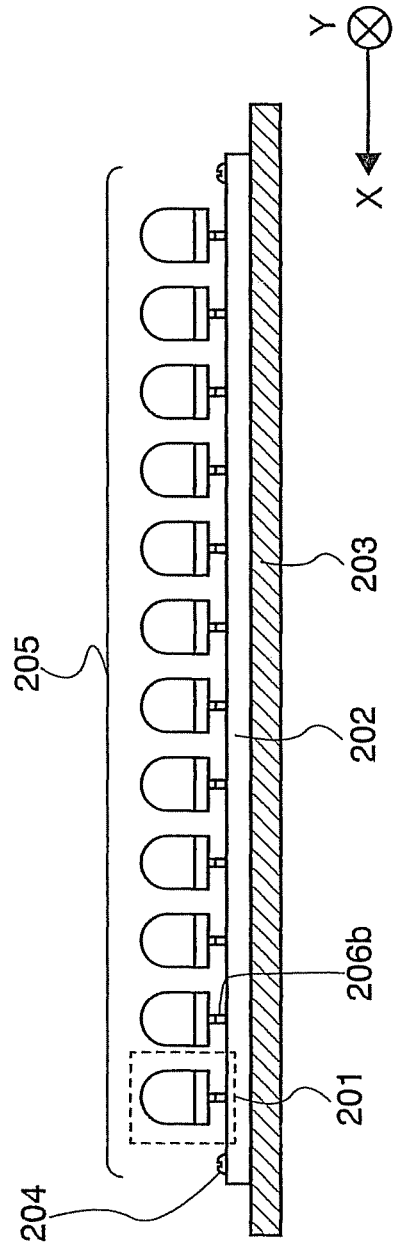

In addition, FIG. 3A shows a plan view of the LED backlight 102 shown in FIG. 2 when it is seen from the X-axis side in FIG. 2. Further, FIG. 3B shows a plan view of the LED backlight 102 shown in FIG. 2 when it is seen from the the Y-axis side in FIG. 2.

Note that the LED 201 is arranged over the wiring board 202 by connecting terminals 206a and 206b of the LED 201 to the wiring board 202 as shown in FIG. 3A.

Note that the LED 201 which is arranged over the wiring board 202 may be a white LED, or may be arranged with three colors of LED of R (red), G (green), and B (blue) alternately. Alternatively, the LED 201 which are arranged over the wiring board 202 may be arranged with four colors of LED of R, B, and W (white) alternately. Alternatively, the LED 201 which are arranged over the wiring board 202 may be arranged with six colors of LED of R, G, B, Y (yellow), C (cyan), and M (magenta) alternately. Further alternatively, the LED 201 which is arranged over the wiring board 202 may be arranged with six colors of LED of two kinds of red (R1, R2) each having a different wavelength, two kinds of green (G1, G2) each having a different wavelength, and two kinds of blue (B1, B2) each having a different wavelength alternately.

Note that in the LED arrays 205a to 205c, the LED 201 are preferably arranged from side to side (in the X-axis side in FIG. 2) and intervals between LED which are adjacent to each other are to be narrow when the LED 201 is arranged over the wiring board 202. This helps light of three colors of R, and B easily mix with each other particularly in the case of arranging the three colors of LED of R, G, and B alternately; thereby, uniform white light can enter the liquid crystal panel 101. Accordingly, color unevenness can be reduced.

Note that the intervals between LED which are adjacent to each other are preferably to be wide when the LED arrays 205a to 205c are attached to the backboard 203. This helps the heat generated from the LED 201 be radiated efficiently so that a temperature rise of the LED backlight 102 can be made small.

Note that the number of the LEDs 201 which is arranged over the LED arrays 205a to 205c and the number of the LED arrays 205 which is attached to the backboard 203 may be determined as appropriate in accordance with the size of the liquid crystal panel 101.

Figure 4:
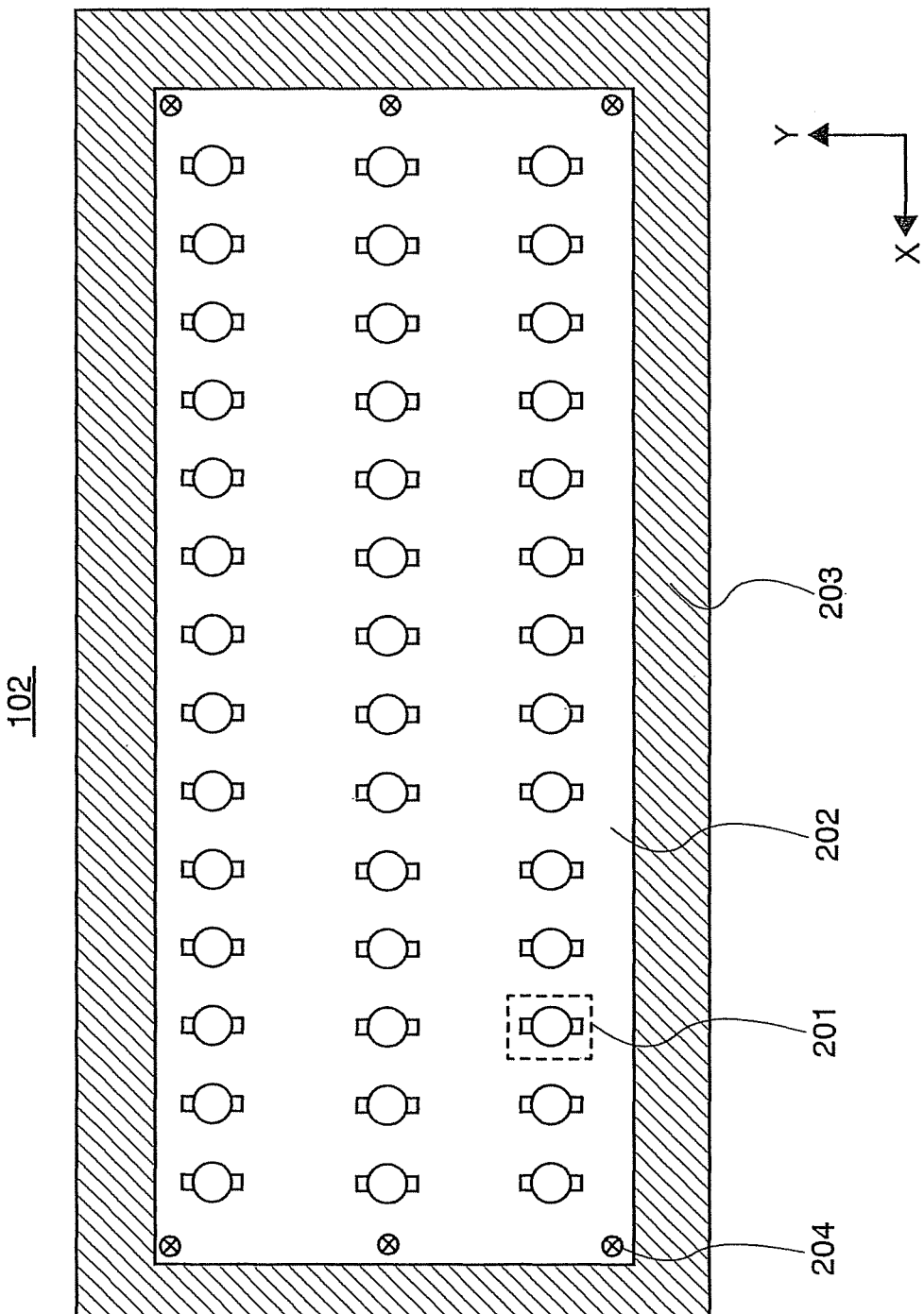
FIG. 4 is a view showing a configuration of an LED backlight of the invention.

Note that although the LEDs are arranged by forming a plurality of LED arrays in a configurational example shown in FIG. 2, the all LED which are necessary for forming the LED backlight may be arranged over one wiring board. A configurational example of the LED backlight 102 in this case is shown in FIG. 4. FIG. 4 shows a plan view of the LED backlight 102 when it is seen from the front surface side of the LED backlight 102.

Note that in order to improve light use efficiency of the LED 201, a reflecting means for reflecting light emitted from the LED 201 may be arranged. FIGS. 5A and 5B, FIGS. 6A and 6B show configurational examples of the LED backlight 102 in this case.

Note that light use efficiency of the LED corresponds to a ratio of the amount of light which enters the liquid crystal panel with respect to the amount of light which is radiated from the LED.

FIGS. 5A and 5B show a configurational example of the LED backlight in the case of applying a reflecting coating 501 which is made of a material having high reflectivity to a backboard 203. By applying the reflecting coating 501 to the backboard 203 in this manner, the backboard 203 can be utilized as a substitute for a reflector of the LED 201. This helps light emitted from the LED 201 be reflected on the backboard 203 to which the reflecting coating is applied, so that the light emitted from the LED 201 enters the liquid crystal panel 101, and thus, the light use efficiency of the LED 201 can be improved.

FIGS. 6A and 6B show a configurational example of the LED backlight in the case of additionally providing a reflecting portion which is made of a material having high reflectivity. In FIGS. 6A and 6B, a reflecting portion 601 is arranged so as to cover the wiring board 202, the terminals 206a and 206b of the LED 201, or the like. This helps the light emitted from the LED 201 be reflected on the reflecting portion 601, so that the light emitted from the LED 201 enters the liquid crystal panel 101, and thus, the light use efficiency of the LED 201 can be improved.

Note that the reflecting portion 601 may be an optical functioning sheet having a function of reflecting light, a material which includes copper, iron, aluminum, or the like, a metal plate of stainless steel or the like, for example. Alternatively, a white and plastic or acrylic plate may be employed. In addition, a surface of the reflecting portion 601 may have unevenness. This helps the light emitted from the LED 201 be reflected diffusely on the unevenness of the surface of the reflecting portion 601, so that the light can also be diffused. Accordingly, the light use efficiency of the LED 201 can be improved.

Note that in order to improve the light use efficiency of the LED 201, the wiring board 202, the backboard 203, and the screw 204 may be white. Thus, the light emitted from the LED 201 is reflected more, so that the light use efficiency of the LED 201 can be improved.

By providing the reflecting means for reflecting the light emitted from the LED in this manner, the light use efficiency of the LED can be improved. In addition, particularly in the case of arranging the three colors of LED of R, G, and B alternately, the light of three colors of R, G, and B more easily mix with each other since the light is reflected on the reflecting means; thereby, uniform white light can enter the liquid crystal panel 101. Accordingly, the color unevenness can be reduced.

Next, a configuration of the cooling device 103 in this embodiment mode is described with reference to FIG. 7, FIGS. 8A and 8B.

Figure 7:
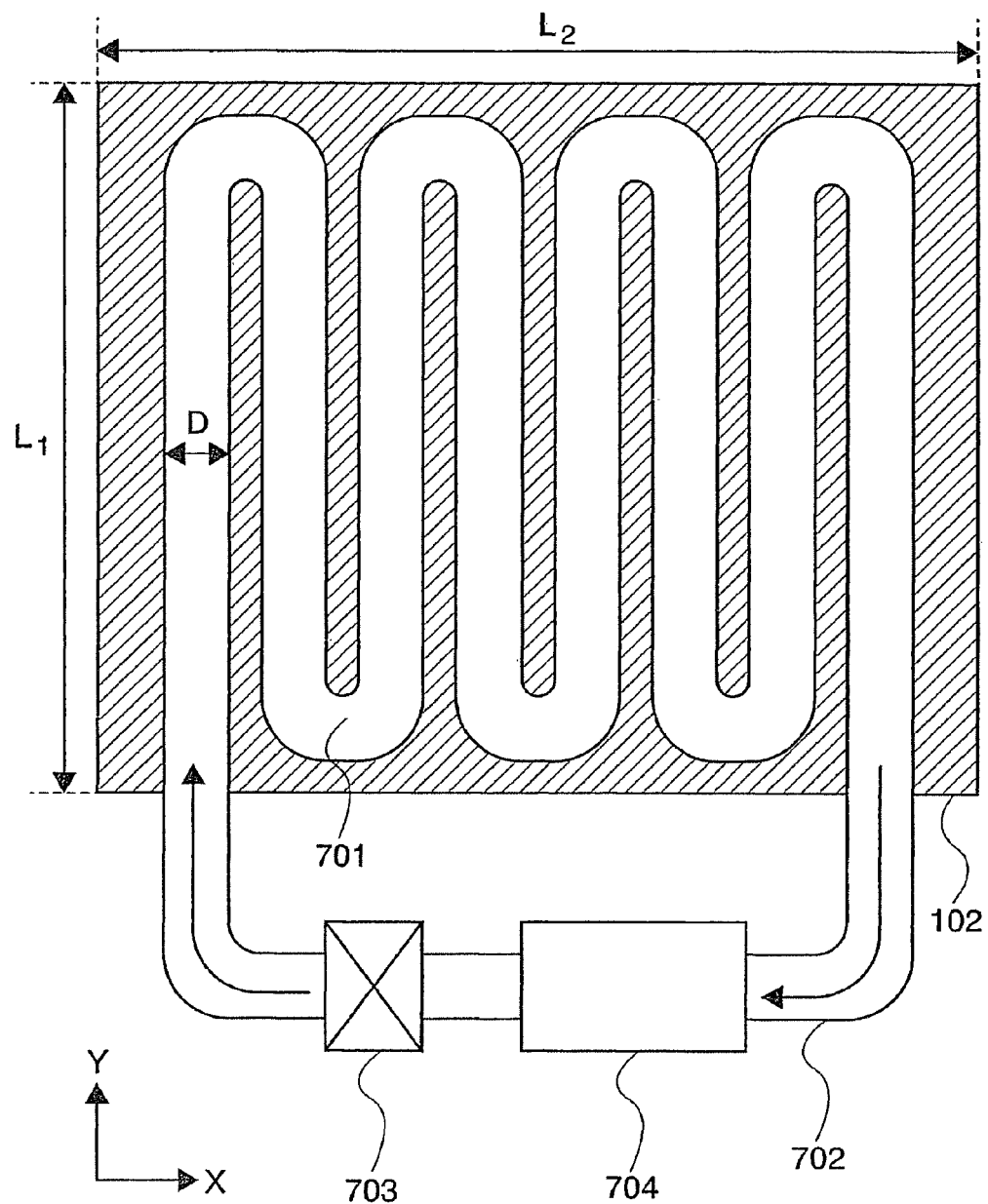
FIG. 7 is a view showing a configuration of a cooling device of the invention.

FIG. 7 shows a plan view of the cooling device 103 in this embodiment mode when it is seen from the back surface side of the LED backlight 102. The cooling device 103 in this embodiment mode includes a coolant 701, a pipe for the coolant (hereinafter described as a coolant pipe 702), a coolant circulation pump 703, a coolant tank 704, or the like.

Figure 8A:
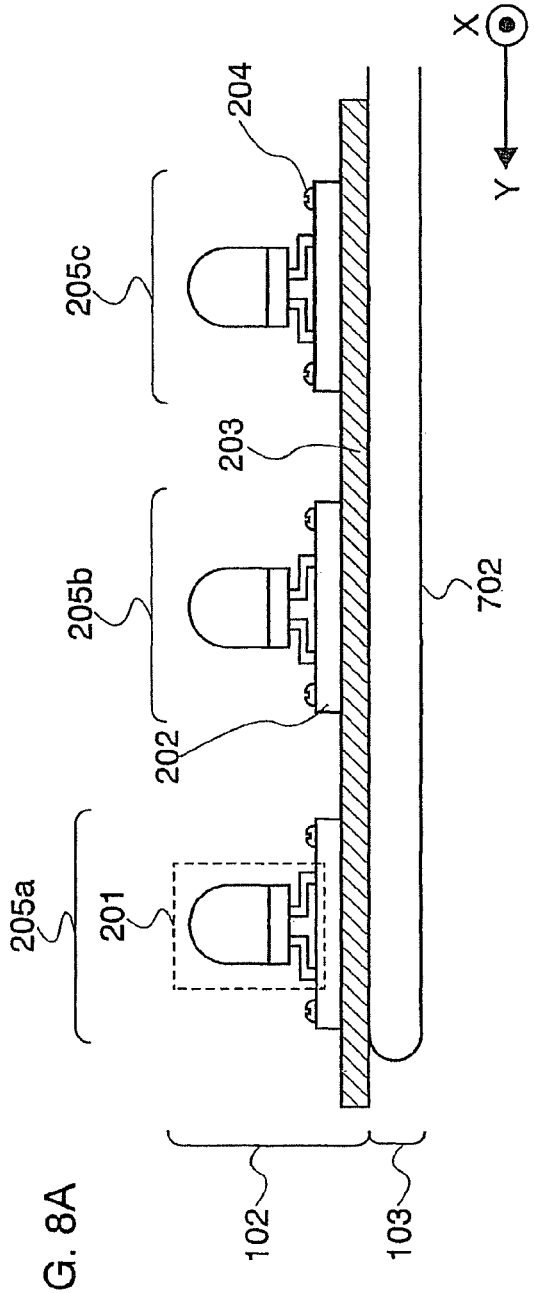
FIGS. 8A and 8B are views showing a configuration of a cooling device of the invention.

In addition, FIG. 8A shows a plan view of the cooling device 103 shown in FIG. 7 when it is seen from the X-axis side in FIG. 7. Further, FIG. 8B shows a plan view of the cooling device 103 shown in FIG. 7 when it is seen from the Y-axis side in FIG. 7.

Note that the coolant 701 is liquid for cooling the LED backlight. In addition, the coolant pipe 702 is a pipe for the coolant 701. Further, the coolant circulation pump 703 is a pump for circulating the coolant 701 in the cooling device. Moreover, the coolant tank 704 is a tank for storing the coolant 701.

Note that in the case of decreasing the amount of the coolant 701, the coolant 701 can be supplied to the coolant tank 704.

One end of the coolant pipe 702 is connected to the coolant tank 704 and the other end of the coolant pipe 702 is connected to the coolant tank 704 through the coolant circulation pump 703.

Figure 8B:
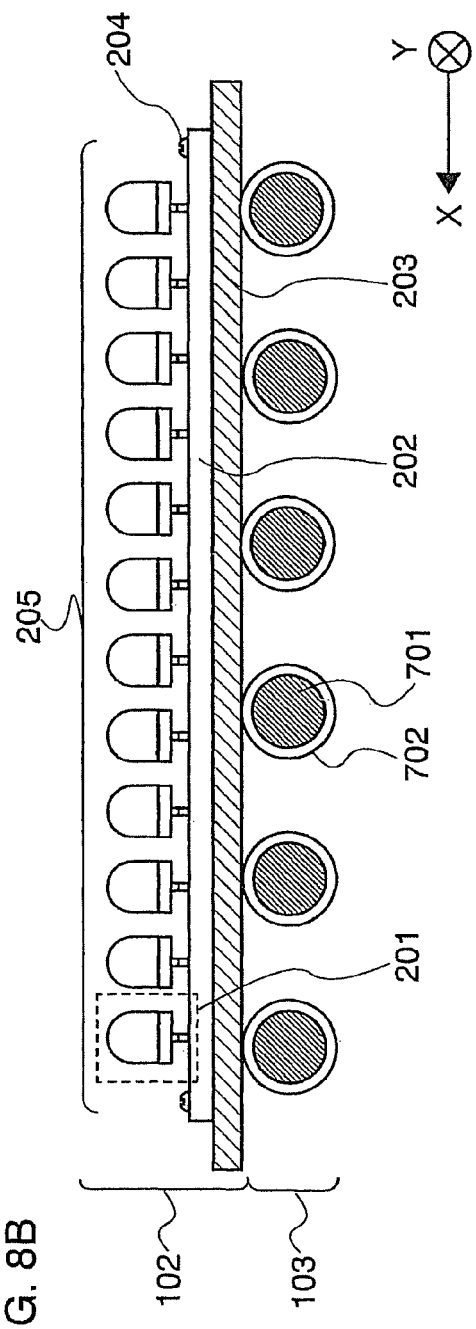

In addition, the coolant pipe 702 is arranged on the back surface side of the LED backlight 102 and arranged so as to be in contact with the LED backlight 102 as shown in FIGS. 8A and 8B. Furthermore, in a portion where the coolant pipe 702 is in contact with the LED backlight 102, the coolant pipe 702 is arranged by bending many times as shown in FIG. 7.

Note that as a method of making the LED backlight 102 and the coolant pipe 702 in contact with each other, the LED backlight 102 and the coolant pipe 702 may simply be in contact with each other or the LED backlight 102 and the coolant pipe 702 may be attached together by using an adhesive agent having high thermal conductance, an adhesive agent including a conductive particle, or the like.

Figure 9A:
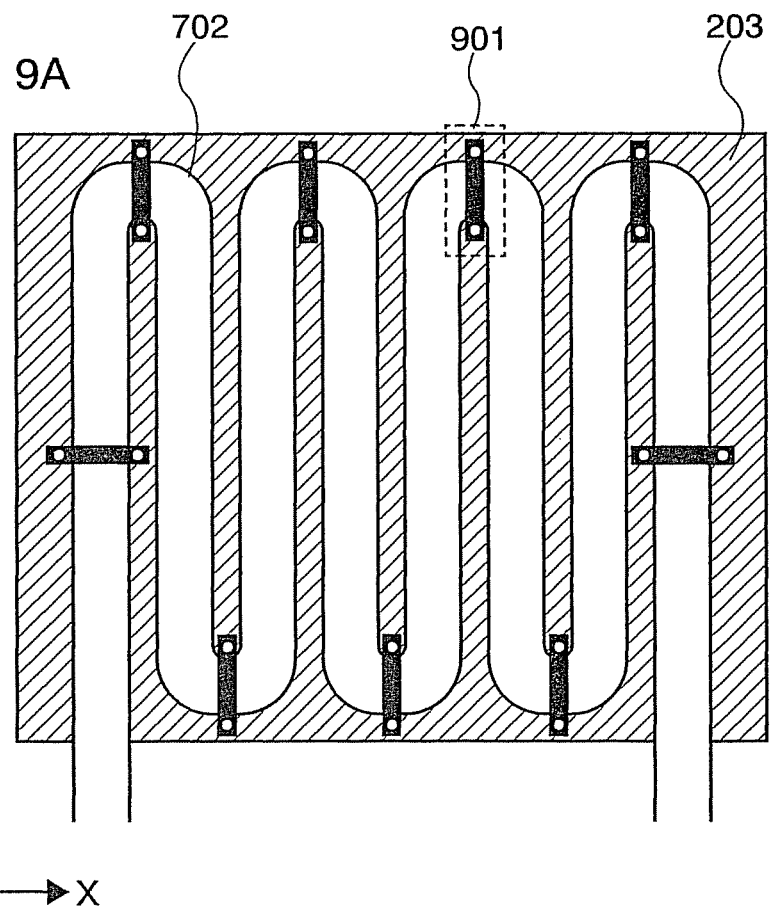
FIGS. 9A and 9B are diagrams showing a configuration of a cooling device of the invention.
Figure 9B:
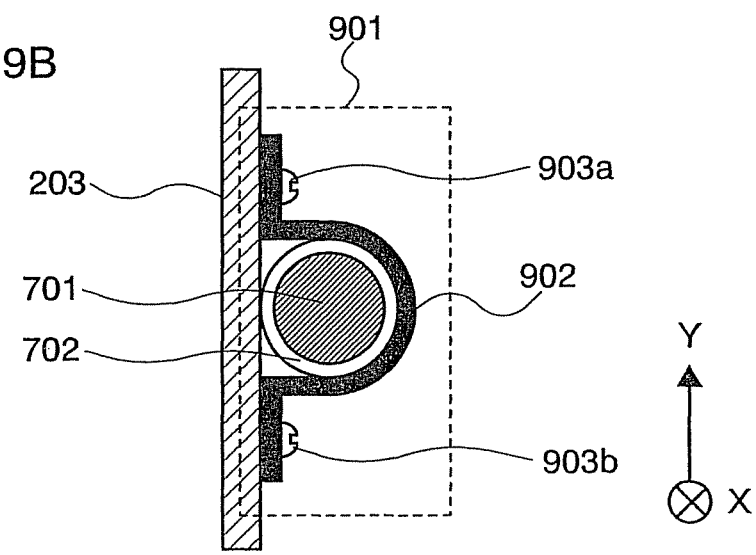

In addition, as shown in FIG. 9A, the coolant pipe 702 may be fixed to the LED backlight 102 by using a fixing device of coolant pipe 901. Note that FIG. 9B shows a cross-sectional structure of the fixing device of coolant pipe 901. In the fixing device of coolant pipe 901, a fixing plate 902 is put on the coolant pipe 702 and the fixing plate 902 is attached to the backboard 203 of the LED backlight 102 by using screws 903a and 903b.

Note that although the coolant circulation pump 703 and the coolant tank 704 are separately arranged in this embodiment mode, the invention is not limited to this. The coolant circulation pump 703 and the coolant tank 704 may be integrated.

Note that in order to improve the light use efficiency of the LED, a reflecting portion may be arranged in the LED backlight. FIGS. 63A and 63B show a configurational example of the LED backlight and the cooling device in this case. A reflecting portion 6301 is arranged in the LED backlight 102 in FIGS. 63A and 63B.

Next, an operation of the cooling device of this embodiment mode is described with reference to FIG. 7.

First, the coolant 701 is poured from the coolant tank 704 into the coolant pipe 702 by using the coolant circulation pump 703. After that, the coolant 701 is circulated in the cooling device. Then, the coolant 701 which has circulated in the cooling device is stored in the coolant tank 704 again.

In this series of operations, the heat generated from the LED backlight 102 is radiated by the coolant 701 and the coolant pipe 702 by making the coolant 701 flow to the coolant pipe 702 which is in contact with the LED backlight 102, so that temperature of the LED backlight 102 can be lowered. Thus, the LED backlight 102 can be cooled. In addition, in the portion where the coolant pipe 702 is in contact with the LED backlight 102, the coolant pipe 702 is arranged by bending many times. Therefore, an area where the LED backlight 102 and the coolant pipe 702 are in contact with each other can be increased, so that cooling efficiency of the LED backlight 102 can be more improved.

By cooling the LED backlight with the liquid cooling type cooling device, the LED backlight can be cooled in a shorter time and at lower temperature compared to the case of using a conventional air-cooled cooling device, so that the cooling efficiency can be more improved. Therefore, a display defect such as display unevenness or color unevenness caused by the heat generated from the LED backlight can be reduced.

Note that although the coolant 701 flows clockwise in FIG. 7, a direction of supplying the coolant 701 is not limited to this. The coolant 701 may be supplied counterclockwise.

Note that when vertical and horizontal length of the LED backlight are denoted by $L_1$ and $L_2$ respectively and a diameter of the coolant pipe is denoted by D (refer to FIG. 7), the diameter of the coolant pipe D is preferably greater than or equal to 1/100 and less than or equal to 1/10 of the shorter one of the vertical length $L_1$ and the horizontal length $L_2$ of the LED backlight. This is because when the diameter of the coolant pipe is too long, the thickness of the cooling device is increased, so that a lot of space is required in the cooling device although a large quantity of the coolant can be supplied to the coolant pipe to improve the cooling efficiency. On the other hand, when the diameter of the coolant pipe is too short, high pressure is required to supply the coolant to the coolant pipe so that a high-performance coolant circulation pump has to be used although the thickness of the cooling device can be made small. Accordingly, the diameter of the coolant pipe is required to be set within an appropriate range.

Note that although the coolant pipe 702 is arranged by bending up and down (on the Y-axis side in FIG. 7) many times in FIG. 7, an arrangement of the coolant pipe 702 is not limited to this.

Figure 10:
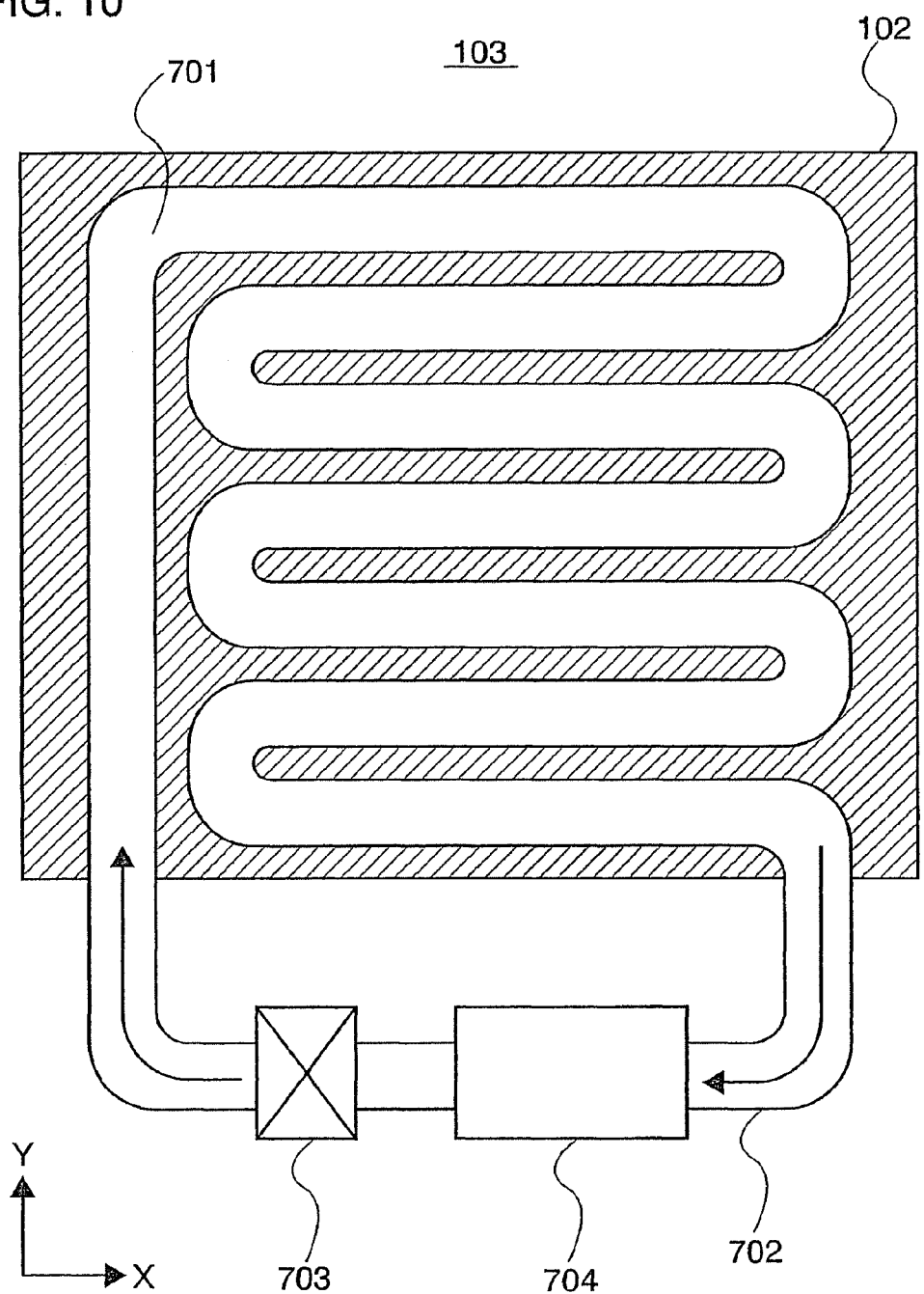
FIG. 10 is a diagram showing a configuration of a cooling device of the invention.

For example, the coolant pipe 702 may be arranged by bending from side to side (on an X-axis side in FIG. 10) many times as shown in FIG. 10. In the case of arranging the coolant pipe 702 in this manner, the area where the LED backlight 102 and the coolant pipe 702 are in contact with each other can be increased similarly to the case shown in FIG. 7, so that the cooling efficiency of the LED backlight 102 can be more improved.

Figure 11:
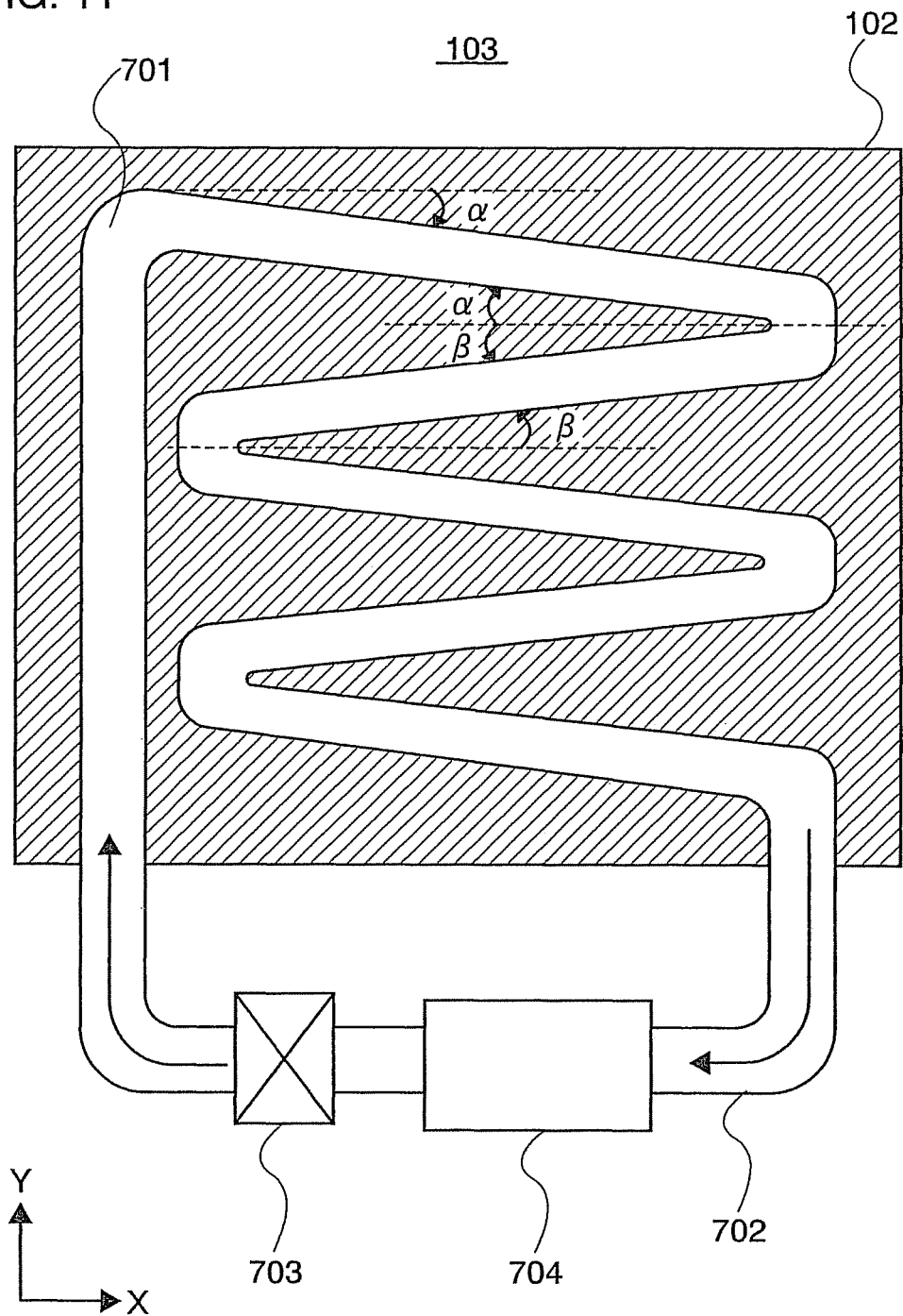
FIG. 11 is a diagram showing a configuration of a cooling device of the invention.

In addition, in FIG. 10, although the coolant pipe 702 is arranged so as to be in parallel to the X-axis in FIG. 10, the coolant pipe 702 may be arranged so as to have a slope to the X-axis in FIG. 11 as shown in FIG. 11. FIG. 11 shows the case where by slanting with slope angles $\alpha$ and $\beta$, the coolant pipe 702 is arranged (note that FIG. 10 corresponds to the case where $\alpha=\beta=0°$ is satisfied). By slanting and arranging the coolant pipe 702 in this manner, the coolant 701 is lifted to an upper part of the LED backlight with the coolant circulation pump 703. After that, the coolant 701 can be supplied naturally to the coolant pipe 702 by gravity. Accordingly, load of the coolant circulation pump 703 can be reduced.

Note that the slope angles $\alpha$ and $\beta$ of the coolant pipe 702 are both set to greater than or equal to 0° and less than or equal to 90° in FIG. 11. In addition, the slope angles $\alpha$ and $\beta$ may be equal to each other, that is, $\alpha=\beta$, or may be different from each other, that is, $\alpha \neq \beta$; however, $\alpha=\beta$ is preferably employed. This is because the coolant 701 can flow more easily when the slope angles $\alpha$ and $\beta$ satisfy $\alpha=\beta$. Note that when a difference between $\alpha$ and $\beta$ is within 10%, that is, the angle of slope $\alpha$ is within a range of $0.9\beta<\alpha<1.1\beta$, the slope angles $\alpha$ and $\beta$ are considered to satisfy $\alpha=\beta$.

Figure 13:
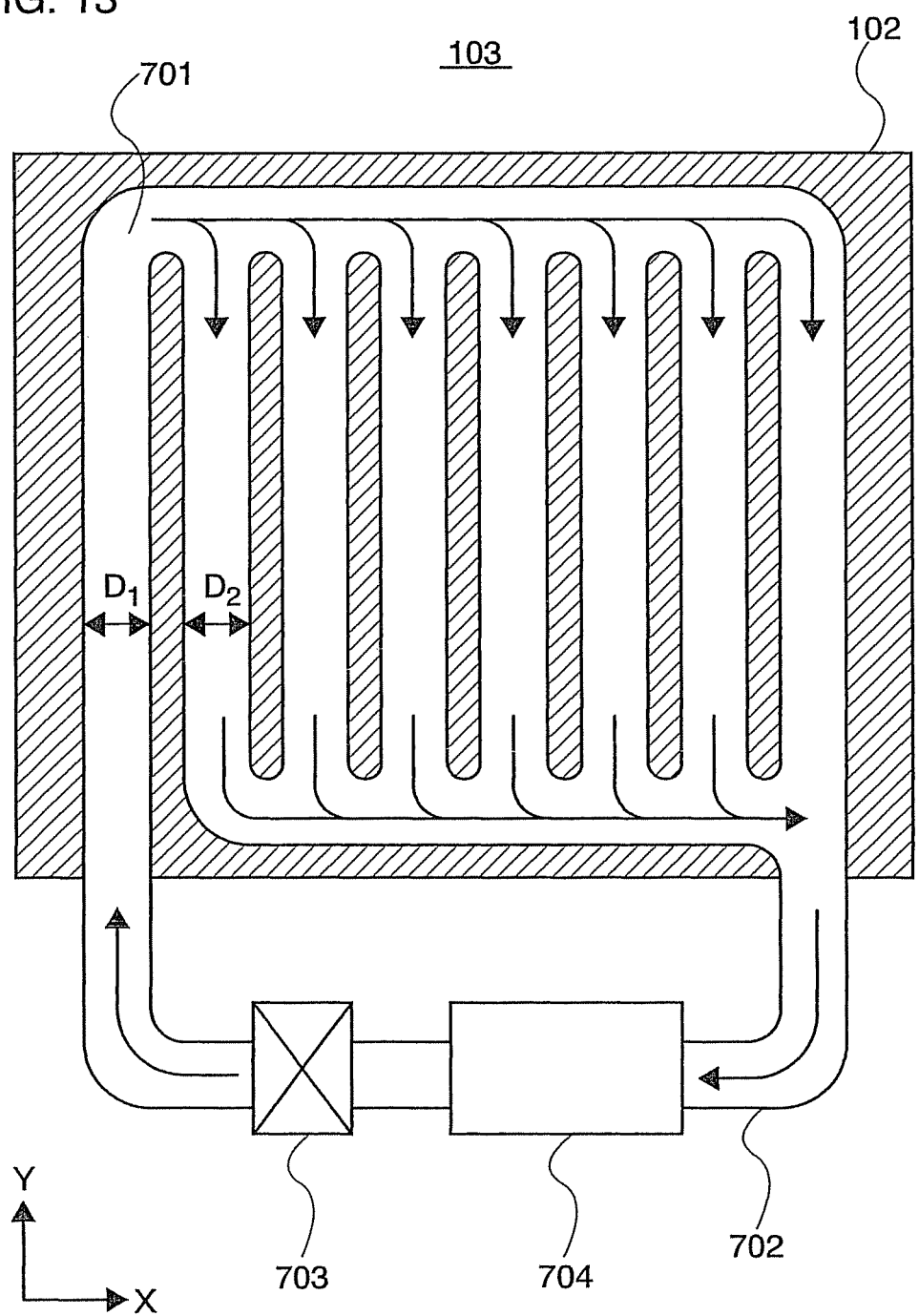
FIG. 13 is a diagram showing a configuration of a cooling device of the invention.
Figure 14:
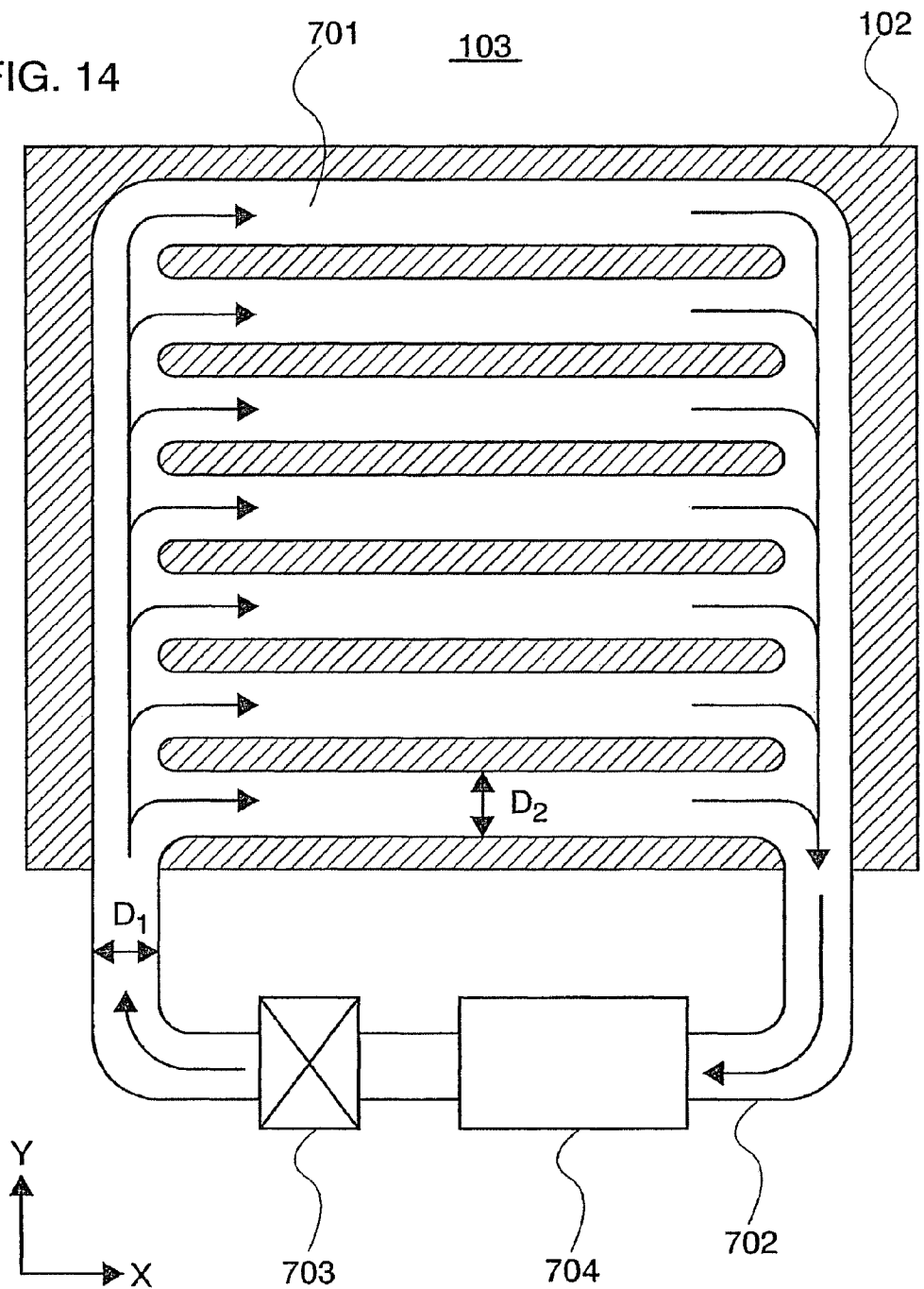
FIG. 14 is a diagram showing a configuration of a cooling device of the invention.

In addition, although the coolant pipe 702 is not divided on the way in FIG. 7 to FIG. 11, the coolant pipe 702 may be divided on the way. FIGS. 13 and 14 show exemplary arrangements of the coolant pipe 702 in this case. FIG. 13 shows an exemplary arrangement of the coolant pipe 702 in the case of dividing the coolant pipe 702 up and down (on a Y-axis side in FIG. 13). FIG. 14 shows an arrangement example of the coolant pipe 702 in the case of dividing the coolant pipe 702 from side to side (on an X-axis side in FIG. 14). By dividing the coolant pipe 702 on the way in this manner, the coolant 701 can be supplied in multiple directions at one time. Therefore, many regions of the LED backlight can be cooled at one time, so that the cooling efficiency of the LED backlight 102 can be more improved. In addition, the LED backlight can be equally cooled.

Note that when a diameter of a portion of the coolant pipe which is not divided is denoted by $D_1$, and a diameter of a portion of the coolant pipe which is divided is denoted by $D_2$, $D_1>D_2$ is preferably satisfied. This is because more coolant flows in the portion of the coolant pipe which is not divided than the portion of the coolant pipe which is divided. By satisfying $D_1>D_2$, the coolant can flow more easily.

Figure 15:
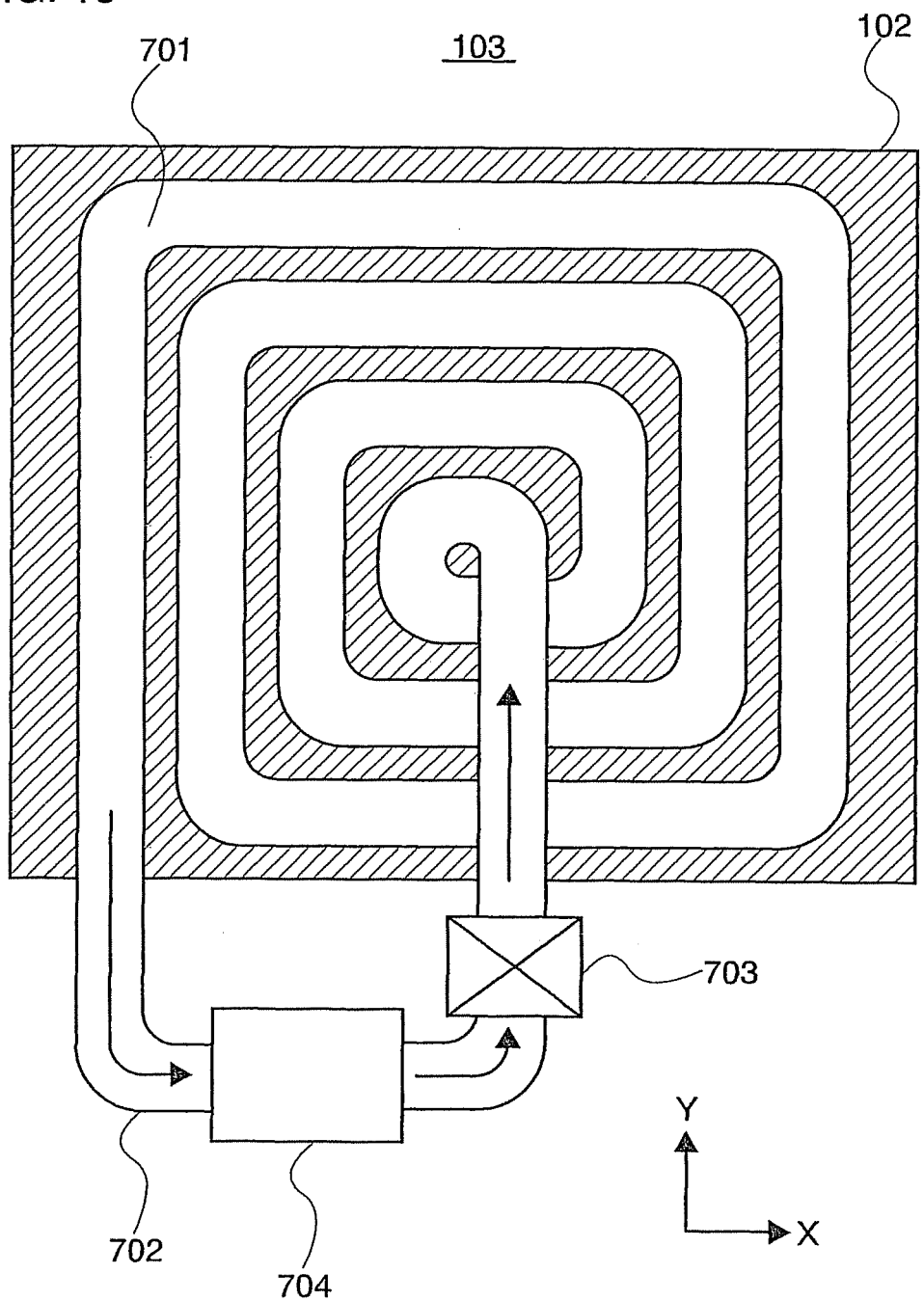
FIG. 15 is a diagram showing a configuration of a cooling device of the invention.

Meanwhile, the heat generated from the LED backlight easily remains in a central portion of the LED backlight in usual, so that temperature in the central portion of the LED backlight becomes higher than temperature in a peripheral portion of the LED backlight. Thus, by arranging the coolant pipe 702 in spiral and making the coolant 701 flow from a central portion of the spiral to an outside as shown in FIG. 15, temperature can be decreased gradually from the central portion of the LED backlight having the highest temperature. Accordingly, the cooling efficiency of the LED backlight can be more improved. In addition, since an phenomenon where temperature of the backlight is different depending on places (temperature unevenness) can be decreased, a display defect such as display unevenness or color unevenness caused by the temperature unevenness of the LED backlight can be reduced.

Note that in the case of arranging the coolant pipe 702 in spiral, the coolant pipe 702 is arranged counterclockwise from the central portion of the spiral toward the outside in FIG. 15; however, the spiral may be arranged in reverse.

Note that the flow directions of the coolant 701 shown in FIGS. 7 to 15 are not limited to the directions as illustrated. The coolant pipe may be supplied in directions opposite to the directions as illustrated.

Note that the arrangement of the coolant pipe 702 is not limited to the aforementioned examples. In particular, when the coolant pipe 702 is provided on a back surface side of the LED backlight 102, the coolant pipe 702 is preferably arranged such that at least one or more LED exists over the coolant pipe 702. This is because distance between the coolant pipe and the LED becomes closer, so that the LED can be cooled in a shorter time and more efficiently.

Note that although shapes of cross sections of the coolant pipe 702 are circles in FIG. 7 to FIG. 15, the invention is not limited to this. For example, a shape of a cross section of the coolant pipe 702 may be a quadrangle.

For example, FIGS. 12A and 12B show a configurational example of the cooling device 103 when the shape of the cross section of the coolant pipe is a rectangle. In FIGS. 12A and 12B, the shape of the cross section of the coolant pipe 702 is made to be a rectangle having round corners and a long side of the rectangle is in contact with the LED backlight 102.

By making the shape of the cross section of the coolant pipe 702 rectangular and the long side of the rectangle be in contact with the LED backlight in this manner, the areas where the LED backlight and the coolant pipe are in contact with each other can be increased so that cooling efficiency of the LED backlight can be more improved. In addition, by shortening a short side of the rectangle more, thickness of portions in which the coolant pipe takes up can be thinner. Accordingly, the display device can be thinner.

Further, by rounding the corners of the rectangle of the cross section of the coolant pipe, stress which is applied to the coolant pipe when the coolant pipe is bent can be smaller, so that the coolant pipe is hardly damaged.

It is to be noted that with respect to a degree for rounding the corners of the rectangle of the cross section of the coolant pipe, in the rectangle of the cross section of the coolant pipe, when the length of the short side is denoted by $L_3$ and the length of the long side is denoted by $L_4$ (refer to FIGS. 12A and 12B), the radii of curvature in portions of the corners of the rectangle are equal to less than or equal to than half $L_3$.

Figure 16:
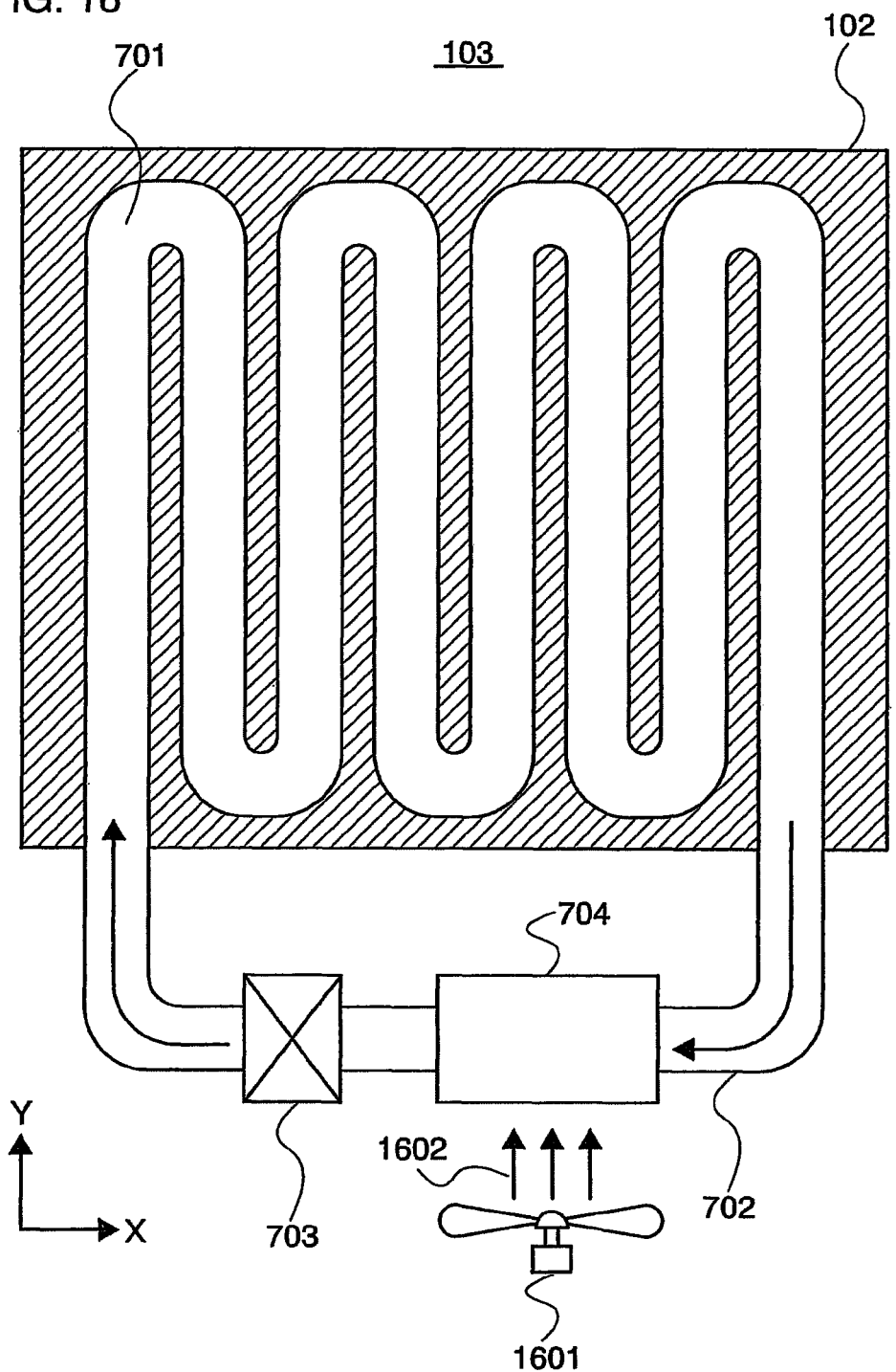
FIG. 16 is a diagram showing a configuration of a cooling device of the invention.

Meanwhile, when the coolant is circulated in the cooling device, the temperature of the coolant rises by the heat generated from the LED backlight. Then, the coolant of which temperature rises is stored in the coolant tank again. Thus, in order to lower the temperature of the coolant, a cooling fan for cooling the coolant tank may be arranged. FIG. 16 shows a configurational example of the cooling device 103 in this case.

FIG. 16 shows the case where a cooling fan 1601 is additionally provided as a means for lowering temperature of the coolant 701 in FIG. 7. The cooling fan 1601 is operated and wind 1602 is got on the coolant tank 704, and thus, the coolant tank 704 and the coolant 701 which is stored in the coolant tank 704 are cooled. Therefore, the temperature of the coolant 701 can be lowered so that the cooling efficiency of the LED backlight can be more improved.

Figure 17:
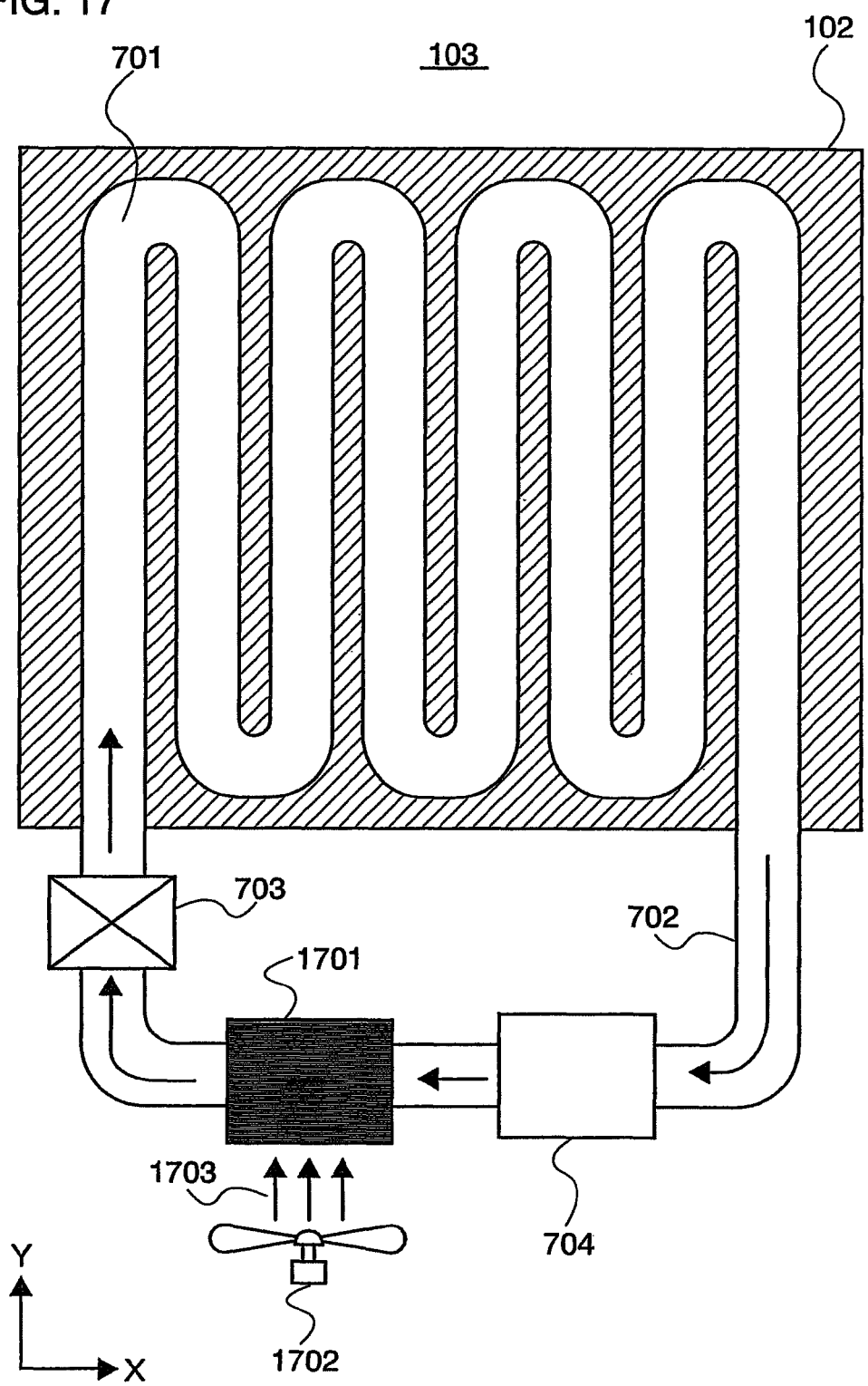
FIG. 17 is a diagram showing a configuration of a cooling device of the invention.

Alternatively, a radiator may be arranged as a means for lowering the temperature of the coolant. FIG. 17 shows a configurational example of the cooling device 103 in this case.

FIG. 17 shows the case where a radiator 1701 is additionally provided as a means for lowering the temperature of the coolant 701 in FIG. 7. In FIG. 17, the radiator 1701 and a cooling fan 1702 are additionally provided in addition to the devices shown in FIG. 7.

First, the coolant 701 which is stored in the coolant tank 704 is put through the radiator 1701. In the radiator 1701, the cooling fan 1702 is operated and wind 1703 is got on the radiator 1701, and thus, the coolant 701 which is put through the radiator 1701 is cooled. Then, the coolant 701 which is cooled by the radiator 1701 is circulated in the cooling device by using the coolant circulation pump 703.

By using the radiator 1701 in this manner, the temperature of the coolant 701 can be lowered in a short time so that the cooling efficiency of the LED backlight can be more improved.

Note that water, ethylene glycol, glycerin, polyvinyl alcohol solution, or the like is used as the coolant 701. Alternatively, antifreeze solution to which a corrosion inhibitor is added may be employed, if necessary. Note that liquid which is employed as the coolant is not limited to the aforementioned examples.

Note that a material of the coolant pipe 702 may be one including copper, iron, aluminum, or the like, or metal such as stainless steel for example, or may be an organic compound such as polyethylene, polystyrene, polypropylene, or polyester terephthalate for example.

For example, when the coolant pipe 702 is made from metal, thermal conductance is increased so that the LED backlight can be cooled more efficiently. In particular, since copper has high thermal conductance and corrosion resistance, copper is preferably employed in the case where the coolant pipe 702 is made of metal. Alternatively, when the coolant pipe 702 is made of an organic compound, a coolant pipe having flexibility can be formed so that the coolant pipe 702 can be arranged freely. Further, when a silicon-based material is employed as the material of the coolant pipe 702, a coolant pipe having flexibility can be formed so that the coolant pipe 702 can be arranged freely.

Note that the material of the coolant pipe 702 is not limited to the aforementioned examples.

Figure 18:
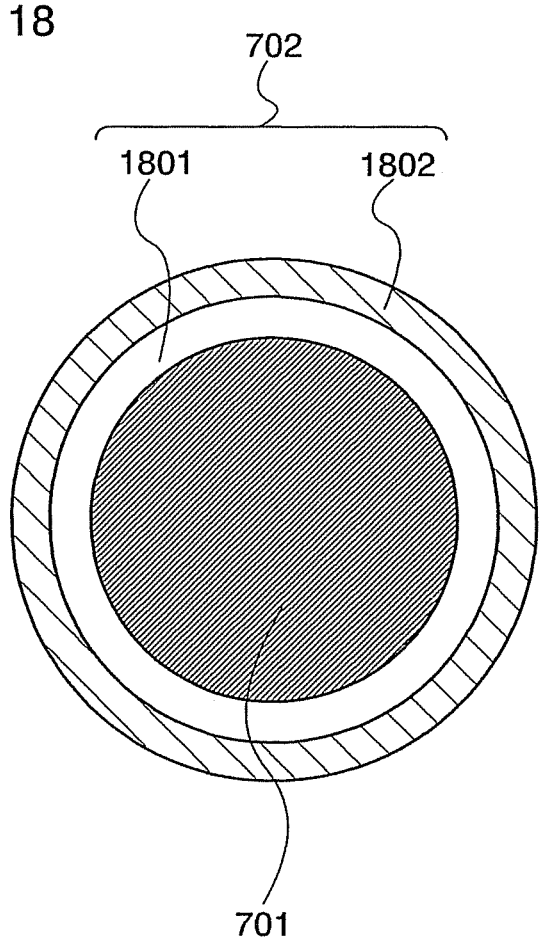
FIG. 18 is a diagram showing a configuration of a cooling device of the invention.

Note that the coolant pipe may be manufactured of one kind of material, or may be formed to have a multi-layer structure by using a plurality of materials. For example, as shown in FIG. 18, the coolant pipe 702 may be formed to have a two-layer structure using two kinds of materials of a first material 1801 and a second material 1802. In particular, by using a material having high corrosion resistance for the first material 1801 and a material having high thermal conductance for the second material 1802, a coolant pipe having high resistance to the corrosion with the coolant 701 and radiating the heat of the LED backlight efficiently can be formed.

Note that various contents described in this embodiment mode may be freely combined and implemented.

Embodiment Mode 2

Although the entire LED backlight is cooled by using one coolant pipe in Embodiment Mode 1, the LED backlight is divided into a plurality of cooling regions and the LED backlight may be cooled in each cooling region. Thus, this embodiment describes the case where the LED backlight is divided into a plurality of cooling regions and the LED backlight is cooled in each cooling region.

Figure 20:
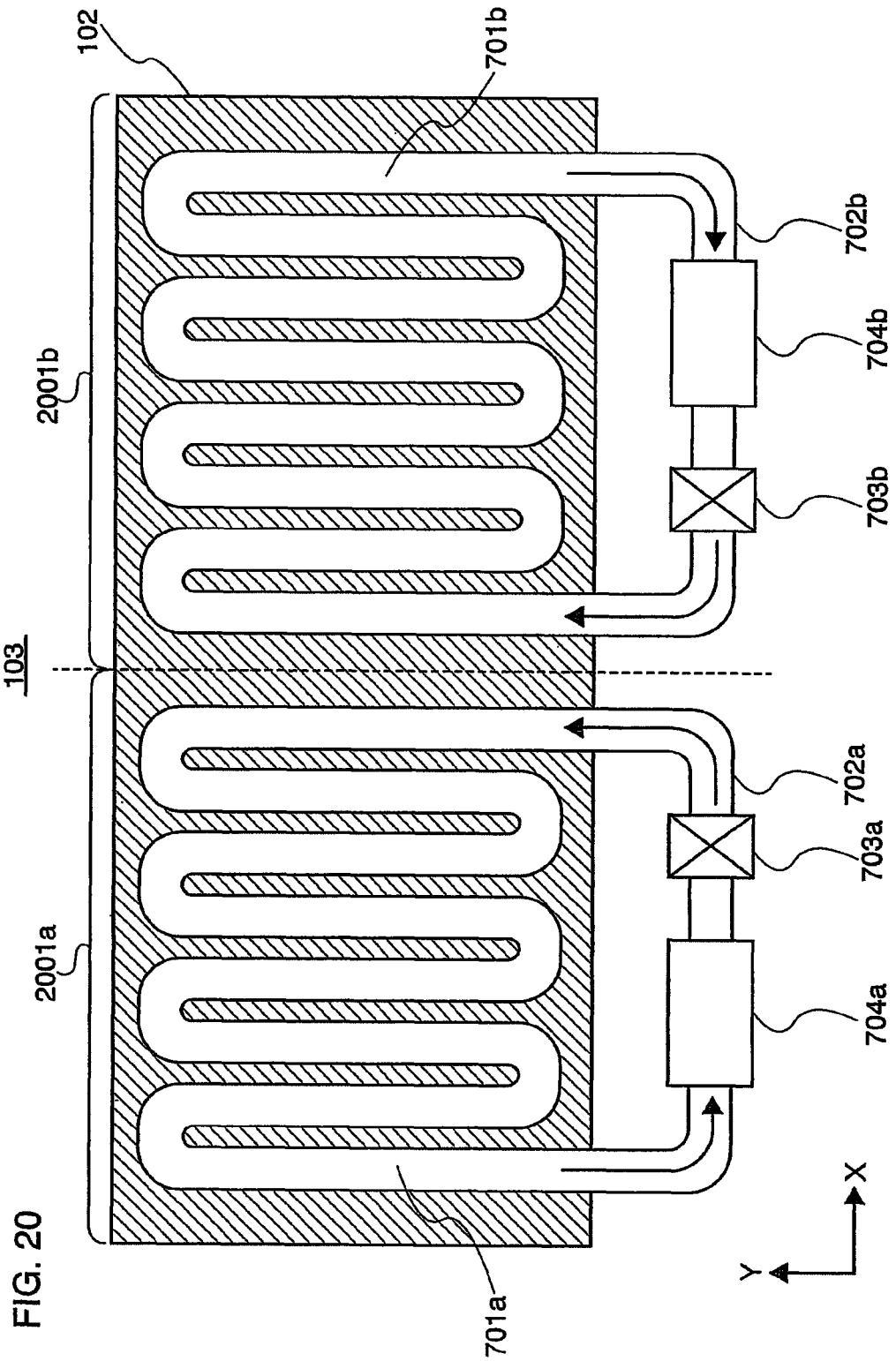
FIG. 20 is a diagram showing a configuration of a cooling device of the invention.

FIG. 20 shows a configurational example of a cooling device in this embodiment mode.

FIG. 20 shows a plan view of the cooling device 103 in this embodiment mode when it is seen from a back surface side of the LED backlight 102. FIG. 20 shows a configurational example of the cooling device 103 in the case where the LED backlight is divided into two cooling regions from side to side and the LED backlight is cooled in each cooling region.

In FIG. 20, the LED backlight 102 is divided into two cooling regions of a first cooling region 2001a and a second cooling region 2001b from side to side, and coolant pipes 702a and 702b, coolant circulation pumps 703a and 703b, and coolant tanks 704a and 704b are arranged in the first and second cooling regions 2001a and 2001b. In addition, each of the coolant pipes 702a and 702b is arranged by bending up and down (on a Y-axis side in FIG. 20) many times.

By dividing the LED backlight into a plurality of cooling regions and cooling the LED backlight in each cooling region in this manner, the time which is needed for cooling the entire LED backlight can be made shorter than the case where the LED backlight is cooled without being divided into a plurality of cooling regions, so that the cooling efficiency can be more improved. In addition, temperature unevenness of the LED backlight can be more reduced, and a display defect such as display unevenness or color unevenness caused by the temperature unevenness of the LED backlight can be reduced.

Note that flow directions of the coolants may be all the same in a plurality of cooling regions, or may be different in each of a plurality of cooling regions.

For example, in FIG. 20, a coolant 701a flows counterclockwise in the first cooling region 2001a and a coolant 701b flows clockwise in the second cooling region 2001b; however, the invention is not limited to this. The coolant 701a may flow clockwise in the first cooling region 2001a and the coolant 701b may flow counterclockwise in the second cooling region 2001b. Alternatively, both of the coolants 701a and 701b may flow clockwise or may flow counterclockwise in the first and second cooling regions 2001a and 2001b. Note that as shown in FIG. 20, when the coolant 701a flows counterclockwise in the first cooling region 2001a and the coolant 701b flows clockwise in the second cooling region 2001b, temperature can be decreased gradually from the central portion of the LED backlight where heat easily remains and of which temperature rises most. Accordingly, since the cooling efficiency of the LED backlight can be more improved and further the temperature unevenness of the LED backlight can be more reduced, the display defect such as display unevenness or color unevenness caused by the temperature unevenness of the LED backlight can be reduced.

It is to be noted that although each of the coolant pipes 702a and 702b is arranged by bending up and down (on the Y-axis side in FIG. 20) many times in FIG. 20, an arrangement of the coolant pipes 702a and 702b is not limited to this.

Figure 21:
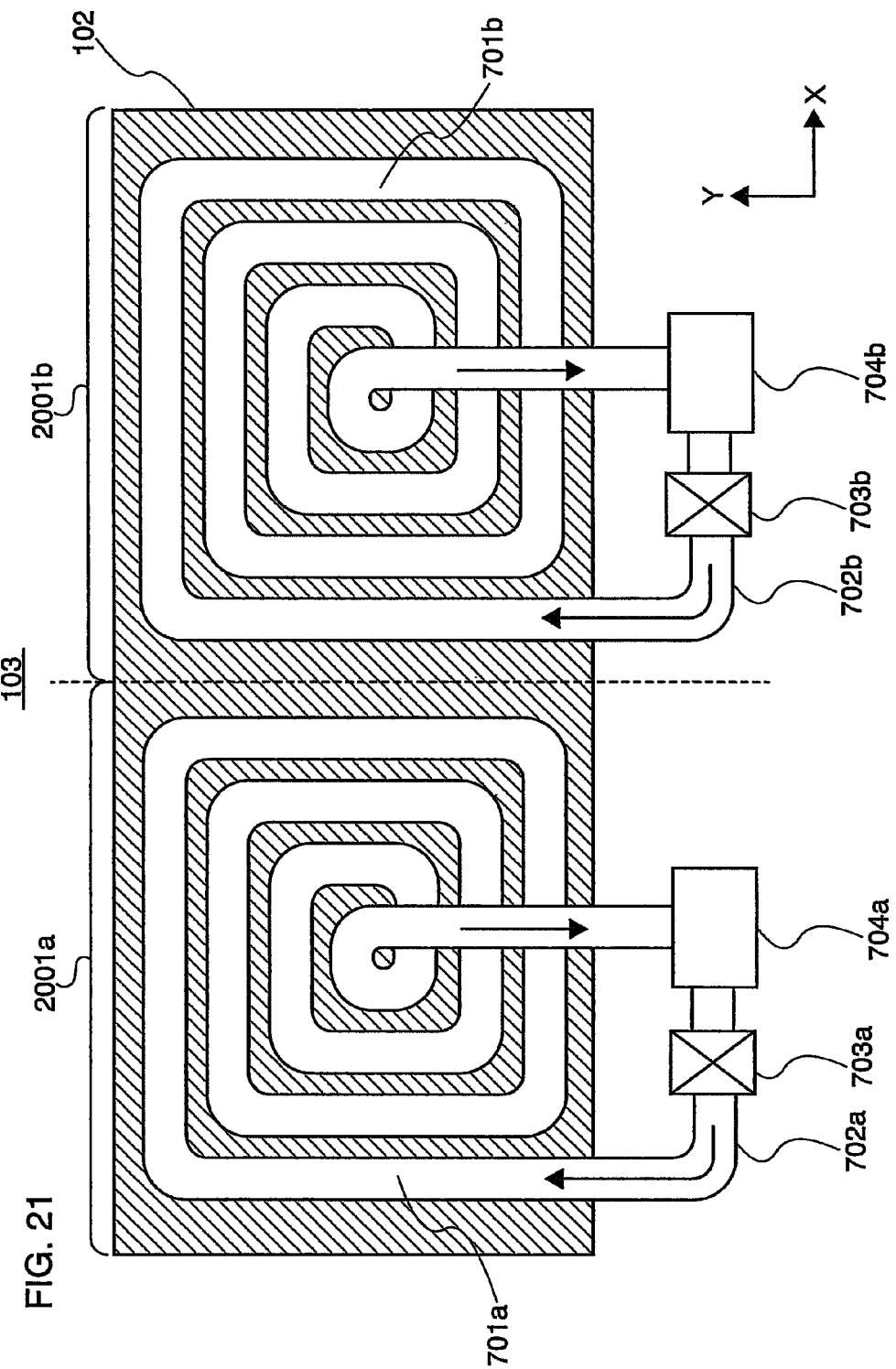
FIG. 21 is a diagram showing a configuration of a cooling device of the invention.
Figure 22:
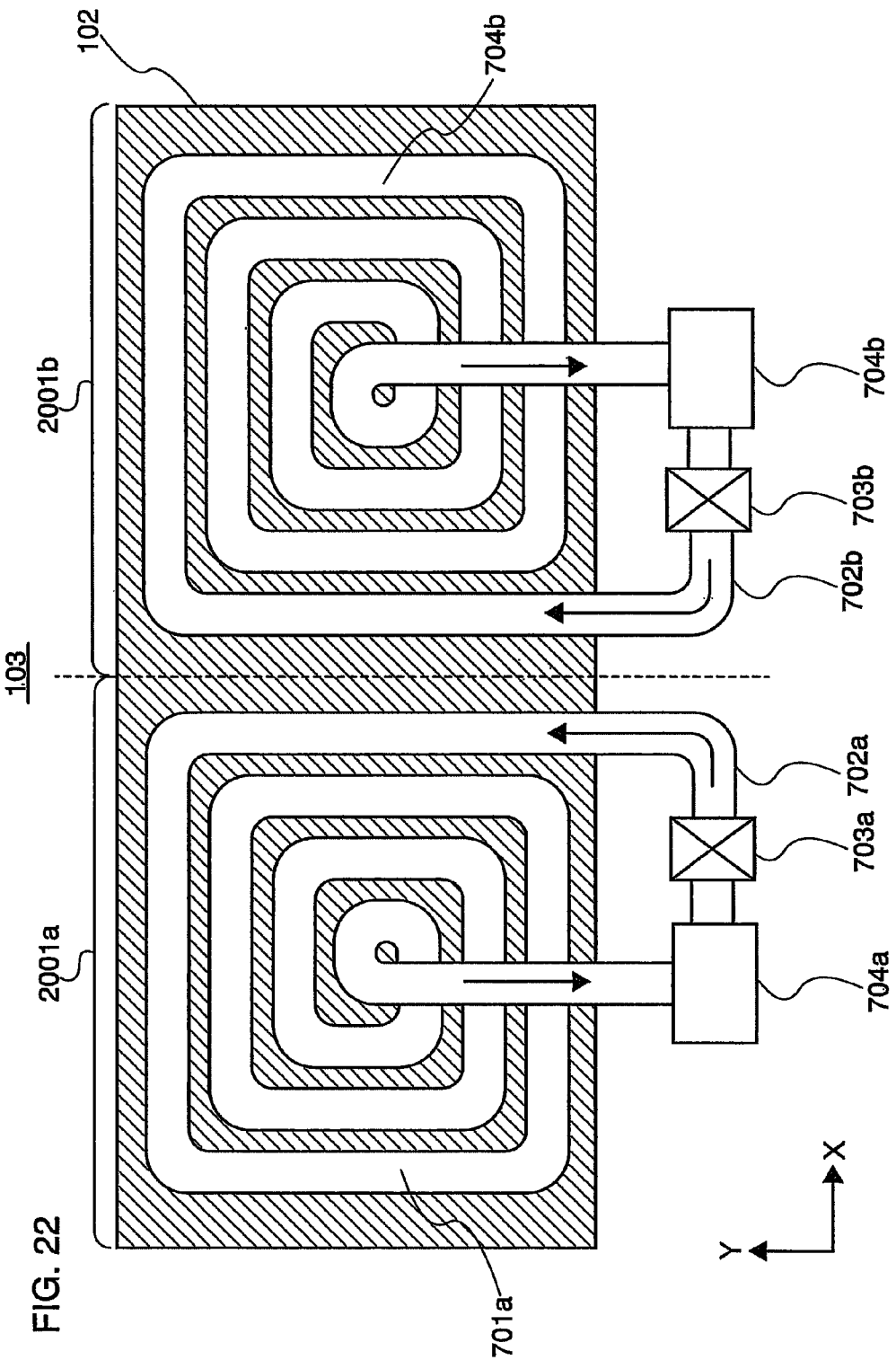
FIG. 22 is a diagram showing a configuration of a cooling device of the invention.

For example, as shown in FIGS. 21 and 22, each of the coolant pipes 702a and 702b may be arranged in spiral. Note that FIG. 21 shows the case where each of the coolant pipes 702a and 702b is arranged counterclockwise from a central portion of the spiral toward an outside in the first and second cooling regions 2001a and 2001b. In addition, FIG. 22 shows the case where the coolant pipe 702a is arranged clockwise from the central portion of the spiral toward the outside in the first cooling region 2001a and the coolant pipe 702b is arranged clockwise toward from the central portion of the spiral to the outside in the second cooling region 2001b. Note that in both of FIGS. 21 and 22, the coolants 701a and 701b flow toward the central portions of the spirals from the outsides.

When each of the coolant pipes 702a and 702b is arranged in spiral in the first and second cooling regions 2001a and 2001b and the coolants 701a and 701b flow toward the central portions of the spirals from the outsides as shown in FIG. 22, temperature can be decreased gradually from the central portion of the LED backlight where heat easily remains and of which temperature rises most similarly to the case shown in FIG. 20. Accordingly, since the cooling efficiency of the LED backlight can be more improved and further the temperature unevenness of the LED backlight can be more reduced, the display defect such as display unevenness or color unevenness caused by the temperature unevenness of the LED backlight can be reduced.

Figure 23:
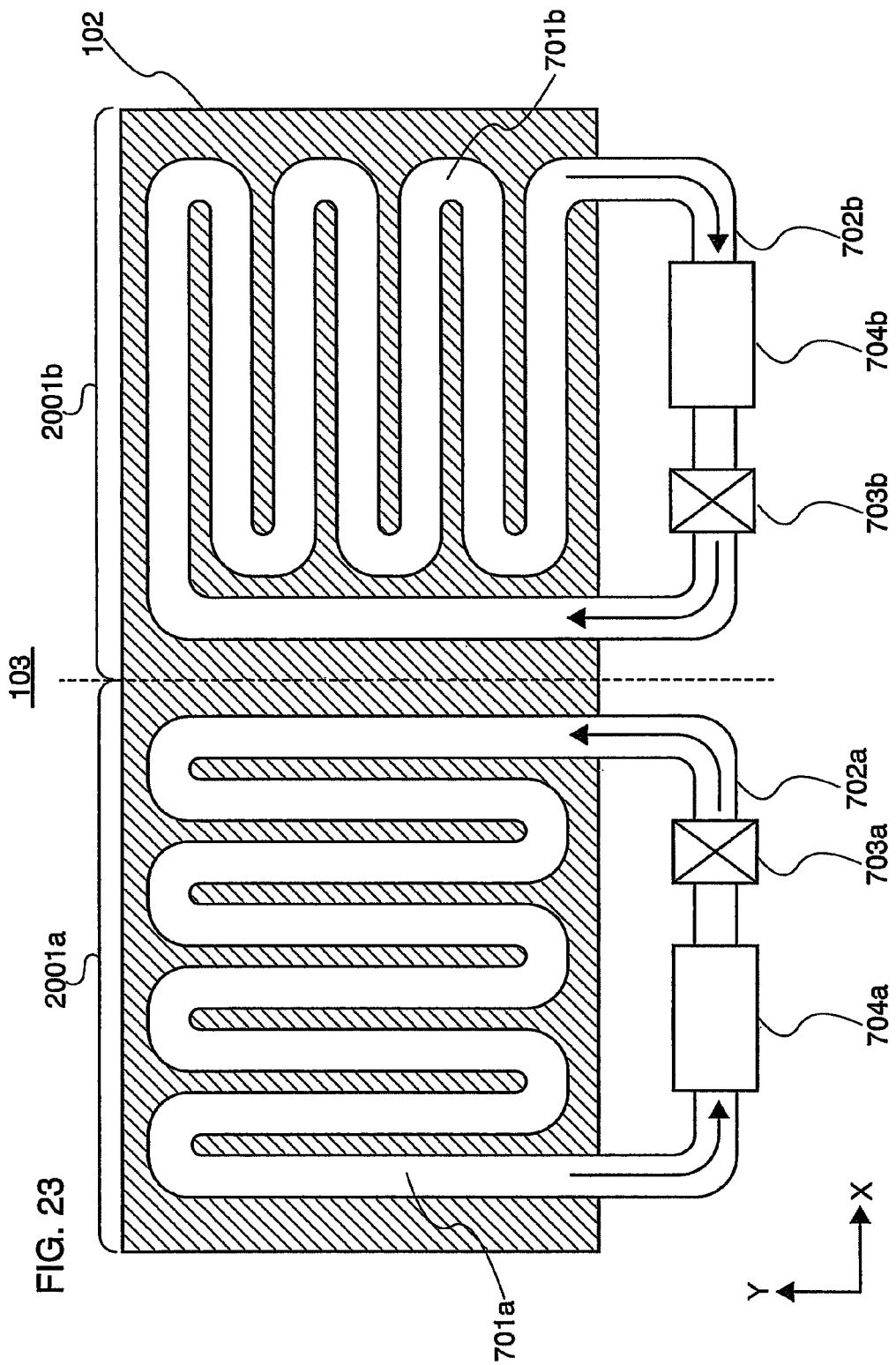
FIG. 23 is a diagram showing a configuration of a cooling device of the invention.

Alternatively, for example, the arrangement of the coolant pipe may be changed in each of a plurality of cooling regions as shown in FIG. 23.

FIG. 23 shows the case where the coolant pipe 702a is arranged by bending up and down (on a Y-axis side in FIG. 23) many times in the first cooling region 2001a and the coolant pipe 702b is arranged by bending from side to side (on an X-axis side in FIG. 23) many times in the second cooling region 2001b.

In FIG. 23, by making the coolants 701a and 701b flow counterclockwise in the first cooling region 2001a and making the coolants 701a and 701b flow clockwise in the second cooling region 2001b, temperature can be decreased gradually from the central portion of the LED backlight where heat easily remains and of which temperature rises most similarly to the cases shown in FIGS. 20 to 22. Accordingly, since the cooling efficiency of the LED backlight can be more improved and further the temperature unevenness of the LED backlight can be more reduced, the display defect such as display unevenness or color unevenness caused by the temperature unevenness of the LED backlight can be reduced.

Note that although the LED backlight is divided into two cooling regions from side to side in FIGS. 20 to 23, division of the cooling regions is not limited to this example. For example, the LED backlight may be divided into two cooling regions up and down as shown in FIG. 24.

Figure 24:
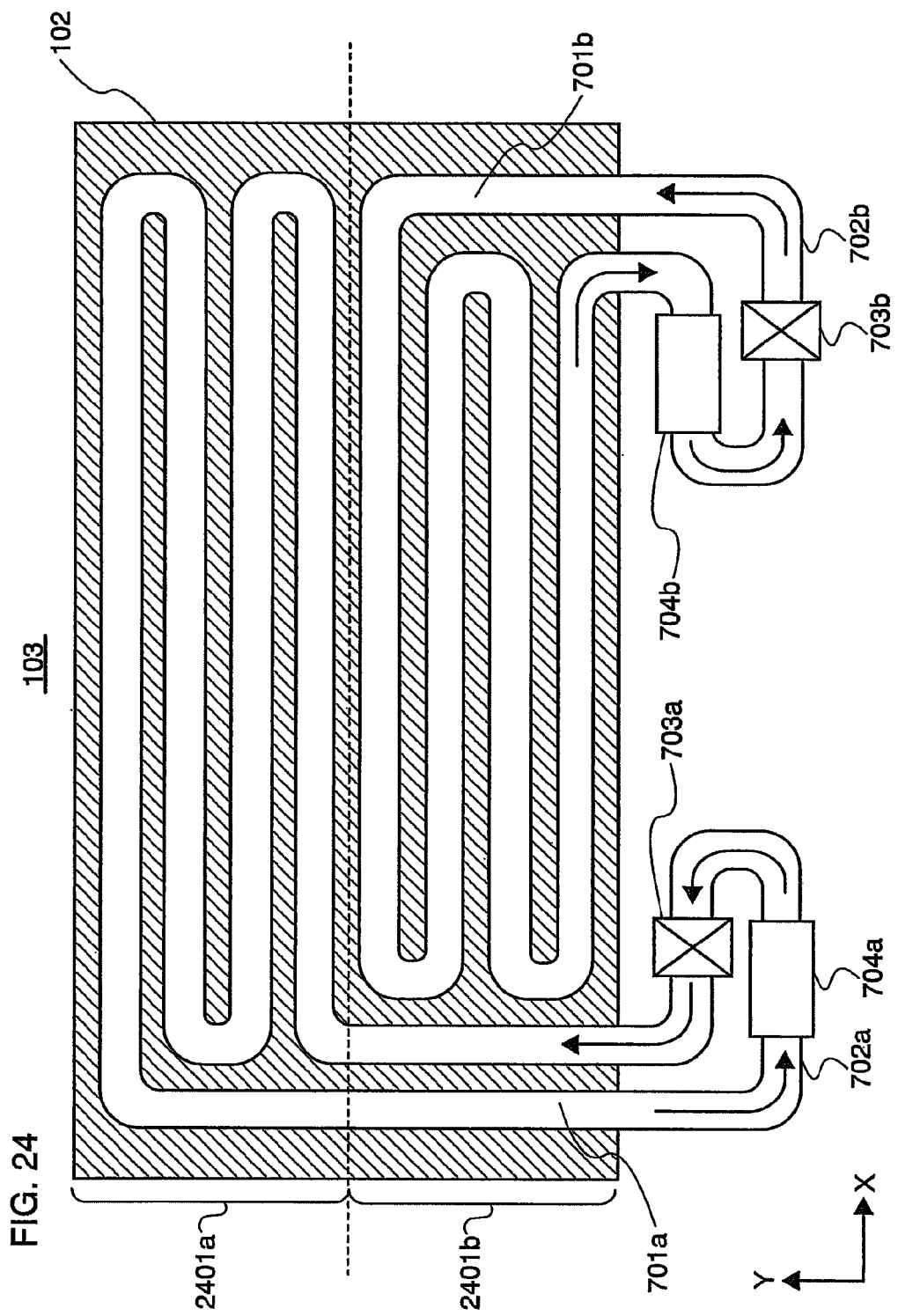
FIG. 24 is a diagram showing a configuration of a cooling device of the invention.

In FIG. 24, the LED backlight 102 is divided into two cooling regions of a first cooling region 2401a and a second cooling region 2401b up and down, and the coolant pipes 702a and 702b, the coolant circulation pumps 703a and 703b, and the coolant tanks 704a and 704b are arranged in the first and second cooling regions 2401a and 2401b. In addition, each of the coolant pipes 702a and 702b are arranged by bending from side to side (on an X-axis side in FIG. 24) many times.

In FIG. 24, by making both of the coolants 701a and 701b flow counterclockwise in the first and second cooling regions 2401a and 2401b, temperature can be decreased gradually from the central portion of the LED backlight where heat easily remains and of which temperature rises most similarly to the cases shown in FIGS. 20 to 23. Accordingly, since the cooling efficiency of the LED backlight can be more improved and further the temperature unevenness of the LED backlight can be more reduced, the display defect such as display unevenness or color unevenness caused by the temperature unevenness of the LED backlight can be reduced.

By providing the coolant circulation pump in each of a plurality of cooling regions and circulating the coolant as in this embodiment mode, the length of the coolant pipe per coolant circulation pump can be made shorter than the case where the LED backlight is cooled without being divided into a plurality of cooling regions, and thus, the coolant can be circulated in a shorter time. In addition, the coolant pipe can be processed easily.

Further, since the length of the coolant pipe per coolant circulation pump can be made shorter, cooling efficiency similar to the case where the LED backlight is cooled without being divided into a plurality of cooling regions can be maintained, even if a coolant circulation pump having lower capability than that of the case where the entire LED backlight is cooled without being divided into a plurality of cooling regions. Accordingly, cost of the coolant circulation pump can be reduced.

Note that although the coolant circulation pump and the coolant tank are arranged in each of a plurality of cooling regions in this embodiment mode, the coolant circulation pump and the coolant tank may be shared in a plurality of cooling regions.

Figure 25:
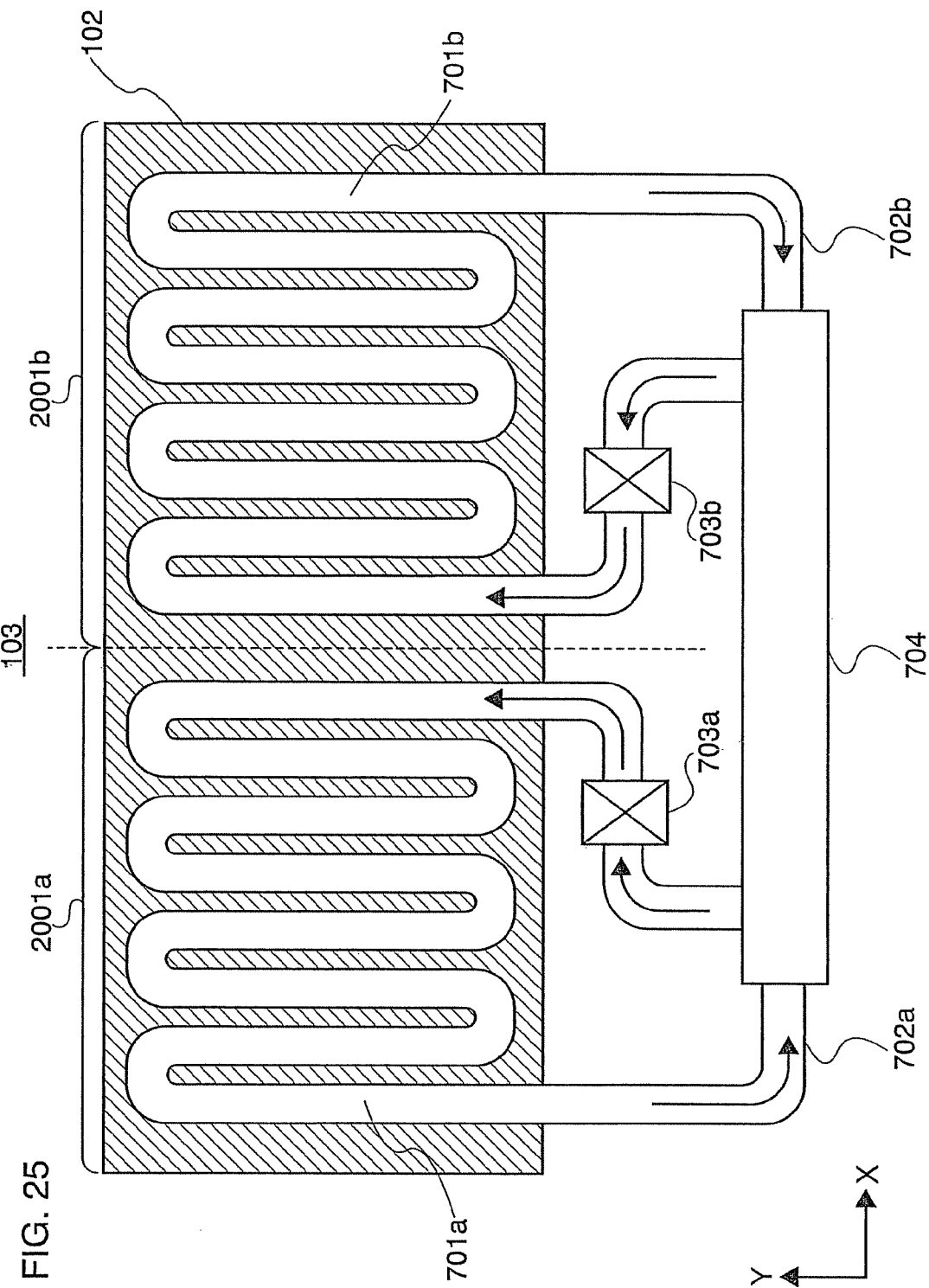
FIG. 25 is a diagram showing a configuration of a cooling device of the invention.

For example, FIG. 25 shows a configurational example of the cooling device 103 in the case where the coolant tank is shared in the first and second cooling regions in the case shown in FIG. 20. In FIG. 25, the coolant which is stored in the coolant tank 704 is circulated in the first and second cooling regions 2001a and 2001b by using the coolant circulation pumps 703a and 703b, and each of the first and second cooling regions 2001a and 2001b is cooled.

Figure 26:
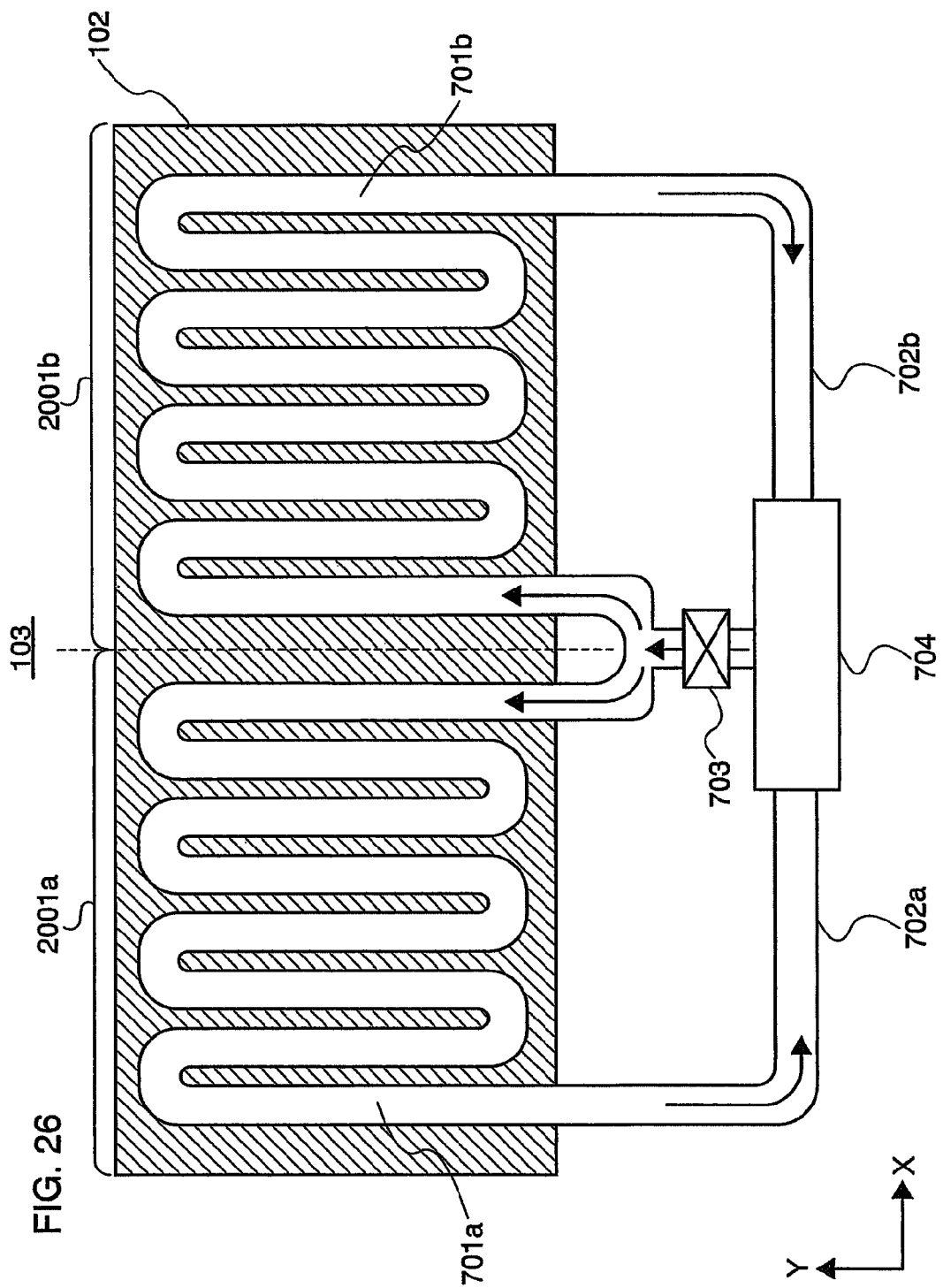
FIG. 26 is a diagram showing a configuration of a cooling device of the invention.

In addition, FIG. 26 shows a configurational example of the cooling device 103 in the case where the coolant circulation pump and the coolant tank are shared in the first and second cooling regions in the case shown in FIG. 20. In FIG. 26, the coolant which is stored in the coolant tank 704 is circulated in the first and second cooling regions 2001a and 2001b by using the coolant circulation pump 703 to cool each of the first and second cooling regions 2001a and 2001b.

By sharing the coolant circulation pump and the coolant tank in a plurality of cooling regions as shown in FIGS. 25 and 26, the number of the coolant circulation pumps and the coolant tanks can be smaller than the case where the coolant circulation pump and the coolant tank are provided in each of a plurality of cooling regions, and thus, cost to a corresponding extent can be reduced.

By dividing the LED backlight into a plurality of cooling regions and leading the cooling of the LED backlight in each cooling region as in this embodiment mode, the LED backlight can be cooled more efficiently and in a shorter time than the case where the LED backlight is cooled without being divided into a plurality of cooling regions. In particular, in the case of cooling a LED backlight which is incorporated in a large liquid crystal display, the time for cooling can be made shorter by dividing the LED backlight into a plurality of cooling regions and cooling the LED backlight in each cooling region. Thus, the cooling efficiency can be remarkably improved and a method of dividing the LED backlight into a plurality of cooling regions and cooling the LED backlight in each cooling region becomes a greatly effective method. Further, since the temperature unevenness of the LED backlight can be more reduced, the display defect such as display unevenness or color unevenness caused by the temperature unevenness of the LED backlight can be reduced.

Note that although the case where the LED backlight is divided into two cooling regions from side to side or up and down and the LED backlight is cooled in each cooling region is shown in this embodiment mode, the number of the divided cooling regions is not limited to two. The cooling region may be divided into three or more. In addition, the division of the cooling region is not limited to the division of side to side or up and down. The cooling region may be divided in a grid or at random.

Note that various contents described in this embodiment mode may be freely combined and implemented. In addition, the contents described in this embodiment mode may be freely combined with the contents described in Embodiment Mode 1 and implemented.

Embodiment Mode 3

In Embodiment Modes 1 and 2, although the cooling device is arranged on the back surface side of the LED backlight to cool the LED backlight, the LED backlight may be cooled by arranging the cooling device on the front surface side of the LED backlight. This embodiment describes the case where the cooling device is arranged on the front surface side of the LED backlight.

First, a configuration of a display device in this embodiment mode is described with reference to FIG. 19.

Figure 19:
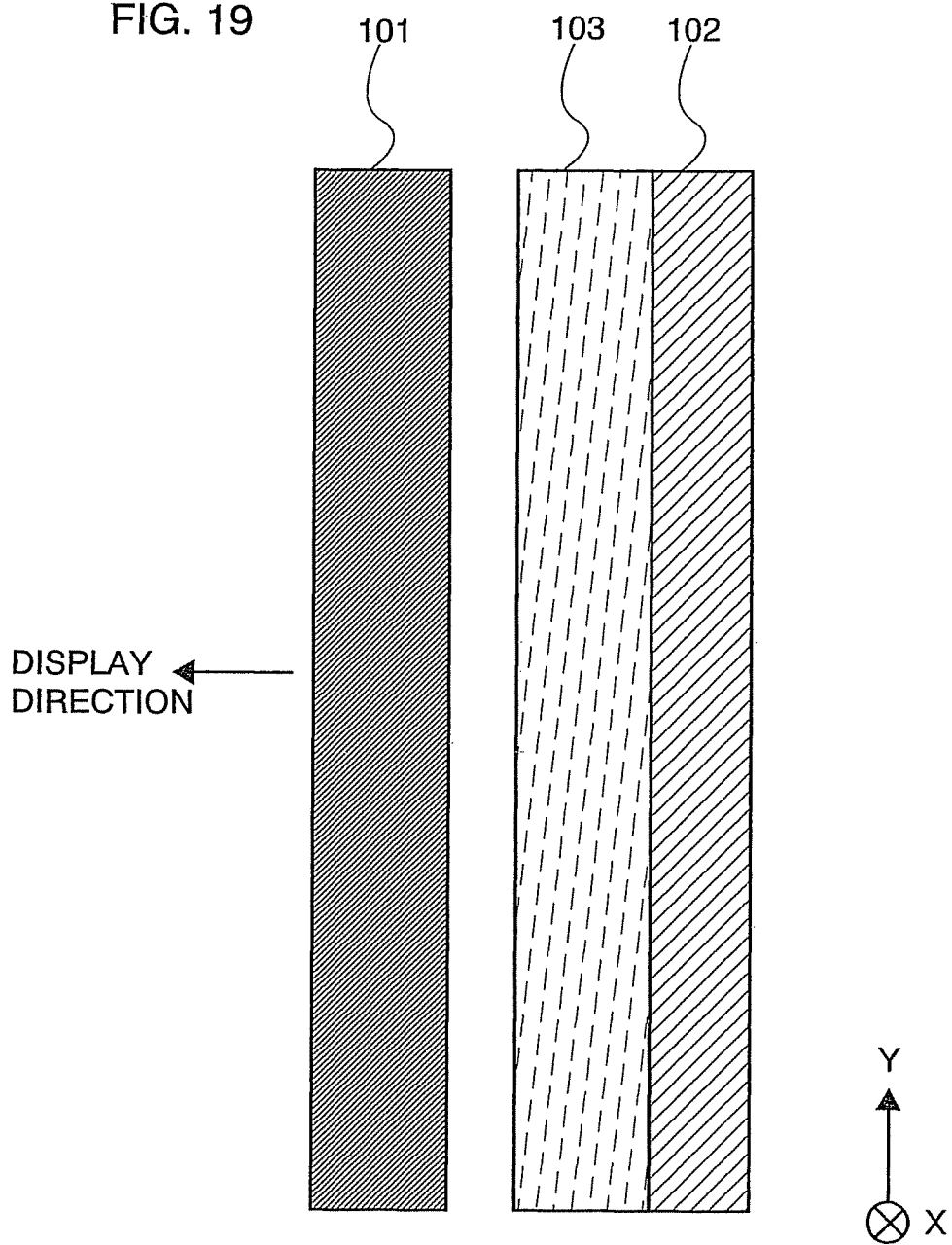
FIG. 19 is a diagram showing a configuration of a cooling device of the invention.

FIG. 19 shows a configurational example of the display device in this embodiment mode. The display device in this embodiment mode includes the liquid crystal panel 101, the LED backlight 102, the cooling device 103, or the like. The cooling device 103 is arranged on a back surface side of the liquid crystal panel 101 and the LED backlight 102 is arranged on a back surface side of the cooling device 103.

Note that the cooling device 103 is arranged so as to be in contact with the LED backlight 102.

Note that the cooling device 103 is arranged on the front surface side of the LED backlight in the display device in this embodiment mode, which is a main difference from the display devices shown in Embodiments Modes 1 and 2. That is, the cooling device 103 is arranged between the liquid crystal panel 101 and the LED backlight 102 and arranged so as to be in contact with the LED backlight 102.

Next, configurational examples of the cooling device in this embodiment mode are described with reference to FIGS. 27 and 28.

Figure 27:
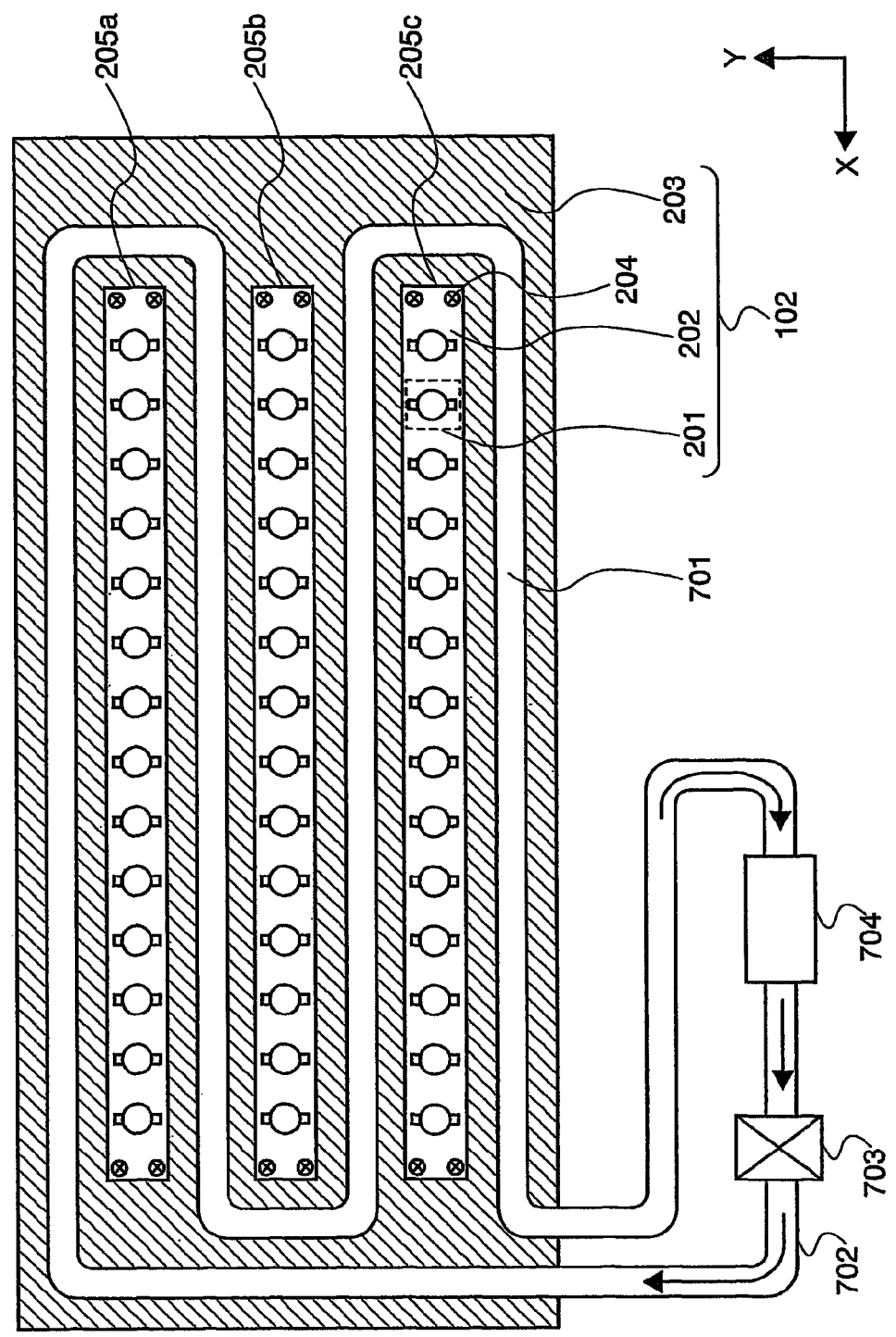
FIG. 27 is a diagram showing a configuration of a cooling device of the invention.

FIG. 27 shows a plan view of the cooling device 103 in this embodiment mode when it is seen from the front surface side of the LED backlight 102. In addition, FIG. 28 shows a plan view of the cooling device shown in FIG. 27 when it is seen from an X-axis side in FIG. 27.

Figure 28:
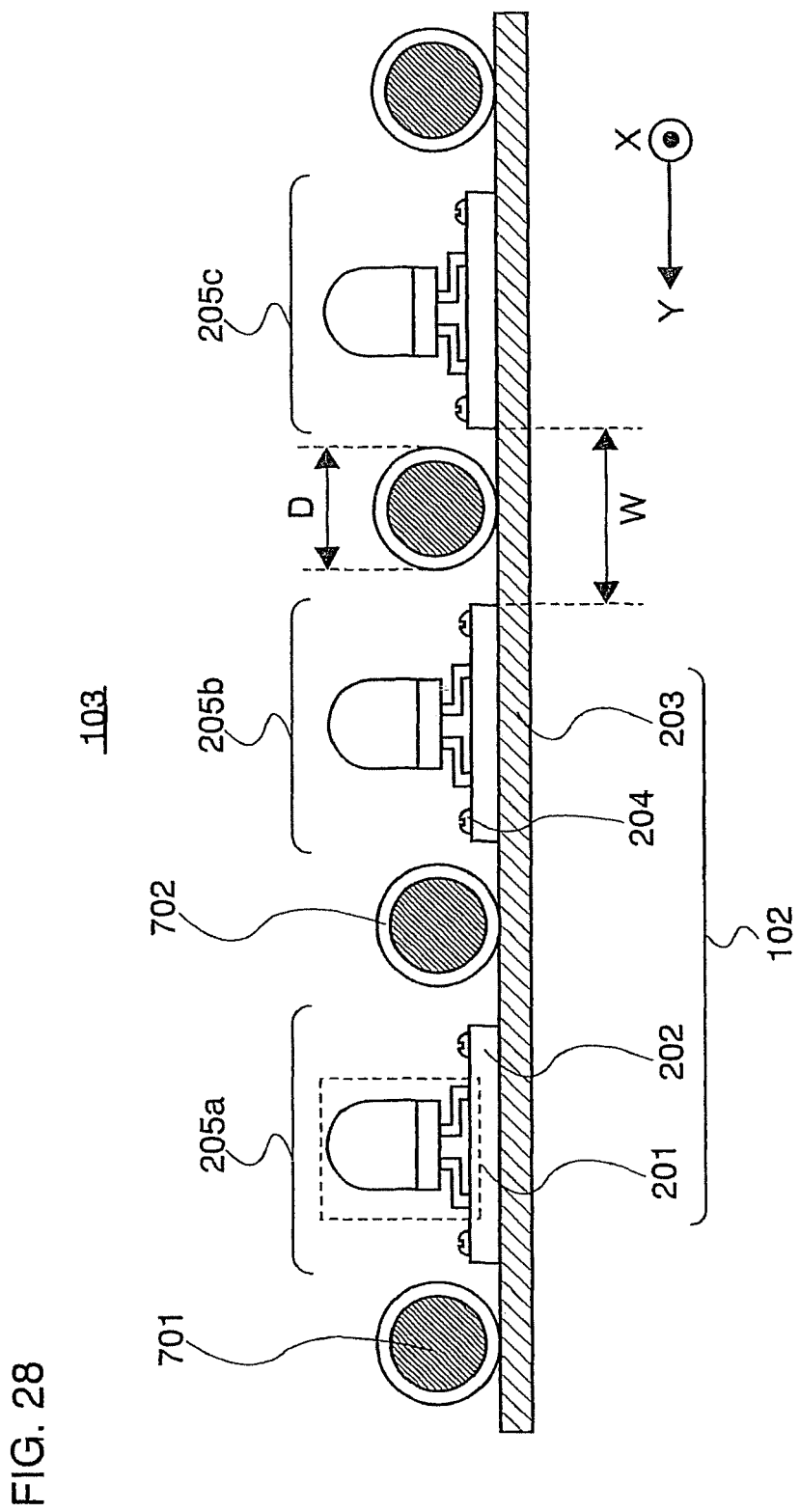
FIG. 28 is a diagram showing a configuration of a cooling device of the invention.

As shown in FIGS. 27 and 28, the cooling device 103 in this embodiment mode is not arranged on the back surface side of the LED backlight but arranged on the front surface side of the LED backlight, and the coolant pipe 702 is arranged over the backboard 203 which is between the adjacent LED arrays 205a to 205c.

Note that as a method of making the LED backlight 102 and the coolant pipe 702 in contact with each other, the LED backlight 102 and the coolant pipe 702 may simply be in contact with each other or the LED backlight 102 and the coolant pipe 702 may be attached together by using an adhesive agent having high thermal conductance, an adhesive agent including a conductive particle, or the like.

Figure 29:
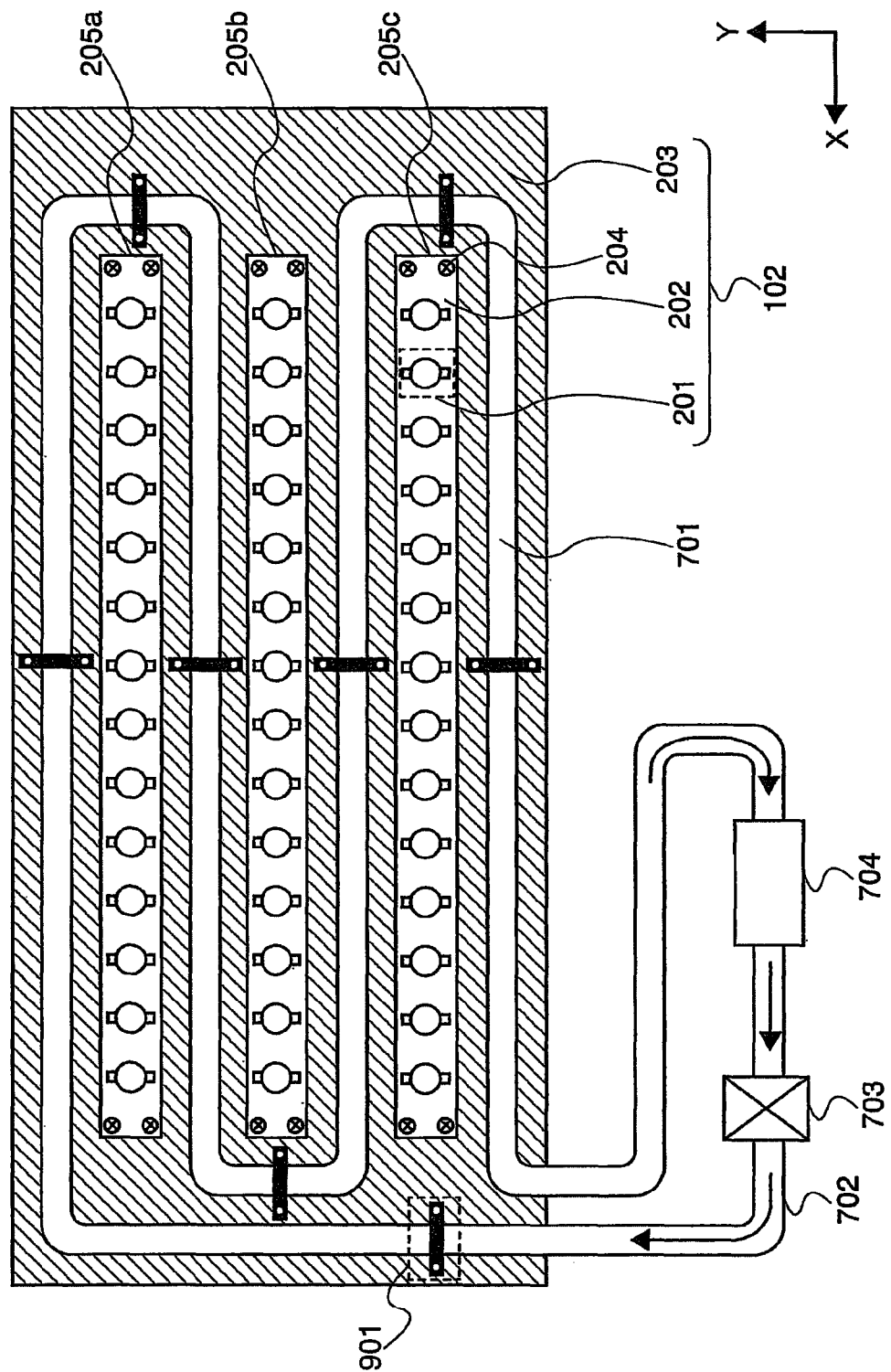
FIG. 29 is a diagram showing a configuration of a cooling device of the invention.

In addition, the coolant pipe 702 may be fixed on the LED backlight 102 by using the fixing device of coolant pipe 901 as shown in FIG. 9A. FIG. 29 shows a configurational example of the cooling device 103 when the coolant pipe is fixed by the fixing device of coolant pipe.

By arranging the coolant pipe 702 over the backboard 203 which is between the adjacent LED arrays 205a to 205c and making the coolant 701 flow, cooling can be conducted in a place which is nearer to the LED 201, so that the time for cooling the entire LED backlight 102 can be made shorter, and thus, cooling efficiency can be more improved. Accordingly, the display defect such as display unevenness or color unevenness caused by the temperature unevenness of the LED backlight can be reduced.

By arranging the coolant pipe 702 over the backboard 203 which is between the adjacent LED arrays 205a to 205c, the thickness of portions where the LED backlight 102 and the coolant pipe 702 are attached to each other can be thinner than the case where the coolant pipe 702 is arranged on the back surface side of the LED backlight 102. Accordingly, the thickness of the display device can be thinned.

Note that when a diameter of the coolant pipe 702 is denoted by D and an interval between the adjacent LED arrays 205a to 205c is denoted by W (refer to FIG. 28), D<W is preferably employed. That is, it is preferable that the coolant pipe 702 and the LED 201 are not in direct contact with each other. This is because when D≥W is employed, light emitted from the LED 201 is shielded by the coolant pipe 702 and enough light does not enter the liquid crystal panel 101, so that color unevenness or decrease in luminance occurs. Therefore, by employing D<W, the light emitted from the LED 201 can be prevented from being shielded by the coolant pipe 702, and thus, the color unevenness or the decrease in the luminance can be reduced.

Figure 30:
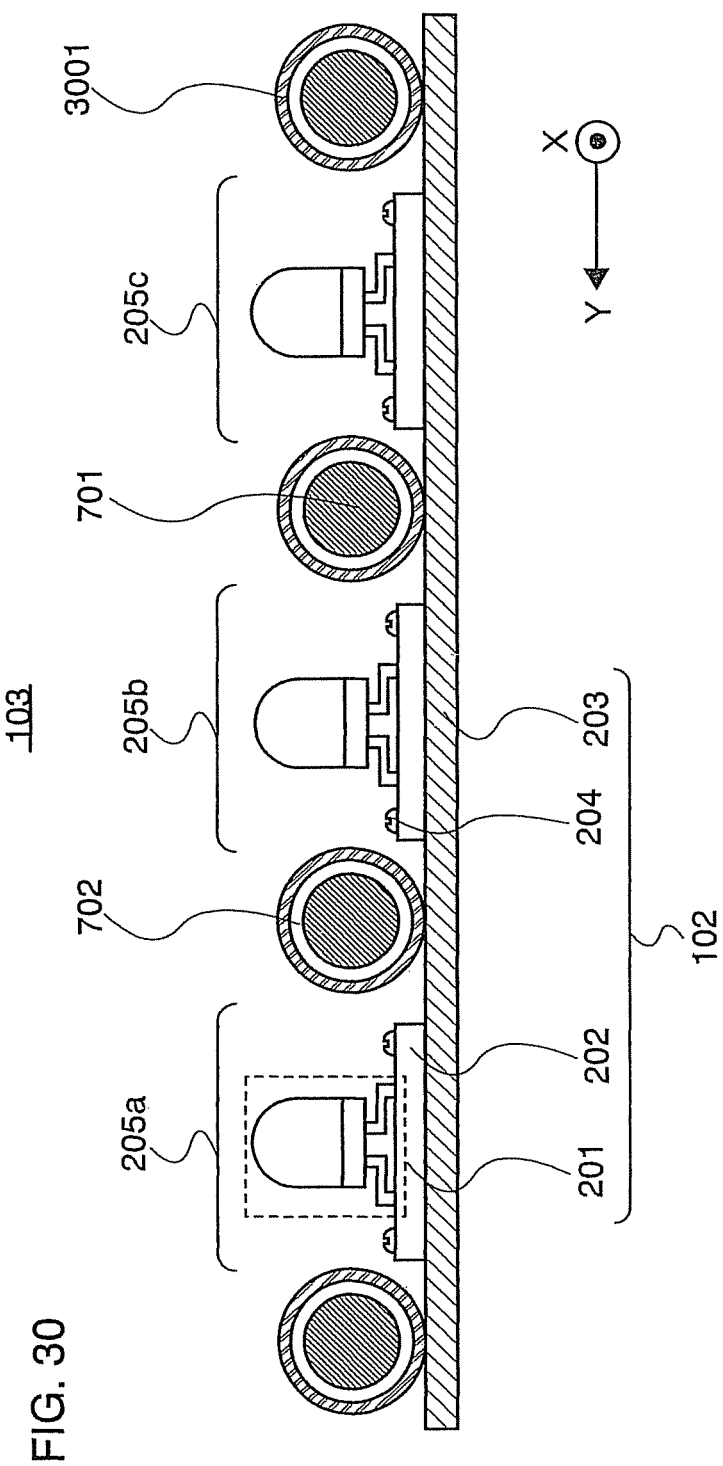
FIG. 30 is a diagram showing a configuration of a cooling device of the invention.

Note that in order to improve the light use efficiency of the LED, a reflecting coating which is made of a material having high reflectivity may be applied to the coolant pipe 702. FIG. 30 shows a configurational example of the cooling, device in this case.

In FIG. 30, by applying a reflecting coating 3001 to the coolant pipe 702, the coolant pipe 702 can be utilized as a substitute for a reflector of the LED 201.

By applying the reflecting coating 3001 to the coolant pipe 702 in this manner, the light use efficiency of the LED can be improved so that much light can enter the liquid crystal panel 101. In addition, since the coolant pipe has a curved surface, the light emitted from the LED is reflected in more directions. Therefore, in the case of arranging three colors of LEDs of R, G, and B alternately, the light of three colors of R, G, and B more easily mix with each other; thereby, uniform white light can enter the liquid crystal panel 101. Accordingly, the color unevenness can be reduced.

Figure 31:
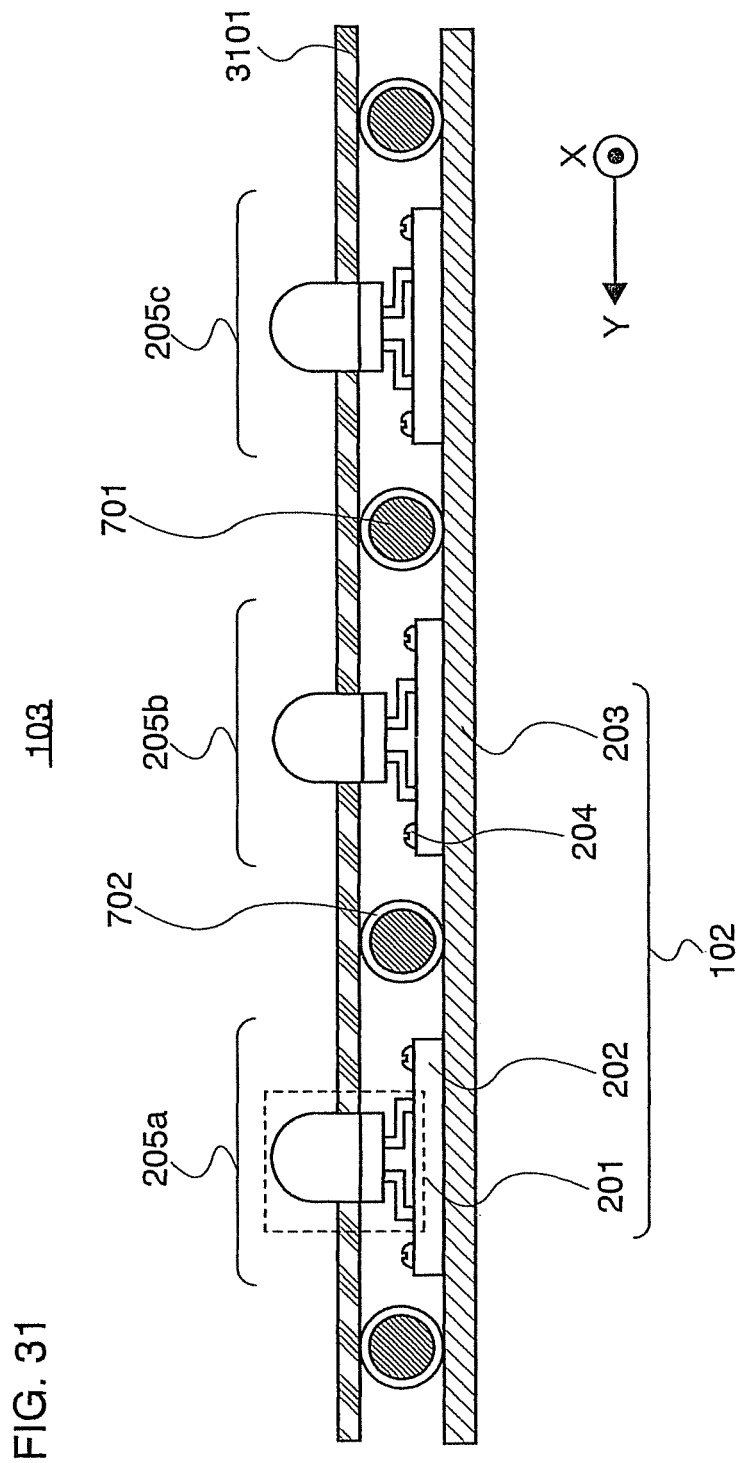
FIG. 31 is a diagram showing a configuration of a cooling device of the invention.

Alternatively, in order to improve the light use efficiency of the LED, a reflecting portion may be arranged in the LED backlight as shown in Embodiment Mode 1 (FIGS. 6A and 6B). In this case, the coolant pipe 702 may be arranged in a region which is sandwiched between the backboard 203 which is between the adjacent LED arrays 205a to 205c and the reflecting portion. FIG. 31 shows a configurational example of the cooling device 103 in this case.

In FIG. 31, the coolant pipe 702 is arranged in a region which is sandwiched between the backboard 203 which is between the adjacent LED arrays 205a to 205c and a reflecting portion 3101.

Note that as a method of making the coolant pipe 702 and the reflecting portion 3101 in contact with each other, the coolant pipe 702 and the reflecting portion 3101 may be directly in contact with each other, or the coolant pipe 702 and the reflecting portion 3101 may be attached together by using an adhesive agent having high thermal conductance, an adhesive agent including a conductive particle, or the like.

By additionally providing the reflecting portion 3101 in this manner, the light use efficiency of the LED can be improved, and thus, much light can enter the liquid crystal panel 101. In particular, in the case where the reflecting portion 3101 is formed of metal having high thermal conductance (e.g., one including copper, iron, aluminum, or the like, or stainless steel), the reflecting portion 3101 is cooled by the coolant 701 so that the cooling efficiency of the LED backlight 102 can be more improved.

Figure 32:
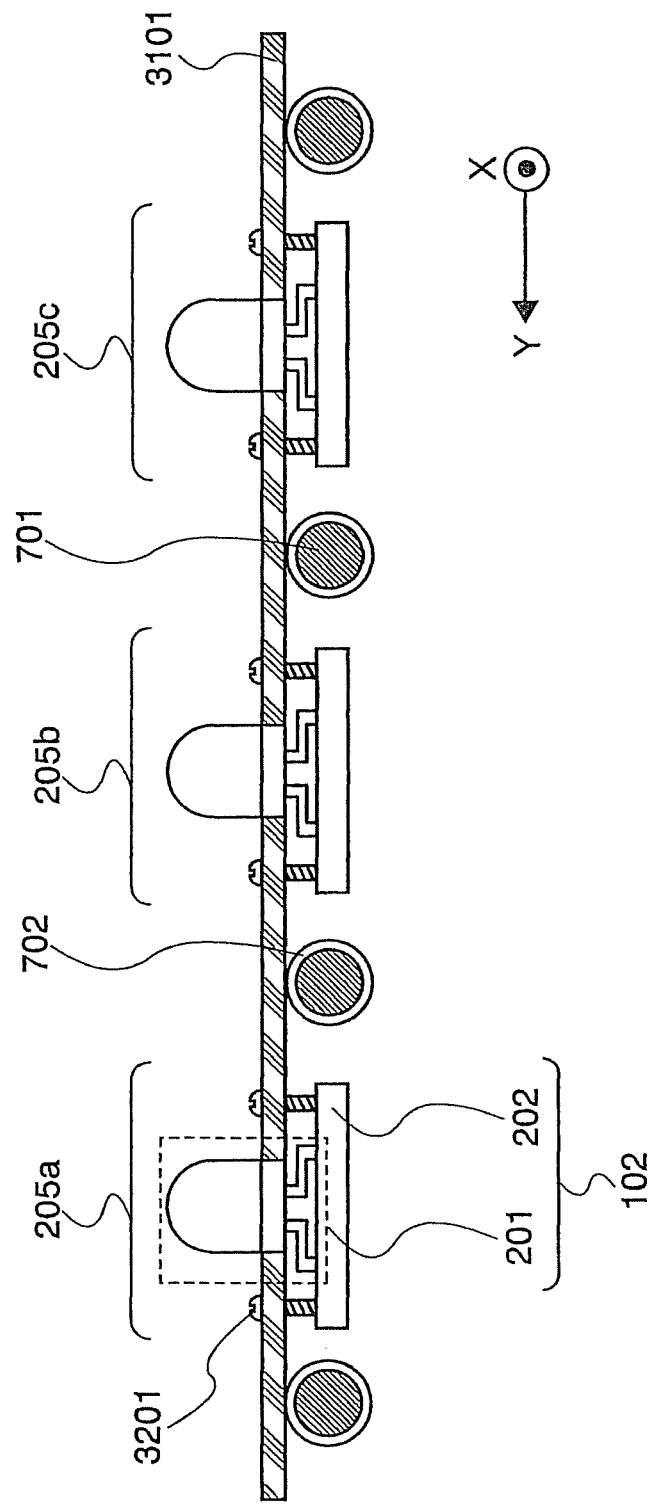
FIG. 32 is a diagram showing a configuration of a cooling device of the invention.

It is to be noted that in FIG. 31, the LED arrays 205a to 205c are attached to the backboard 203 by using the screw 204; however, the LED arrays 205a to 205c may be attached to the reflecting portion 3101 after removing the backboard 203 when the reflecting portion 3101 is additionally provided. FIG. 32 shows a configurational example of the cooling device 103 in this case.

In FIG. 32, the LED arrays 205a to 205c is attached to the reflecting portion 3101 by using a screw 3201. In addition, the coolant pipe 702 is arranged between the adjacent LED arrays 205a to 205c so as to be in contact with the reflecting portion 3101.

By attaching the LED arrays 205a to 205c to the reflecting portion 3101 in this manner, the backboard 203 can be removed so that the number of components can be reduced, and thus, cost can be reduced.

Note that the reflecting portion 3101 may be an optical functioning sheet having a function of reflecting light, a material which includes copper, iron, aluminum, or the like, or a metal plate of such as stainless steel, for example. Alternatively, a white and plastic or acrylic plate may be employed.

Note that each surface of the coolant pipe 702, the backboard 203, and the reflecting portion 3101 may have unevenness. This helps the light emitted from the LED 201 be reflected diffusely on the unevenness of each surface of the coolant pipe 702, the backboard 203, and the reflecting portion 3101, so that the light can also be diffused. Accordingly, the light use efficiency of the LED 201 can be improved.

Figure 33:
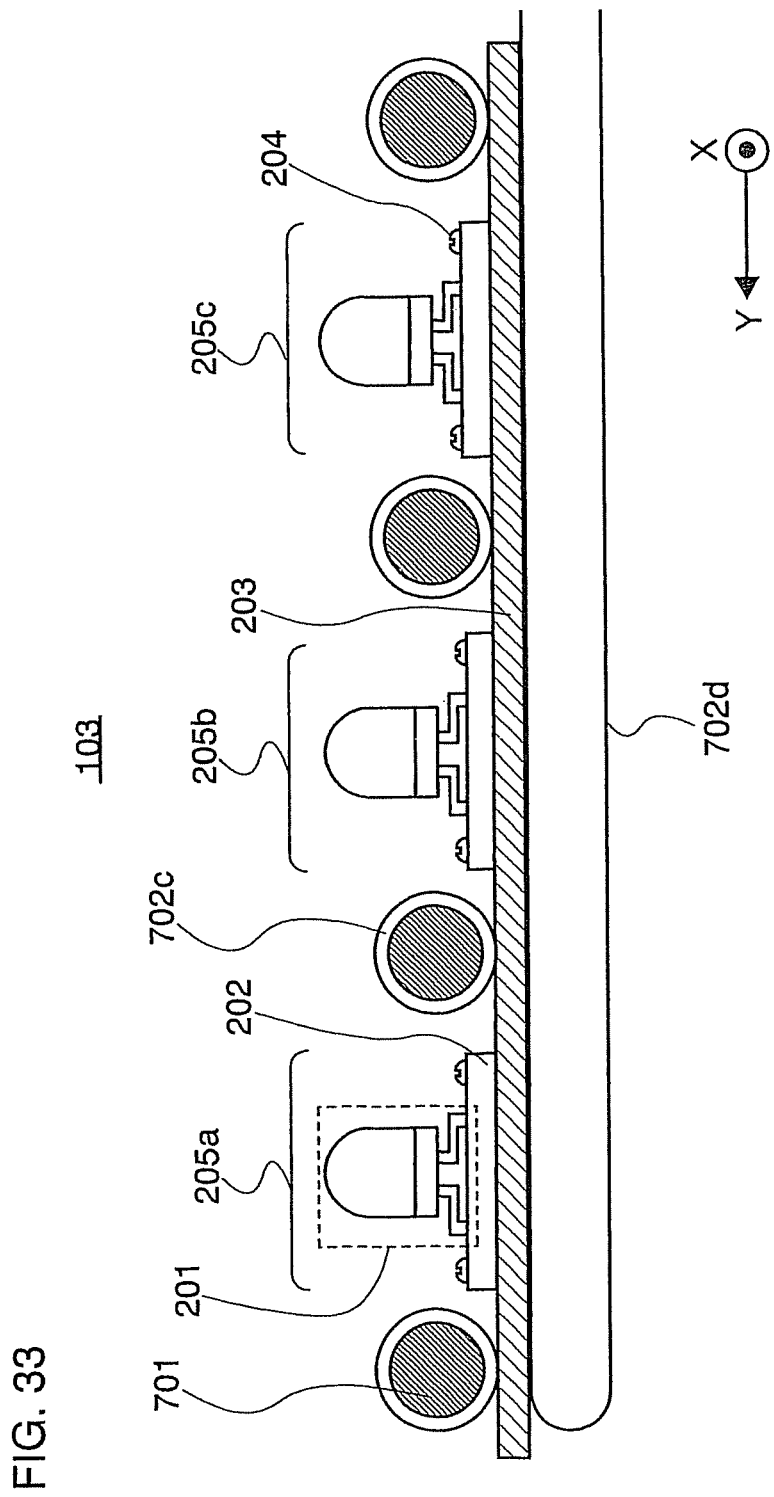
FIG. 33 is a diagram showing a configuration of a cooling device of the invention.

Note that the coolant pipe may be arranged on both of the front surface side and the back surface side of the LED backlight. FIG. 33 shows a configurational example of the LED backlight and the cooling device in this case.

FIG. 33 shows a cross-sectional view of the LED backlight and the cooling device in the case of arranging the coolant pipe on both of the front surface side and the back surface side of the LED backlight. On the front surface side of the LED backlight 102, a coolant pipe 702c is arranged in the backboard 203 which is between the adjacent LED arrays 205a to 205c as described in this embodiment mode. In addition, on the back surface side of the LED backlight 102, a coolant pipe 702d is arranged so as to be in contact with the backboard 203 as shown in Embodiment Mode 1. In FIG. 33, an example where the coolant pipe 702d which is arranged on the back surface side of the LED backlight 102 is arranged by bending up and down (on a Y-axis side in FIG. 33) many times as shown in FIG. 7 is shown.

By arranging the coolant pipe on both of the front surface side and the back surface side of the LED backlight, the LED backlight can be cooled from both of the front surface side and the back surface side, and thus, the cooling efficiency can be more improved.

Note that an arrangement of the coolant pipe 702d which is arranged on the back surface side of the LED backlight 102 is not limited to bending up and down many times. The coolant pipe 702d which is arranged on the back surface side of the LED backlight 102 may be arranged by bending from side to side (on an X-axis side in FIG. 33) many times, or may be arranged in spiral. The contents which described in Embodiment Mode 1 may be applied.

Note that with respect to the coolant circulation pump and the coolant tank, different coolant circulation pumps and coolant tanks may be provided on the front surface side and the back surface side of the LED backlight, or common coolant circulation pump and coolant tank may be provided on the front surface side and the back surface side of the LED backlight.

Figure 34:
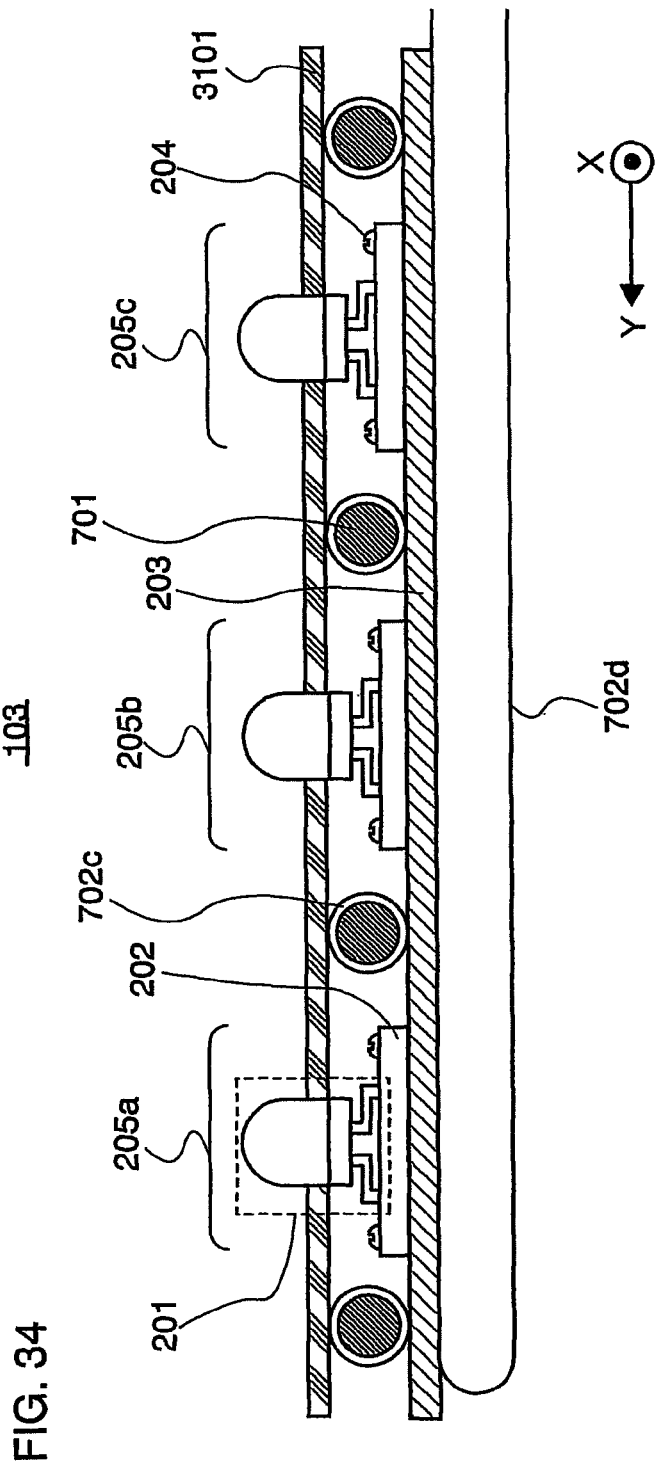
FIG. 34 is a diagram showing a configuration of a cooling device of the invention.

Note that in order to improve the light use efficiency of the LED, a reflecting portion may be arranged in the LED backlight as shown in FIG. 31. FIG. 34 shows a configurational example of the LED backlight and the cooling device in this case.

In FIG. 34, the coolant pipe 702c is arranged in a region which is sandwiched between the backboard 203 which is between the adjacent LED arrays 205a to 205c and a reflecting portion 3101.

By additionally providing the reflecting portion 3101 in this manner, the light use efficiency of the LED can be improved, and thus, much light can enter the liquid crystal panel 101. In particular, in the case where the reflecting portion 3101 is formed of metal having high thermal conductance (e.g., one including copper, iron, aluminum, or the like, or stainless steel), the reflecting portion 3101 is cooled by the coolant 701 so that the cooling efficiency of the LED backlight 102 can be more improved.

Note that various contents described in this embodiment mode may be freely combined and implemented. In addition, the contents described in this embodiment mode may be freely combined with the contents described in Embodiment Modes 1 and 2 and implemented.

Embodiment Mode 4

This embodiment describes the case where a coolant pipe which is formed from a material having conductivity is utilized as an electrode for applying a voltage to the LED forming the LED backlight.

A configuration of a display device in this embodiment mode is described with reference to FIG. 35, and FIGS. 36A and 36B.

Figure 35:
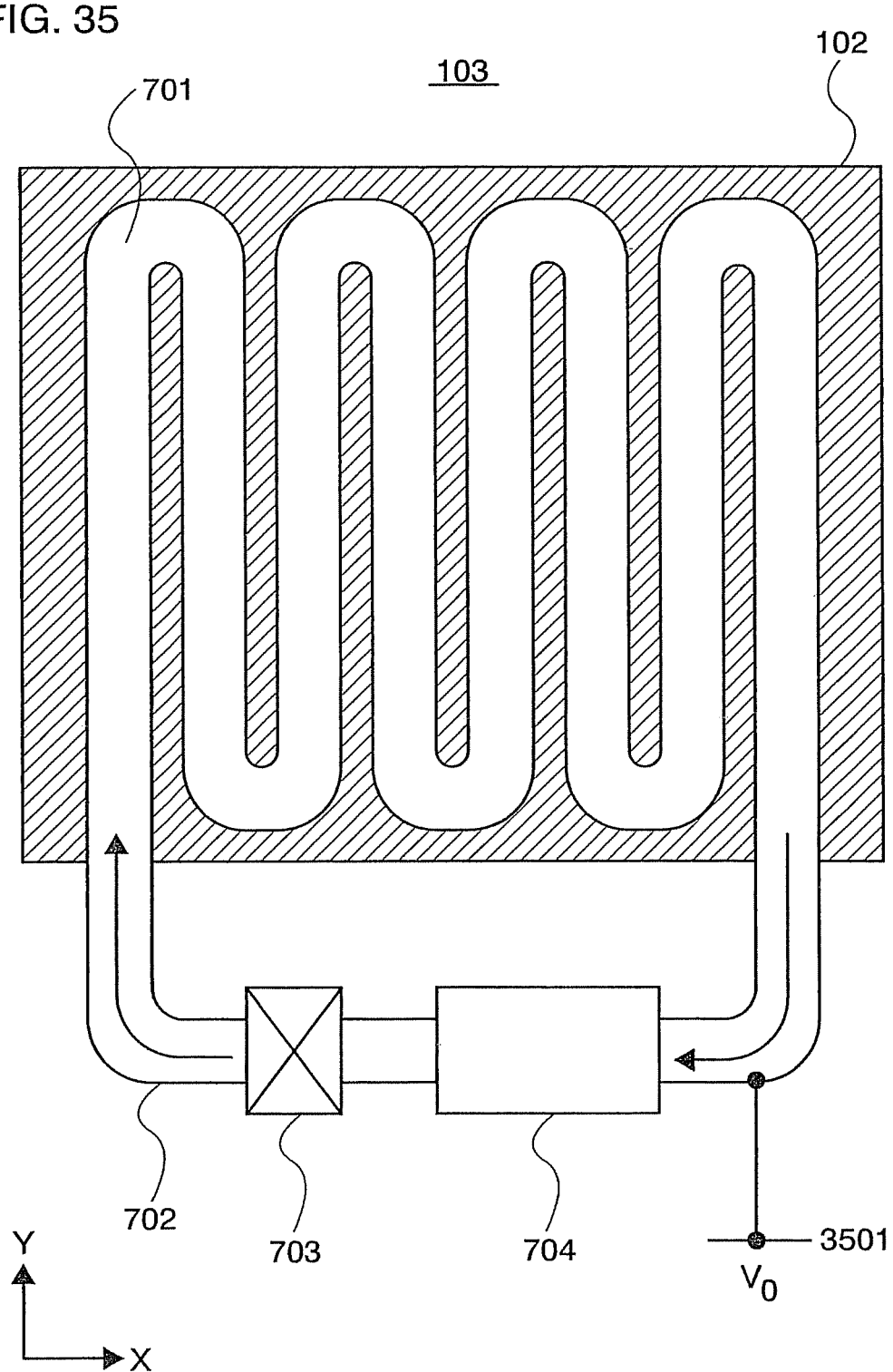
FIG. 35 is a diagram showing a configuration of a cooling device of the invention.

FIG. 35 shows a plan view of the cooling device 103 in this embodiment mode when it is seen from the back surface side of the LED backlight 102. Unlike the cooling device shown in FIG. 7, the cooling device 103 shown in FIG. 35 has a configuration where the coolant pipe 702 and a power supply line 3501 are connected.

In this embodiment mode, the coolant pipe 702 is formed from a material having conductivity. Note that a material having high conductivity is preferably employed as a material of the coolant pipe 702. For example, a material which includes copper, iron, aluminum, or the like, or metal such as stainless steel is preferably employed. In particular, since copper has high thermal conductance and corrosion resistance, copper is preferably employed as the material of the coolant pipe 702.

FIG. 36A shows a plan view of the cooling device 103 shown in FIG. 35 when it is seen from an X-axis side in FIG. 35. In addition, FIG. 36B shows a plan view of the cooling device 103 shown in FIG. 35 when it is seen from a Y-axis side in FIG. 35.

As shown in FIGS. 36A and 36B, one of terminals 206a and 206b of the LED 201 (the terminal 206b in FIGS. 36A and 36B) is connected to the coolant pipe 702. In addition, in the wiring board 202 and the backboard 203, an opening 3601 for leading the terminal 206b of the LED 201 is provided in advance.

Note that as a method of connecting the terminal 206b of the LED 201 and the coolant pipe 702, the terminal 206b of the LED 201 and, the coolant pipe 702 may be connected by using solder, or an anisotropic conductive film (Anisotropic Conductive Film: ACF).

Then, by connecting the coolant pipe 702 and the power supply line 3501 and applying a voltage $V_0$ which is in the power supply line 3501, the voltage $V_0$ can be applied to the terminal 206b of the LED 201.

The coolant pipe 702 can be utilized as an electrode for applying a voltage to the LED 201 in this manner.

By utilizing the coolant pipe 702 as the electrode for applying voltage to the LED 201 in this manner, a common voltage $V_0$ can easily be applied to all of the LEDs 201 forming the LED backlight 102. In addition, a wire for applying the common voltage $V_0$ to the all of the LEDs 201 forming the LED backlight 102 is not needed to be additionally arranged. Further, since a uniform voltage can be applied to the all of the LEDs 201 forming the LED backlight 102, luminance unevenness between the LEDs 201 can be reduced.

In addition, by utilizing the coolant pipe 702 as the electrode for applying voltage to the LED 201, the area of the electrode for applying the voltage to the LED 201 is increased, and thus, resistance of the electrode for applying the voltage to the LED 201 can be decreased. Accordingly, heat generated by current flowing to the coolant pipe 702 (Joule heat) can be suppressed and the heat generated from the LED 201 can also be suppressed. Further, power consumption of the LED backlight 102 can be reduced.

In addition, by supplying the coolant 701 to the coolant pipe 702, the time for cooling the LED backlight 102 can be made shorter, and thus, the cooling efficiency of the LED backlight 102 can be more improved.

Further, since the coolant 701 flows through the coolant pipe 702, the temperature of the coolant pipe is lowered. Thus, the resistance of the coolant pipe 702 which is formed from the material having conductivity can be decreased. Accordingly, the heat generated by making current flow to the coolant pipe 702 (Joule heat) can be suppressed and the heat generated from the LED 201 can also be suppressed. Further, the power consumption of the LED backlight 102 can be reduced.

In addition, since the resistance of the coolant pipe 702 which is formed from the material having conductivity can be decreased, voltage drop caused by making current flow to the coolant pipe 702 can be suppressed. Accordingly, since variation in voltages which are applied to the LED 201 can be suppressed, the luminance unevenness of the LEDs 201 can also be reduced.

Note that the voltage $V_0$ which is applied to the coolant pipe 702 may be a voltage which is applied on a cathode side of the LED, or may be a voltage which is applied to an anode side of the LED. When three colors of LEDs of R, G, and B are arranged as the LEDs 201, a voltage between the anode and the cathode which is applied to the LED is different between the colors of R, G, and B. Then, when the voltage $V_0$ which is applied to the coolant pipe 702 is the voltage which is applied on the cathode side of the LED, a common voltage can be applied on the cathode sides in the all of the LEDs. Note that the voltage which is applied to the anode side of the LED is different in each of R, G, and B. On the other hand, when the voltage $V_0$ which is applied to the coolant pipe 702 is the voltage which is applied to the anode side of the LED, a common voltage can be applied on the anode sides in the all of the LEDs. Note that the voltage which is applied to the cathode side of the LED is different in each of R, G, and B.

In addition, by setting the voltage $V_0$ which is applied to the coolant pipe 702 to ground voltage, electrostatic shielding of the LED backlight 102 can be conducted. That is, the coolant pipe 702 can be utilized as a shield for electrostatic shielding. Thus, an influence of an electromagnetic wave or the like on the LED backlight 102 is eliminated, so that a malfunction or the like of the LED backlight 102 can be prevented. Further, an influence of noise on the liquid crystal panel 101 can be eliminated.

It is to be noted that as the power supply line 3501, a wire which is arranged in the liquid crystal panel 101 itself may be utilized, or a wire arranged in a driver circuit board where a power supply or a controller which is necessary for driving the liquid crystal panel 101, a driver circuit for driving the LED backlight 102, or the like is arranged may be utilized. Alternatively, a ground line of the display device may be utilized.

It is to be noted that although the terminal 206b of the LED 201 is directly connected to the coolant pipe 702 in FIGS. 36A and 36B, the method of connecting the terminal 206b of the LED 201 and the coolant pipe 702 is not limited to this. For example, the terminal 206b of the LED 201 may be connected to the coolant pipe 702 through a different wire. FIGS. 37A and 37B show a configurational example of the LED backlight 102 and the cooling device 103 in this case.

FIG. 37A shows a plan view of the cooling device 103 shown in FIG. 35 when it is seen from an X-axis side in FIG. 35. In addition, FIG. 37B shows a plan view of the cooling device 103 shown in FIG. 35 when it is seen from a Y-axis side in FIG. 35.

In the configurational example shown in FIGS. 37A and 37B, a common wire 3701 for connecting the terminal 206b of the LED 201 to the wiring board 202 for forming the LED arrays 205a to 205c is provided. Then, the terminal 206b of the LED 201 which is arranged over the LED arrays 205a to 205c is connected to the common wire 3701, and further, the common wire 3701 is connected to the coolant pipe 702. In addition, in the wiring board 202 and the backboard 203, an opening 3702 for leading the common wire 3701 is provided in advance.

The terminal 206b of the LED 201 and the coolant pipe 702 are connected through the common wire 3701 in this manner.

Note that although the common wire 3701 is connected to the coolant pipe 702 by leading the wiring board 202 and the backboard 203 in FIGS. 37A and 37B, the invention is not limited to this. The common wire 3701 may be connected to the coolant pipe 702 without leading the wiring board 202 and the backboard 203. FIGS. 38A and 38B show a configurational example of the LED backlight 102 and the cooling device 103 in this case.

In FIGS. 38A and 38B, the common wire 3701 and the coolant pipe 702 are connected by using an external wire 3801. Thus, the opening 3702 for leading the common wire 3701 is not needed to be provided in the wiring board 202 and the backboard 203, so that a step of processing the wiring board 202 and the backboard 203 can be omitted.

By connecting terminal 206b of the LED 201 and the coolant pipe 702 by the common wire 3701 in this manner, the opening 3601 for leading the terminal 206b of the LED 201 is not needed to be provided in the wiring board 202 and the backboard 203, so that the step of processing the wiring board 202 and the backboard 203 can be omitted. In addition, the terminal 206b of the LED 201 is only necessary to be connected to the common wire 3701 which is over the wiring board 202, so that an arrangement and connection of the terminal 206b of the LED 201 can be easily conducted.

Further, since connection of the common wire 3701 and the coolant pipe 702 can be easily conducted no matter how the coolant pipe 702 is arranged, connection of the terminal 206b of the LED 201 and the coolant pipe 702 can be conducted more easily.

Note that the arrangement of the coolant pipe 702, the flow direction of the coolant 701, and the like are not limited to the contents described in FIG. 35. The contents described in Embodiment Mode 1 may be applied.

Figure 39:
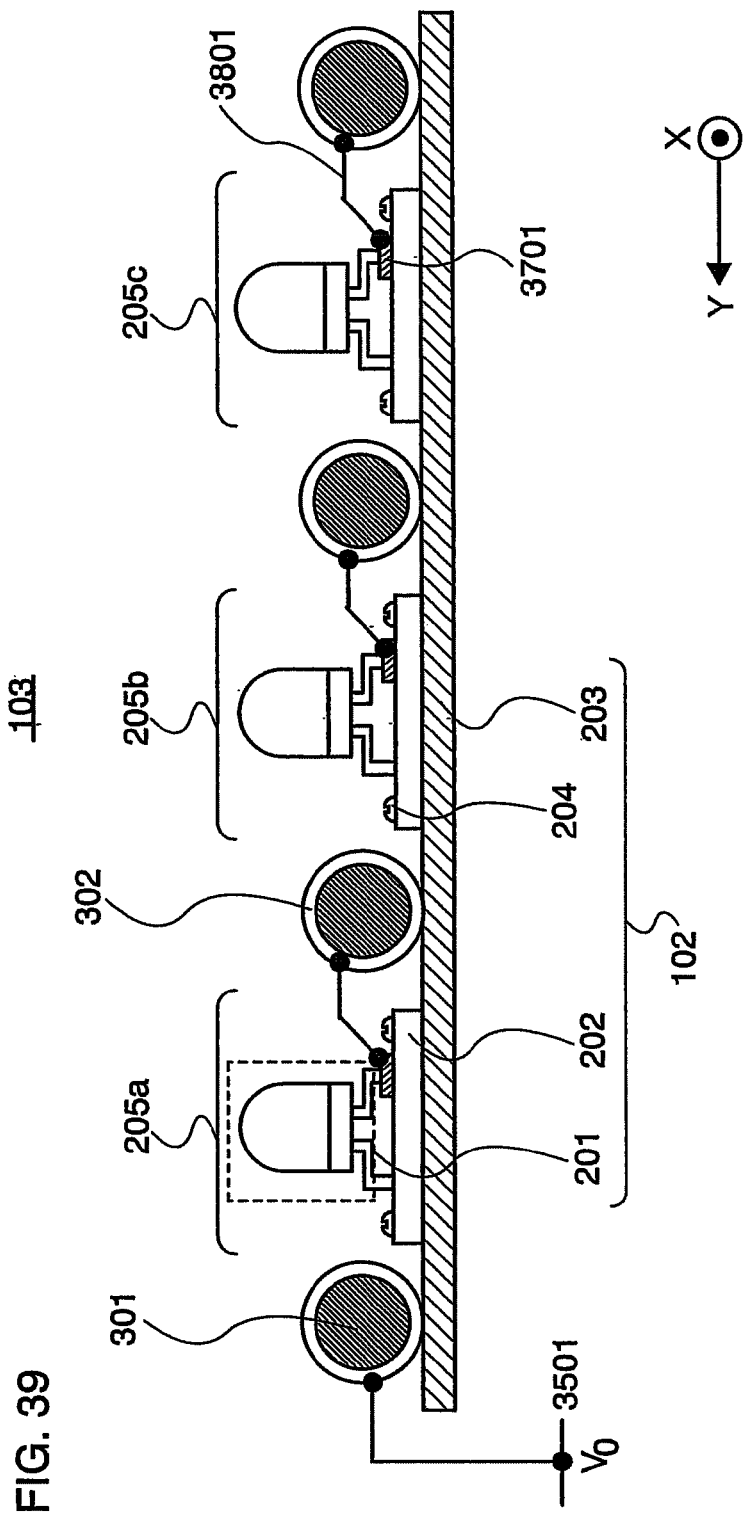
FIG. 39 is a diagram showing a configuration of a cooling device of the invention.

It is to be noted arrangement of the coolant pipe which is formed from the material having conductivity is on the back surface side of the LED backlight is described in this embodiment mode; however, the coolant pipe which is formed from the material having conductivity may be arranged on the front surface side of the LED backlight. FIG. 39 shows a configurational example of the LED backlight and the cooling device in this case.

FIG. 39 shows a cross-sectional view of the LED backlight and the cooling device in the case where the coolant pipe which is formed from the material having conductivity is arranged on the front surface side of the LED backlight. The coolant pipe 702 is arranged in the backboard 203 which is between the adjacent LED arrays 205a to 205c as described in Embodiment Mode 3. In addition, the coolant pipe 702 is connected to the power supply line 3501 and the voltage $V_0$ of the power supply line 3501 is applied.

In the configurational example shown in FIG. 39, the common wire 3701 for connecting the terminal 206b of the LED 201 to the wiring board 202 forming the LED arrays 205a to 205c is provided. Then, the terminal 206b of the LED 201 which is arranged over the LED arrays 205a to 205c is connected to the common wire 3701, and further, the common wire 3701 is connected to the coolant pipe 702 by using the external wire 3801.

By employing the aforementioned configurations, the coolant pipe 702 can be utilized as the electrode for applying voltage to the LED 201.

In addition, a method of connecting the LED 201 and the coolant pipe 702 is not limited to the method shown in FIG. 39; however, the LED 201 and the coolant 702 can be easily connected when the common wire 3701 and the external wire 3801 are used as shown in FIG. 39.

Figure 40:
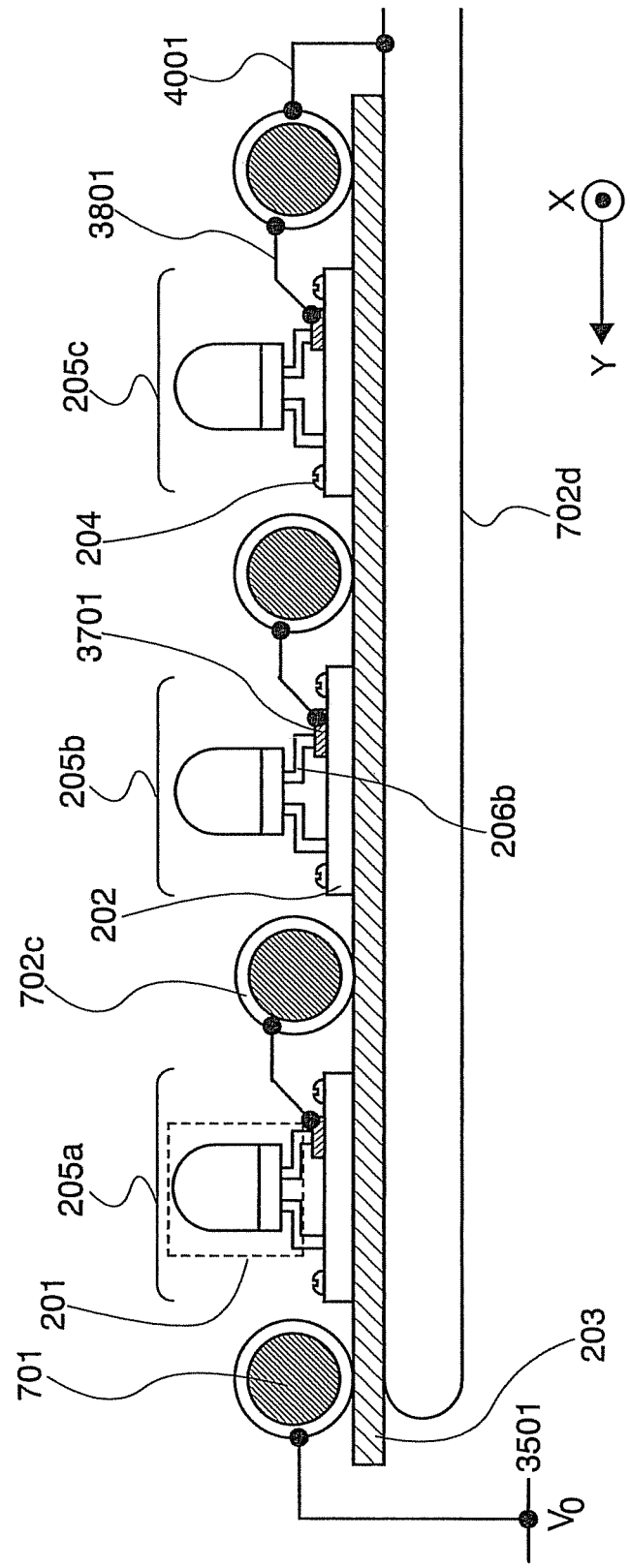
FIG. 40 is a diagram showing a configuration of a cooling device of the invention.

Further, the coolant pipe which is formed from the material having conductivity may be arranged on both of the front surface side and the back surface side of the LED backlight. FIG. 40 shows a configurational example of the LED backlight and the cooling device in this case.

FIG. 40 shows a cross-sectional view of the LED backlight and the cooling device in the case where the coolant pipe which is formed from the material having conductivity is arranged on both of the front surface side and the back surface side of the LED backlight. As shown in FIG. 33, the coolant pipe 702c which is arranged on the front surface side of the LED backlight is arranged over the backboard 203 which is between the adjacent LED arrays 205a to 205c. The coolant pipe 702d which is arranged on the back surface side of the LED backlight is arranged so as to be in contact with the backboard 203 as shown in Embodiment Mode 1. In FIG. 40, an example where the coolant pipe 702d which is arranged on the back surface side of the LED backlight is arranged by bending up and down (on a Y-axis side in FIG. 40) many times as shown in FIG. 7 is shown.

The coolant pipe 702c is connected to the power supply line 3501 and the voltage $V_0$ of the power supply line 3501 is applied to the coolant pipe 702c.

In the configurational example shown in FIG. 40, the common wire 3701 for connecting the terminal 206b of the LED 201 is provided over the wiring board 202 for forming the LED arrays 205a to 205c. Then, the terminal 206b of the LED 201 which is arranged over the LED arrays 205a to 205c is connected to the common wire 3701, and further, the common wire 3701 is connected to the coolant pipe 702c by using the external wire 3801.

In addition, the coolant pipe 702c which is arranged on the front surface side of the LED backlight and the coolant pipe 702d which is arranged on the back surface side of the LED backlight are connected by using a coolant pipe-connecting wire 4001.

By employing the aforementioned configurations, the coolant pipe 702 can be utilized as the electrode for applying voltage to the LED 201.

Note that a method of connecting the LED 201 and the coolant pipes 702c and 702d is not limited to the method shown in FIG. 40; however, the LED 201 and the coolant pipes 702c and 702d can be easily connected when the common wire 3701, the external wire 3801, the coolant pipe-connecting wire 4001, or the like are employed as shown in FIG. 40.

Note that the coolant pipe 702d which is arranged on the back surface side of the LED backlight and the power supply line 3501 may be connected.

It is to be noted that in FIG. 40, the coolant pipe 702c which is arranged on the front surface side of the LED backlight and the coolant pipe 702d which is arranged on the back surface side of the LED backlight are connected by using the coolant pipe-connecting wire 4001; however, the coolant pipe 702c and the coolant pipe 702d are not required to be connected.

For example, one of coolant pipe 702c and the coolant pipe 702d and the power supply line 3501 are connected, and the coolant pipe connected to the power supply line 3501 and the terminal 206b of the LED 201 are connected by using the common wire 3701, and thus, the coolant pipe connected to the power supply line 3501 can also be utilized as the electrode for applying voltage to the LED 201. In addition, the coolant pipe which is not connected to the power supply line 3501 can be utilized to cool the LED backlight.

By employing the coolant pipe which is formed from the material having conductivity as this embodiment mode, the coolant pipe can be utilized as the electrode for applying voltage to the LED, and thus, the heat generated from the LED can be suppressed and the power consumption of the LED backlight can be reduced. In addition, the coolant pipe can be utilized as the shield for electrostatic shielding of the LED backlight and the influence of the electromagnetic wave or the like on the LED backlight is removed, so that the malfunction or the like of the LED backlight can be prevented. Further, since a particular device or a wire for realizing each of these advantageous effects is not needed to be additionally provided, the number of the components can be reduced.

Note that various contents described in this embodiment mode may be freely combined and implemented. In addition, the contents described in this embodiment mode may be freely combined with the contents described in Embodiment Modes 1 to 3 and implemented.

Embodiment Mode 5

In Embodiments Modes 1, 2, and 4, although the cooling device is arranged on the back surface side of the LED backlight, a thermal conductor may be arranged between the LED backlight and the cooling device in order to more improve the cooling efficiency of the LED backlight. This embodiment describes the case where the thermal conductor is arranged between the LED backlight and the cooling device.

First, a configuration of a display device in this embodiment mode is described with reference to FIG. 41.

Figure 41:
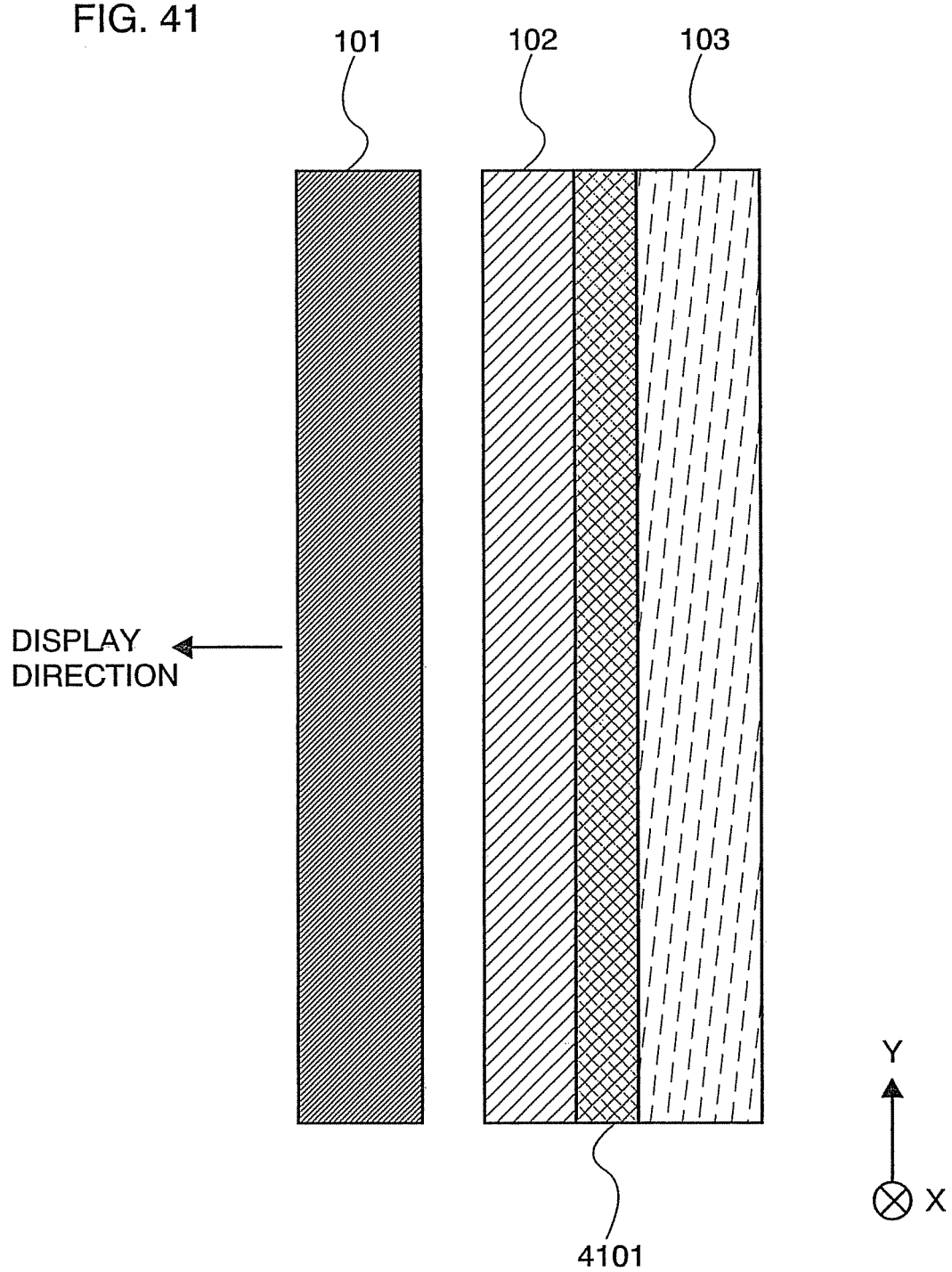
FIG. 41 is a diagram showing a configuration of a cooling device of the invention.

FIG. 41 shows a configurational example of the display device in this embodiment mode. The display device in this embodiment mode includes the liquid crystal panel 101, the LED backlight 102, the cooling device 103, a thermal conductor 4101, or the like. The LED backlight 102 is arranged on the back surface side of the liquid crystal panel 101, the thermal conductor 4101 is arranged on the back surface side of the LED backlight 102, and the cooling device 103 is arranged on a back surface side of the thermal conductor 4101. Note that the cooling device 103 is arranged so as to be in contact with the thermal conductor 4101.

Note that the thermal conductor 4101 is preferably a material having high thermal conductance. For example, a material which includes copper, iron, aluminum, or the like, or metal such as stainless steel is preferably employed. In particular, since copper has high thermal conductance and corrosion resistance, a plate which is formed from copper is preferably employed as the thermal conductor 4101.

Next, a configuration of the LED backlight 102 in this embodiment mode is described with reference to FIGS. 42A and 42B.

FIG. 42A shows a plan view of the LED backlight 102 in this embodiment mode when it is seen from an X-axis side in FIG. 41. Further, FIG. 42B shows a plan view of the LED backlight 102 in this embodiment mode when it is seen from a Y-axis side in FIG. 41.

The LED backlight 102 in this embodiment mode includes the LED 201, the wiring board 202, the backboard 203, the screw 204, the thermal conductor 4101, a screw 4201, or the like. In this embodiment mode, by attaching the thermal conductor 4101 to the LED backlight 102, the thermal conductor 4101 is arranged between the LED backlight 102 and the cooling device 103. In the configurational example of the LED backlight 102 shown in FIGS. 42A and 42B, the thermal conductor 4101 is arranged on a back surface side of the backboard 203 of the LED backlight 102 and the thermal conductor 4101 is attached to the backboard 203 by using the screw 4201.

Note that the thermal conductor 4101 may be arranged by attaching the backboard 203 and the thermal conductor 4101 together by using an adhesive agent having high thermal conductance.

In addition, in order to improve the light use efficiency of the LED 201, a reflecting means for reflecting the light emitted from the LED 201 may be provided. For example, a reflecting coating which is made of a material having high reflectivity may be applied to the backboard 203, or a reflecting portion which is made of a material having high reflectivity may be additionally provided. FIGS. 43A and 43B and FIGS. 44A and 44B show a configurational example of the LED backlight 102 in this case.

FIGS. 43A and 43B show a configurational example of the LED backlight in the case where a reflecting coating which is made of a material having high reflectivity is applied to the backboard. In FIGS. 43A and 43B, by applying a reflecting coating 4301 to the backboard 203, the backboard 203 can be utilized as a substitute for the reflector of the LED 201.

Figure 44A:
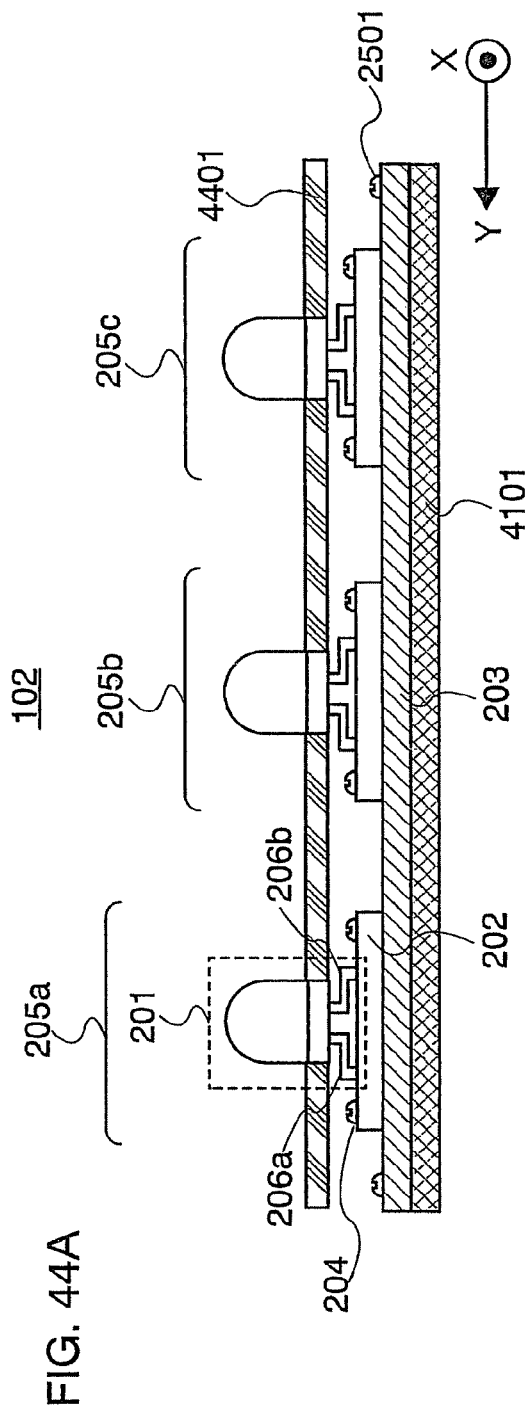
FIGS. 44A and 44B are diagrams showing a configuration of an LED backlight of the invention.
Figure 44B:
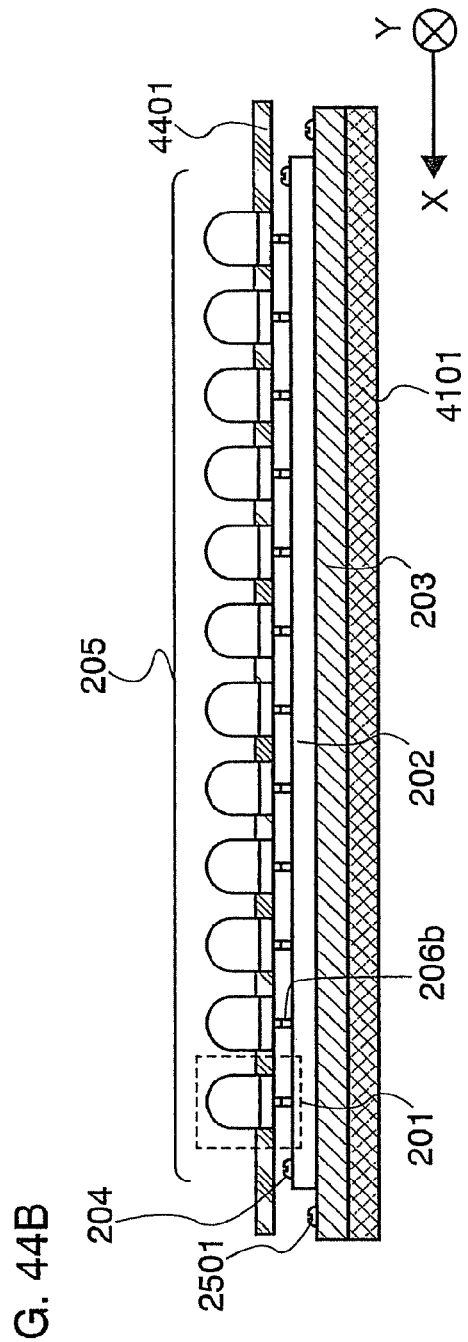

FIGS. 44A and 44B show a configurational example of the LED backlight in the case of additionally providing a reflecting portion which is made of a material having high reflectivity. In FIGS. 44A and 44B, a reflecting portion 4401 is arranged so as to cover the wiring board 202, the terminals 206a and 206b of the LED 201, or the like.

By providing the reflecting means for reflecting the light emitted from the LED 201 in this manner, light emitted from the LED 201 is reflected on the reflecting means and enters the liquid crystal panel 101, and thus, the light use efficiency of the LED 201 can be improved.

Note that the reflecting portion 4401 may be an optical functioning sheet having a function of reflecting light, a material which includes copper, iron, aluminum, or the like, a metal plate of stainless steel or the like, for example. Alternatively, a white and plastic or acrylic plate may be employed. In addition, a surface of the reflecting portion 4401 may have unevenness. This helps the light emitted from the LED 201 be reflected diffusely on the unevenness of the surface of the reflecting portion 4401, so that the light can also be diffused. Accordingly, the light use efficiency of the LED 201 can be improved.

Note that in order to improve the light use efficiency of the LED 201, the wiring board 202, the backboard 203, and the screws 204 and 4201 may be white. Thus, the light emitted from the LED 201 is reflected more, so that the light use efficiency of the LED 201 can be improved.

Next, a configuration of the cooling device 103 in this embodiment mode is described with reference to FIG. 45, and FIGS. 46A and 46B.

Figure 45:
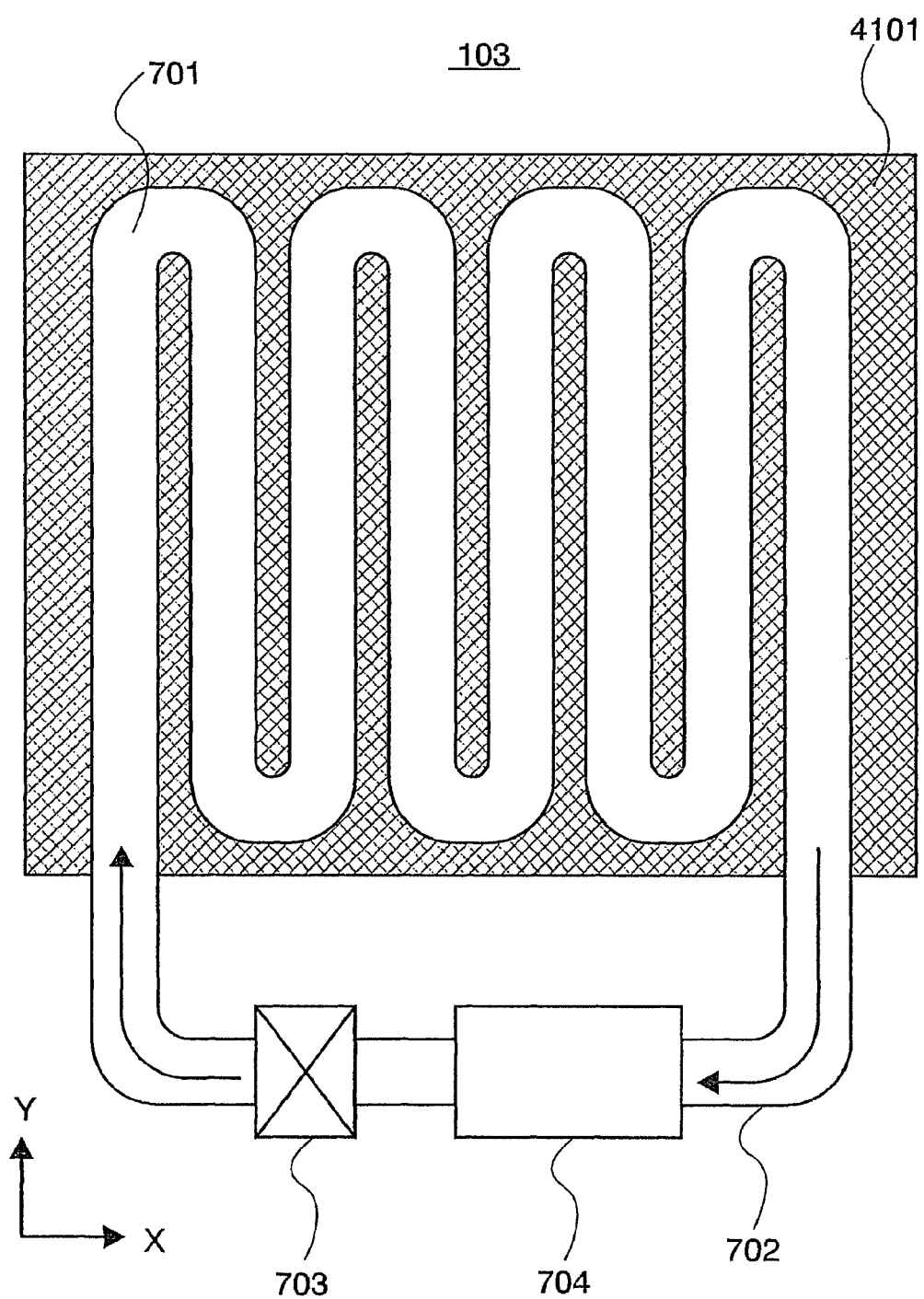
FIG. 45 is a diagram showing a configuration of a cooling device of the invention.

FIG. 45 shows a diagram of the cooling device 103 in this embodiment mode when it is seen from the back surface side of the LED backlight 102. The cooling device 103 in this embodiment mode is arranged on the back surface side of the thermal conductor 4101, which is different from the contents described in Embodiment Modes 1, 2, and 4.

FIG. 46A shows a plan view of the cooling device 103 shown in FIG. 45 when it is seen from an X-axis side in FIG. 45. In addition, FIG. 46B shows a plan view of the cooling device 103 shown in FIG. 45 when it is seen from a Y-axis side in FIG. 45.

In this embodiment mode, by supplying the coolant 701 to the coolant pipe 702 which is arranged so as to be in contact with the thermal conductor 4101 as shown in FIGS. 46A and 46B, the thermal conductor 4101 is cooled. Here, by using a material having high thermal conductance as the thermal conductor 4101, the thermal conductor 4101 is cooled in a shorter time. Then, the LED backlight 102 is cooled through the thermal conductor 4101 which has been cooled.

By arranging the thermal conductor 4101 between the LED backlight 102 and the cooling device 103 and cooling the LED backlight 102 through the thermal conductor 4101 in this manner, the time which is needed for cooling the LED backlight 102 can be made shorter than the case where the LED backlight is directly cooled. Therefore, the cooling efficiency of the LED backlight 102 can be more improved. Accordingly, the display defect such as display unevenness or color unevenness caused by the temperature unevenness of the LED backlight can be reduced.

It is to be noted that the arrangement of the coolant pipe 702, the flow direction of the coolant 701 and the like, are not limited to the contents described in FIG. 45. The contents described in Embodiment Mode 1 may be applied.

Figure 47:
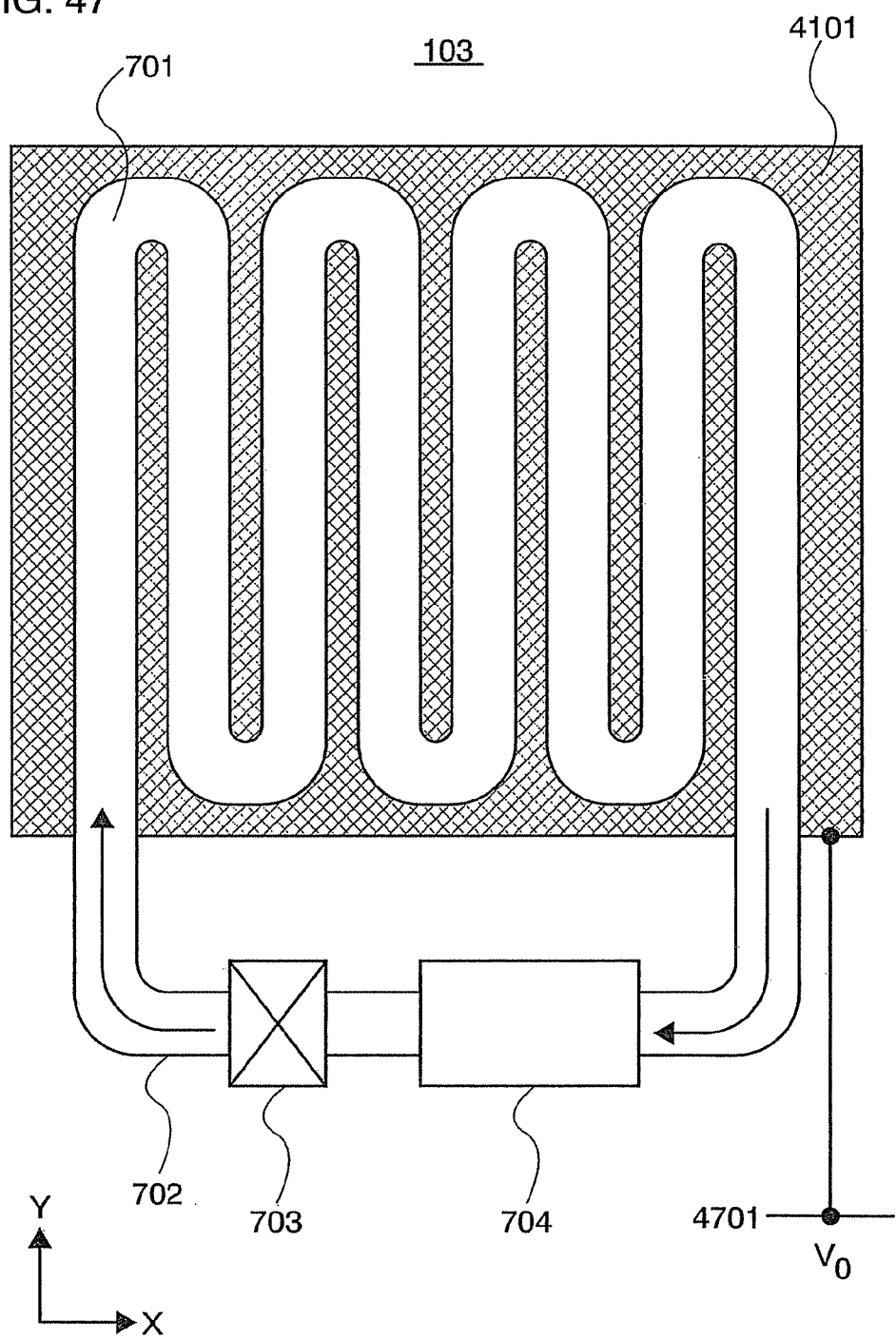
FIG. 47 is a diagram showing a configuration of a cooling device of the invention.

Note that when a material having high thermal conductance and conductivity (e.g., one including copper, iron, aluminum, or the like, or metal such as stainless steel) is used as the thermal conductor 4101, the thermal conductor 4101 can be utilized as an electrode for applying voltage to the LED 201 in the case of connecting one of the terminals 206a and 206b of the LED 201 to the thermal conductor 4101 and applying a certain voltage to the thermal conductor 4101. FIG. 47, and FIGS. 48A and 48B show a configurational example of the LED backlight and the cooling device in this case.

FIG. 47 shows a plan view of the cooling device 103 in this embodiment mode when it is seen from the back surface side of the LED backlight 102. The cooling device 103 in this embodiment mode connects the thermal conductor 4101 and a power supply line 4701 with each other in the cooling device shown in FIG. 45.

FIG. 48A shows a plan view of the cooling device 103 shown in FIG. 47 when it is seen from an X-axis side in FIG. 47. In addition, FIG. 48B shows a plan view of the cooling device 103 shown in FIG. 47 when it is seen from a Y-axis side in FIG. 47.

As shown in FIGS. 48A and 48B, one of the terminals 206a and 206b of the LED 201 (the terminal 206b in FIGS. 48A and 48B) is connected to the thermal conductor 4101. In addition, in the wiring board 202 and the backboard 203, an opening 4801 for leading the terminal 206b of the LED 201 is provided in advance.

Note that as a method of connecting the terminal 206b of the LED 201 and the thermal conductor 4101, the terminal 206b of the LED 201 and the thermal conductor 4101 may be connected by using solder, or an anisotropic conductive film (ACF).

Then, by connecting the thermal conductor 4101 and the power supply line 4701 and applying a voltage $V_0$ which is in the power supply line 4701, the voltage $V_0$ can be applied to the terminal 206b of the LED 201.

The thermal conductor 4101 can be utilized as the electrode for applying voltage to the LED 201 in this manner.

By utilizing the thermal conductor 4101 as the electrode for applying voltage to the LED 201 in this manner, the terminals 206b are connected to the same thermal conductor 4101 in all of the LEDs 201 forming the LED backlight 102. Accordingly, a common voltage $V_0$ can be applied to one of the terminals 206b of the all of the LED 201. In addition, a wire for applying the common voltage $V_0$ to the all of the LEDs 201 forming the LED backlight 102 is not necessary to be additionally provided. Further, since a uniform voltage can be applied to the all of the LEDs 201 forming the LED backlight 102, the luminance unevenness of the LEDs 201 can be reduced.

In addition, by cooling the thermal conductor 4101 by using the coolant pipe 702, the time for cooling the LED backlight 102 can be made shorter, and thus, the cooling efficiency of the LED backlight 102 can be more improved.

Further, by cooling the thermal conductor 4101, resistance of the thermal conductor 4101 can be decreased. Accordingly, heat generated by making current flow the thermal conductor 4101 (Joule heat) can be suppressed and the heat generated from the LED backlight 102 can also be suppressed. Further, the power consumption of the LED backlight 102 can be reduced.

In addition, since the resistance of the thermal conductor 4101 can be decreased, voltage drop caused by supplying current to the thermal conductor 4101 can be suppressed. Accordingly, since variation in the voltages which are applied to the LED 201 can be suppressed, the luminance unevenness of the LEDs 201 can also be reduced.

Note that the voltage $V_0$ which is applied to the thermal conductor 4101 may be a voltage which is applied on the cathode side of the LED, or may be a voltage which is applied to the anode side of the LED. In the case where three colors of LEDs of R, G, and B are arranged as the LEDs 201, a voltage between the anode and the cathode which is applied to the LED is different between the colors of R, G, and B. Then, when the voltage $V_0$ which is applied to the thermal conductor 4101 is the voltage which is applied on the cathode side of the LED, a common voltage can be applied on the cathode sides in the all of the LEDs. Note that the voltage which is applied to the anode side of the LED is different in each of R, and B. On the other hand, when the voltage $V_0$ which is applied to the thermal conductor 4101 is the voltage which is applied to the anode side of the LED, a common voltage can be applied on the anode sides in the all of the LEDs. Note that the voltage which is applied to the cathode side of the LED is different in each of R, G, and B.

In addition, by setting the voltage $V_0$ which is applied to the thermal conductor 4101 to ground voltage, the electrostatic shielding of the LED backlight 102 can be conducted. That is, the thermal conductor 4101 can be utilized as a shield for electrostatic shielding. Thus, the influence of the electromagnetic wave or the like on the LED backlight 102 is eliminated, so that the malfunction or the like of the LED backlight 102 can be prevented. Further, the influence of noise on the liquid crystal panel 101 can be removed.

In addition, as the power supply line 4701, a wire which is provided in the liquid crystal panel 101 itself may be utilized, or a wire arranged in the driver circuit board where the power supply or the controller which is necessary for driving the liquid crystal panel 101, the driver circuit for driving the LED backlight 102, or the like is arranged may be utilized. Alternatively, a ground line of the display device may be utilized.

It is to be noted that the terminal 206b of the LED 201 is directly connected to the thermal conductor 4101 in FIGS. 48A and 48B; however, the method of connecting the terminal 206b of the LED 201 and the thermal conductor 4101 is not limited to this. For example, the terminal 206b of the LED 201 may be connected to the thermal conductor 4101 through a different wire. FIGS. 49A and 49B show a configurational example of the LED backlight 102 and the cooling device 103 in this case.

FIG. 49A shows a plan view of the cooling device 103 shown in FIG. 47 when it is seen from an X-axis side in FIG. 47. In addition, FIG. 49B shows a plan view of the cooling device 103 shown in FIG. 47 when it is seen from a Y-axis side in FIG. 47.

In the configurational example shown in FIGS. 49A and 49B, a common wire 4901 for connecting the terminal 206b of the LED 201 to the wiring board 202 for forming the LED arrays 205a to 205c is provided. Then, the terminal 206b of the LED 201 which is arranged over the LED arrays 205a to 205c is connected to the common wire 4901, and further, the common wire 3701 is connected to the thermal conductor 4101. It is to be noted that in the wiring board 202 and the backboard 203, an opening 4902 for leading the common wire 4901 is provided in advance.

The terminal 206b of the LED 201 and the thermal conductor 4101 are connected through the common wire 4901 in this manner.

Figure 50A:
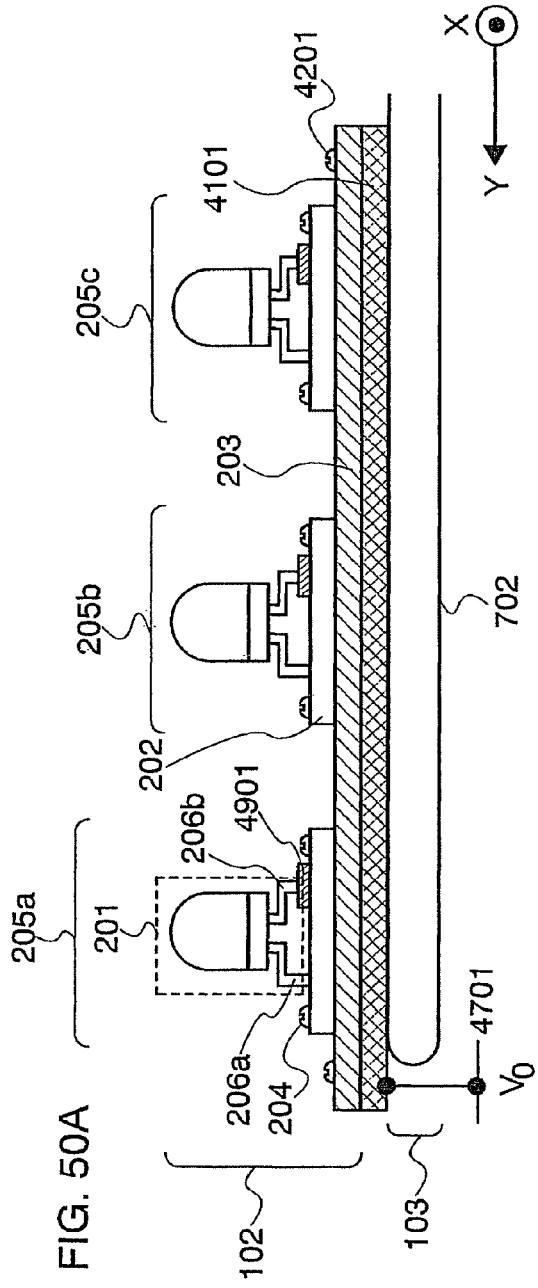
FIGS. 50A and 50B are diagrams showing a configuration of a cooling device of the invention.
Figure 50B:
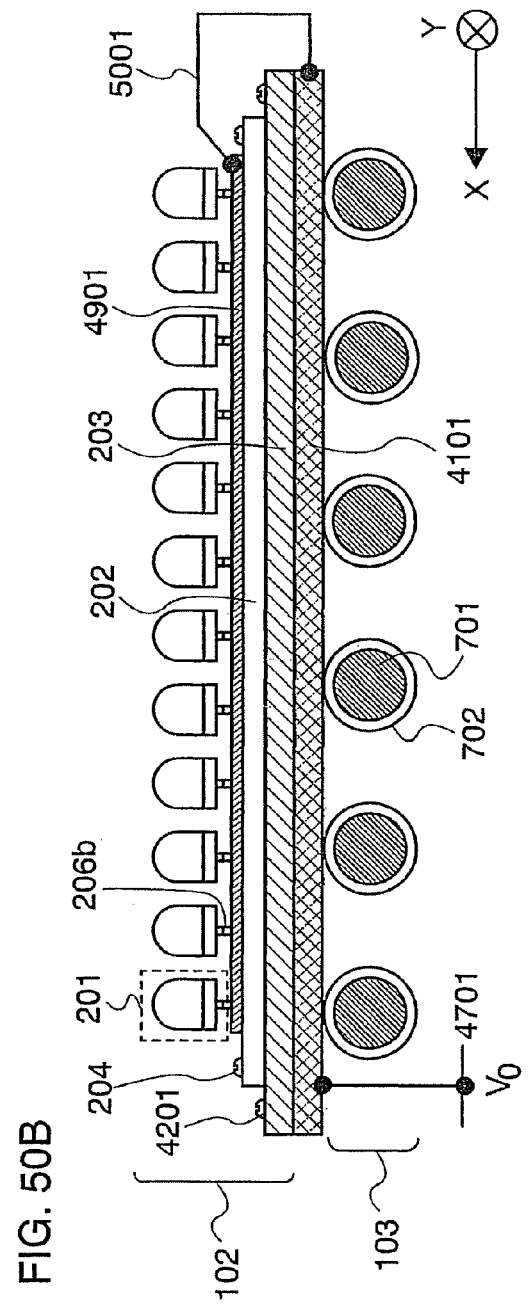

Note that although the common wire 4901 is connected to the thermal conductor 4101 by leading the wiring board 202 and the backboard 203 in FIGS. 49A and 49B, the invention is not limited to this. The common wire 4901 may be connected to the thermal conductor 4101 without leading the wiring board 202 and the backboard 203. FIGS. 50A and 50B show a configurational example of the LED backlight 102 and the cooling device 103 in this case.

In FIGS. 50A and 50B, the common wire 4901 and the thermal conductor 4101 are connected by using an external wire 5001. Thus, the opening 4902 for leading the common wire 4901 is not needed to be provided in the wiring board 202 and the backboard 203, so that the step of processing the wiring board 202 and the backboard 203 can be omitted.

By connecting terminal 206b of the LED 201 and the thermal conductor 4101 through the common wire 4901 in this manner, the opening 4801 for leading the terminal 206b of the LED 201 is not needed to be provided in the wiring board 202 and the backboard 203, so that the step of processing the wiring board 202 and the backboard 203 can be omitted. In addition, the terminal 206b of the LED 201 is only necessary to be connected to the common wire 4901 which is over the wiring board 202, so that an arrangement and connection of the terminal 206b of the LED 201 can be easily conducted.

Note that in the case where the coolant pipe is formed from a material having conductivity, the coolant pipe can also be utilized as the electrode for applying voltage to the LED in addition to the thermal conductor.

For example, forming the coolant pipe from a material having conductivity is described in FIGS. 48A and 48B. In FIGS. 48A and 48B, the thermal conductor 4101 and the power supply line 4701 are connected as well as the terminal 206b of the LED 201 is connected to the thermal conductor 4101, and the voltage $V_0$ of the power supply line 4701 is applied, and thus, the voltage $V_0$ can be applied to the terminal 206b of the LED 201.

At this time, the thermal conductor 4101 and the coolant pipe 702 are attached together by using solder, the anisotropic conductive film (ACF), an adhesive agent including a conductive particle, or the like. Thus, the voltage $V_0$ is applied to the thermal conductor 4101 and the coolant pipe 702.

By applying the voltage $V_0$ to the thermal conductor 4101 and the coolant pipe 702, the thermal conductor 4101 and the coolant pipe 702 can be utilized as electrodes for applying voltage to the LED 201. In addition, by applying the same voltage to the thermal conductor 4101 and the coolant pipe 702, the area of the electrodes for applying the voltage to the LED 201 is increased, and thus, resistance of the electrodes which apply the voltage to the LED 201 can be decreased. Accordingly, the heat generated by flowing the current to the coolant pipe 702 (Joule heat) can be suppressed and the heat generated from the LED 201 can also be suppressed. Further, the power consumption of the LED backlight 102 can be reduced.

Note that the power supply line 4701 may be connected to the thermal conductor 4101 or may be connected to the coolant pipe 702.

Note that the terminal 206b of the LED 201 may be connected to the thermal conductor 4101 or may be connected to the coolant pipe 702. As the method of connecting the terminal 206b of the LED 201 and the thermal conductor 4101 or the coolant pipe 702, the terminal 206b of the LED 201 and the thermal conductor 4101 may be directly connected or may be connected by using the common wire as shown in FIGS. 48A and 48B. In addition, in the case of connecting with each other by using the common wire, the common wire and the thermal conductor 4101 or the coolant pipe 702 may be directly connected as shown in. FIGS. 49A and 49B, or the common wire and the thermal conductor 4101 or the coolant pipe 702 may be connected by using the external wire as shown in FIGS. 50A and 50B.

It is to be noted that the case where the coolant pipe 702 which is formed from a material having conductivity is arranged on the back surface side of the LED backlight is described above; however, even in the case where the coolant pipe 702 is arranged on the front surface side of the LED backlight or even in the case where the coolant pipe 702 is arranged on both of the front surface side and the back surface side of the LED backlight, the coolant pipe can be utilized similarly as the electrode for applying voltage to the LED in addition to the thermal conductor.

In addition, the thermal conductor 4101 is attached to the backboard 203 of the LED backlight 102 in this embodiment mode; however, the thermal conductor 4101 itself may be utilized as a substitute for the backboard 203. That is, the LED arrays 205a to 205c may be directly attached to the thermal conductor and utilized. FIGS. 51A and 51B show a configurational example of the LED backlight 102 and the cooling device 103 in this case.

FIG. 51A shows a plan view of the LED backlight 102 and the cooling device 103 shown in FIG. 41 when it is seen from the X-axis side in FIG. 41. In addition, FIG. 51B shows a plan view of the LED backlight and the cooling device 103 shown in FIG. 41 when they are seen from the Y-axis side in FIG. 41.

Note that in the cooling device 103, an arrangement of the coolant pipe 702 is similar to the arrangement of the cooling device 103 shown in FIG. 45.

In the configurational example of the LED backlight 102 shown in FIGS. 51A and 51B, the LED array 205 is directly attached to the thermal conductor 4101 by using the screw 204. Thus, the thermal conductor 4101 can be utilized as a substitute for the backboard 203.

By utilizing the thermal conductor 4101 as the substitute for the backboard 203 in this manner, the LED 201 can be more directly cooled than the case where the backboard 203 is separately provided when the LED backlight 102 is cooled by using the cooling device, and thus, the LED 201 can be cooled in a shorter time. Accordingly, the cooling efficiency of the LED backlight 102 can be more improved.

In addition, by utilizing the thermal conductor 4101 as the substitute for the backboard 203 and employing the above-described method, the thermal conductor 4101 can also be utilized as the electrode for applying voltage to the LED 201. Further, the thermal conductor 4101 can also be utilized as a shield for electrostatic shielding of the LED backlight 102.

In addition, by using a material having high light reflectivity as the thermal conductor 4101, the thermal conductor 4101 can be utilized as the reflector of the LED 201. Thus, the light emitted from the LED 201 is reflected on the thermal conductor 4101 and enters the liquid crystal panel 101, and thus, the light use efficiency of the LED 201 can be improved. Further, in the case of arranging three colors of LEDs of R, G, and B alternately, the light of three colors of R, G, and B more easily mix with each other since the light is reflected on the thermal conductor 4101. Therefore, uniform white light can enter the liquid crystal panel 101. Accordingly, the color unevenness can be reduced.

By arranging the thermal conductor between the LED backlight and the cooling device and cooling the LED backlight by the cooling device through the thermal conductor 4101 as in this embodiment mode, the LED backlight can be cooled in a shorter time and more efficiently. In addition, the thermal conductor can be utilized as the electrode for applying voltage to the LED, so that the heat generated from the LED backlight can be suppressed and the power consumption of the LED backlight can also be reduced. Further, the thermal conductor can also be utilized as the shield for electrostatic shielding, and thus, the influence of the electromagnetic wave or the like on the LED backlight 102 is eliminated so that the malfunction or the like of the LED backlight can be prevented. Moreover, since the thermal conductor can be utilized as the reflector of the LED 201, the light use efficiency of the LED can be improved. In addition, since a particular device or wire for realizing each of these advantageous effects is not needed to be additionally provided, the number of the components can be reduced.

Note that various contents described in this embodiment mode may be freely combined and implemented. In addition, the contents described in this embodiment mode may be freely combined with the contents described in Embodiment Modes 1 to 4 and implemented.

Embodiment Mode 6

A display device using the LED backlight and the cooling device of the invention can be applied to various electronic devices. In this embodiment mode, electronic devices which use a display device using the LED backlight and the cooling device of the invention are given as examples, and the specific configurational examples thereof are described.

FIGS. 52A and 52B show a configurational example of a display device for a personal computer as an example of electronic devices in this embodiment mode. FIG. 52A shows a front view of the display device for the personal computer in this embodiment mode, and FIG. 52B shows a back view of the display device for the personal computer in this embodiment mode.

The display device for the personal computer in this embodiment mode includes housings 5201a and 5201b, a display portion 5202, a support 5203, a power supply switch 5204, a cable connecting portion 5205, the coolant pipe 702, the coolant circulation pump 703, the coolant tank 704, and the like.

The display portion 5202, the support 5203, the cable connecting portion 5205, the coolant pipe 702, and the like are mainly incorporated in the housing 5201a. In addition, the power supply switch 5204 and the like are mainly incorporated in the housing 5201b.

The coolant circulation pump 703 and the coolant tank 704 are arranged on outer sides of the housing 5201a and 5201b. For example, the coolant circulation pump 703 and the coolant tank 704 are arranged over the support 5203 in FIGS. 52A and 52B. Note that the coolant circulation pump 703 and the coolant tank 704 may be arranged on a back surface side of the support 5203.

By arranging the coolant circulation pump 703 and the coolant tank 704 on the outer sides of the housing 5201a and 5201b in this manner, replacement and supplement of the coolant can be easily conducted. In addition, since the coolant tank 704 is exposed to the air, heat radiation from the coolant is efficiently conducted. Further, since space for arranging the coolant circulation pump 703 and the coolant tank 704 is not necessary to be provided on an inner side of the housing 5201a, the thickness of the display device for the personal computer can be made thinner.

Note that the coolant circulation pump 703 and the coolant tank 704 may be arranged on inner sides of the housing 5201a and 5201b. In particular, by arranging the coolant tank 704 on the inner side of the housing 5201a, space for arranging the coolant tank 704 is not necessary to be specially provided on an outer side of the housing 5201a, and thus, useless space can be omitted. In addition, center of gravity of the display device for the personal computer is lowered, and thus, stability is improved.

A vent 5206 is provided on a back surface side of the housing 5201a. Thus, heat generated in an inside of the housing such as LED backlight can be efficiently radiated to an outside of the housing.

In addition, an opening 5207 for leading the coolant pipe 702 is provided on the back surface side of the housing 5201a. Then, the coolant pipe 702 is arranged in the inside of the housing by leading the opening 5207.

Figure 53:
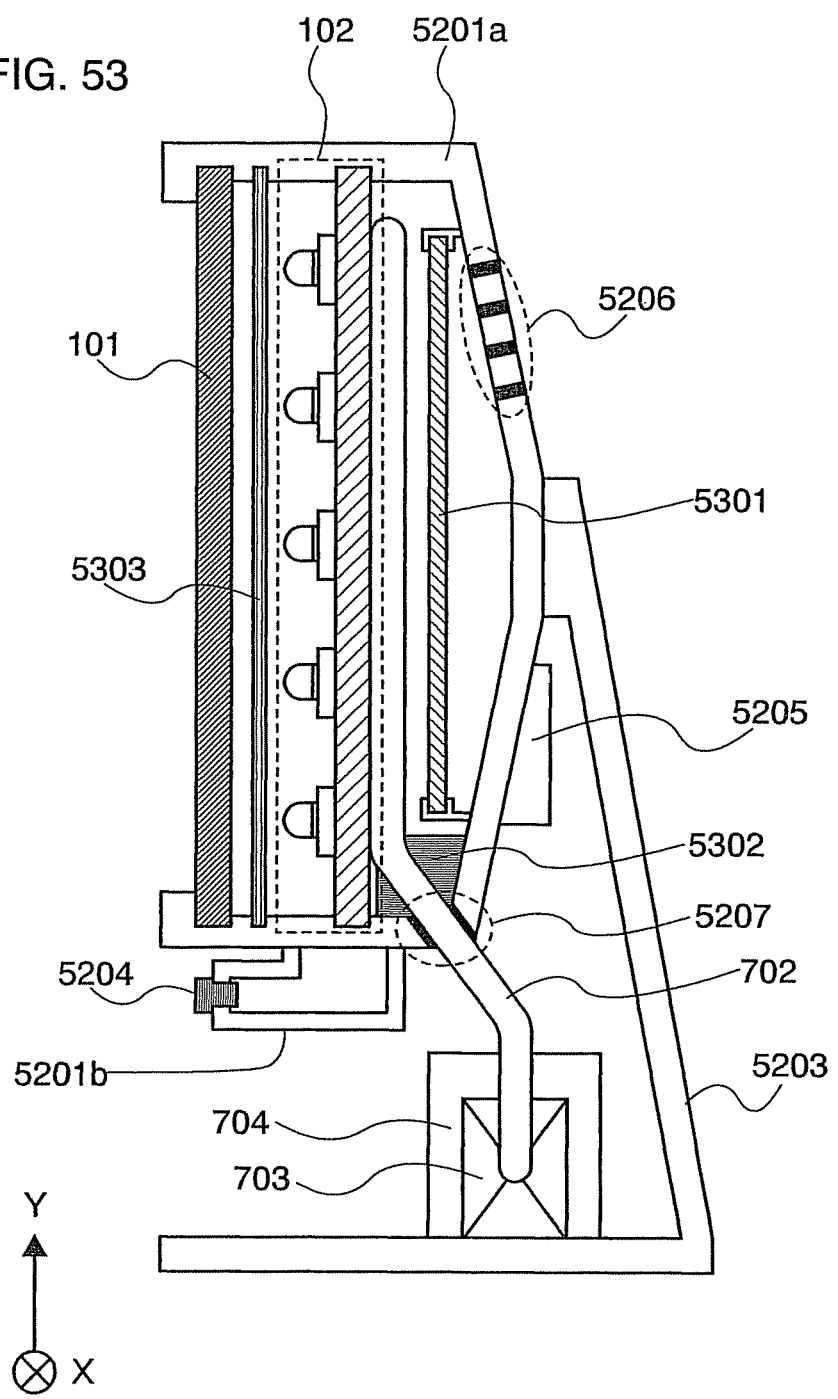
FIG. 53 is a diagram showing a configurational example of a display device of the invention.

Next, FIG. 53 shows a cross-sectional view of the display device for the personal computer shown in FIGS. 52A and 52B. Note that FIG. 53 shows a cross-sectional view of the display device for the personal computer shown in FIGS. 52A and 52B when it is seen from an X-axis side in FIGS. 52A and 52B.

Note also that FIG. 53 shows a cross-sectional view of the display device for the personal computer in the case of using the configurational examples shown in Embodiment Mode 1 as the LED backlight and the cooling device.

The inner side of the housing 5201a of the display device for the personal computer shown in FIG. 53 includes the liquid crystal panel 101 having the display portion 5202, the LED backlight 102, the coolant pipe 702, a driver circuit board 5301, an optical sheet portion 5303, and the like. In addition, as an arrangement of these components, the liquid crystal panel 101, the optical sheet portion 5303, the LED backlight 102, the coolant pipe 702, and the driver circuit board 5301 are sequentially arranged toward from a display surface to the back surface side.

The liquid crystal panel 101, the optical sheet portion 5303, the LED backlight 102, and the driver circuit board 5301 are arranged by being incorporated in the inner side of the housing 5201a.

Note that the driver circuit board 5301 corresponds to a substrate where the power supply or the controller which is necessary for driving the liquid crystal panel 101, the driver circuit for driving the LED backlight 102, and the like are arranged.

In addition, the optical sheet portion 5303 corresponds to a portion formed by stacking a plurality of optical functioning sheets of a polarizing film, a phase difference film, a prism sheet, a diffusion film, or the like, for example. The optical sheet portion 5303 is arranged between the liquid crystal panel 101 and the LED backlight 102, and the optical sheet portion 5303 has functions of making a wide viewing angle, preventing coloration, and the like by extracting only light having a particular polarization direction from light emitted from the LED backlight 102, diffusing the light emitted from the LED backlight 102, compensating a phase difference of the light emitted from the LED backlight 102, and the like.

Here, FIG. 62 shows a cross-sectional view of the display device, in which the optical sheet portion 5303 and the periphery thereof are enlarged. The display device shown in FIG. 62 includes the liquid crystal panel 101, the LED backlight 102, first and second polarizing films 6201 and 6204, first and second phase difference films 6202 and 6203, a prism sheet 6205, a diffusion film 6206, and the like. In addition, as an arrangement of these components, the first polarizing film 6201, the first phase difference film 6202, the liquid crystal panel 101, the second phase difference film 6203, the second polarizing film 6204, the prism sheet 6205, the diffusion film 6206, and the LED backlight 102 are sequentially arranged toward from the display surface to the back surface side. Note that the second phase difference film 6203, the second polarizing film 6204, the prism sheet 6205, and the diffusion film 6206 correspond to the optical sheet portion 5303.

Note that the first and second phase difference films 6202 and 6203, and the prism sheet 6205 are not required to be arranged.

Note that the optical functioning sheets for forming the optical sheet portion 5303 are not limited to the aforementioned examples. For example, a luminance improvement film for improving luminance or the like may be included.

Note that by arranging the driver circuit board 5301 on the back surface side of the coolant pipe 702, the light emitted from the LED backlight can enter the liquid crystal panel 101 without being shielded. In addition, the driver circuit board 5301 can also be cooled as well as the LED backlight 102 can be efficiently cooled by using the coolant pipe 702, and thus, heat generated from the driver circuit board 5301 can be suppressed.

Note that there is a case where dew condensation is generated on the surface of the coolant pipe 702 at the time of cooling the LED backlight 102. Then, in order to absorb drop of water generated on the surface of the coolant pipe 702, an absorbent material 5302 may be arranged below or near the coolant pipe 702 as shown in FIG. 53. Thus, the LED backlight 102, the driver circuit board 5301, or the like can be prevented from being broken down by drop of water generated on the surface of the coolant pipe 702.

Note that as the LED backlight and the cooling device, for example, the configuration shown in Embodiment Mode 3 or Embodiment Mode 5 may be employed. Here, FIGS. 54 and 55 show cross-sectional views of the display device for the personal computer in the case of using the configurational examples shown in Embodiment Mode 3 or Embodiment Mode 5 as the LED backlight and the cooling device.

Figure 54:
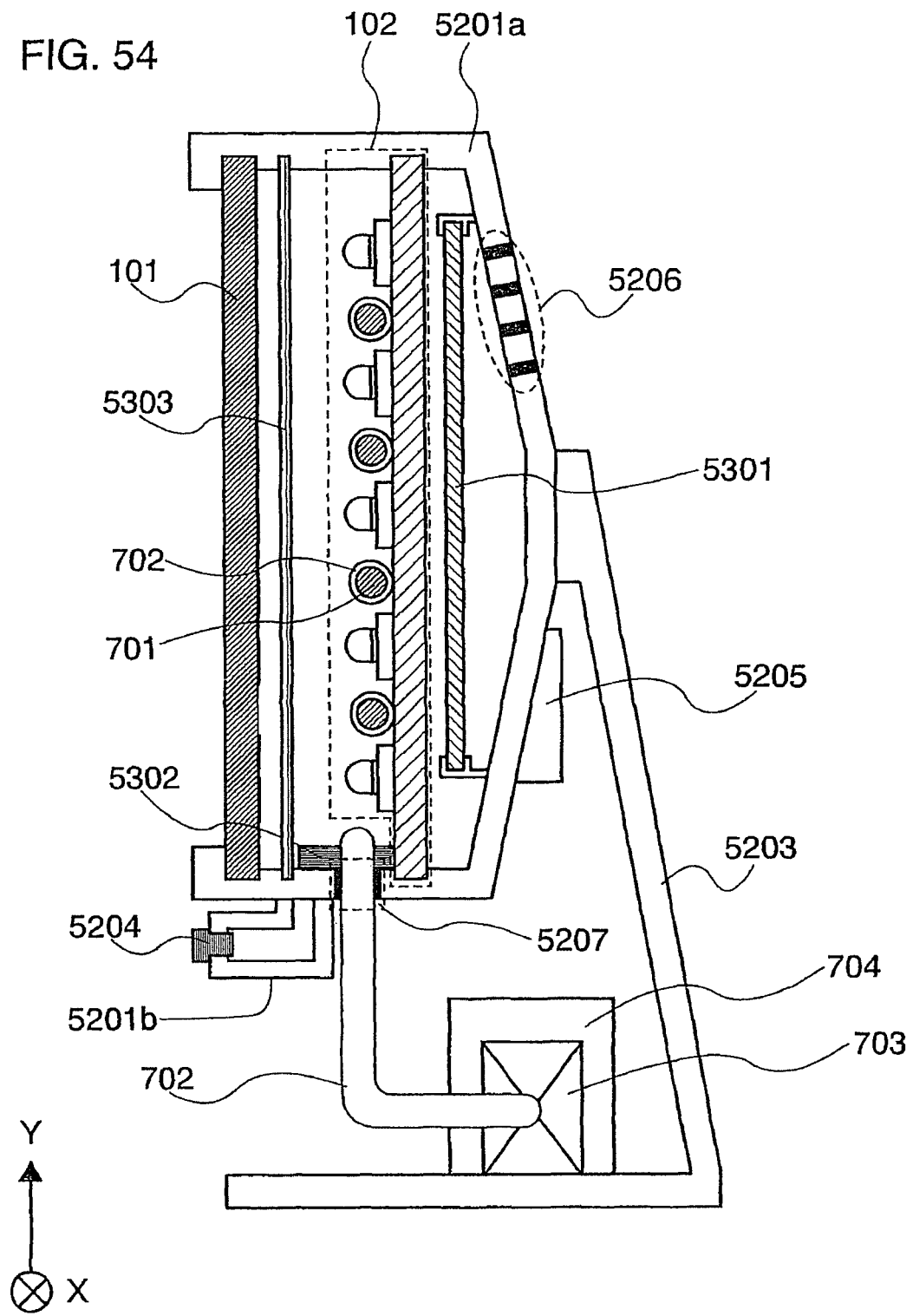
FIG. 54 is a diagram showing a configurational example of a display device of the invention.
Figure 55:
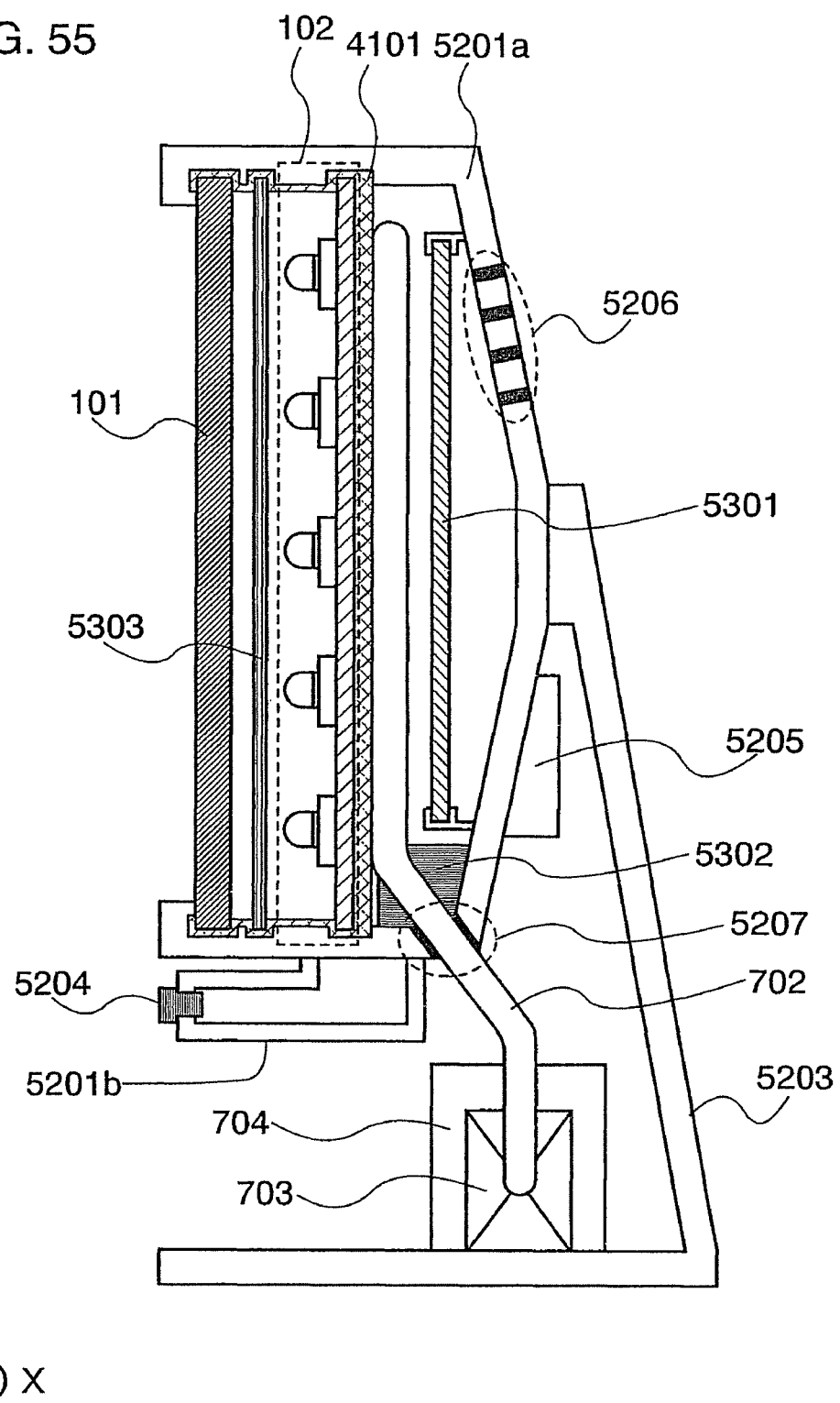
FIG. 55 is a diagram showing a configurational example of a display device of the invention.

FIG. 54 shows a cross-sectional view of the display device for the personal computer in the case of using the configurational examples shown in Embodiment Mode 3 as the LED backlight and the cooling device.

The inner side of the housing 5201*a* of the display device for the personal computer shown in FIG. 54 includes the liquid crystal panel 101 for forming the display portion 5202, the LED backlight 102, the coolant pipe 702, a driver circuit board 5301, an optical sheet portion 5303, and the like, similarly to FIG. 53. In addition, as an arrangement of these components, the liquid crystal panel 101, the optical sheet portion 5303, the LED backlight 102, and the driver circuit board 5301 are sequentially arranged from the display surface toward the back surface side. The coolant pipe 702 is arranged on the front surface side of the LED backlight 102 (between the LED arrays which are adjacent to each other), which is different from the display device for the personal computer shown in FIG. 53.

Note that there is a case where dew condensation is generated on the surface of the coolant pipe 702 at the time of cooling the LED backlight 102. Then, in order to absorb drop of water generated on the surface of the coolant pipe 702, an absorbent material 5302 may be arranged below or near the coolant pipe 702. Thus, the LED backlight 102, the driver circuit board 5301, or the like can be prevented from being broken down by drop of water generated on the surface of the coolant pipe 702.

In addition, by applying a material having high water repellency to the LED backlight 102, waterproofing may be performed. Thus, the LED backlight 102 can be prevented from being broken down by attaching drop of water generated on the surface of the coolant pipe 702 to the LED backlight 102, in particular, the terminals of the LEDs or the wiring board.

Next, FIG. 55 shows a cross-sectional view of the display device for the personal computer in the case of using the configurational examples shown in Embodiment Mode 5 as the LED backlight and the cooling device.

The inner side of the housing 5201*a* of the display device for the personal computer shown in FIG. 55 includes the liquid crystal panel 101 for forming the display portion 5202, the LED backlight 102, the coolant pipe 702, a driver circuit board 5301, an optical sheet portion 5303, the thermal conductor 4101, and the like. In addition, as an arrangement of these components, the liquid crystal panel 101, the optical sheet portion 5303, the LED backlight 102, the thermal conductor 4101, the coolant pipe 702, and the driver circuit board 5301 are sequentially arranged toward from the display surface to the back surface side.

The liquid crystal panel 101, the optical sheet portion 5303, the LED backlight 102, the thermal conductor 4101, and the driver circuit board 5301 are arranged by being incorporated in the inner side of the housing 5201*a*.

Note that in the case where the thermal conductor 4101 is utilized as the electrode for applying voltage to the terminal of the LED, electrostatic shielding of the liquid crystal panel 101 and the LED backlight 102 can be conducted by not only attaching the thermal conductor 4101 on the back surface side of the LED backlight 102, but also arranging the thermal conductor 4101 in the inner side of the housing 5201*a*. Thus, influence of electromagnetic wave or the like on the liquid crystal panel 101 and the LED backlight 102 is removed, so that a malfunction or the like of the liquid crystal panel 101 and the LED backlight 102 can be prevented.

Note that in FIG. 55, when the thermal conductor 4101 is arranged in the inner side of the housing 5201*a*, the thermal conductor 4101 is arranged only on the front surface side of the LED backlight 102; however, the invention is not limited to this. The thermal conductor 4101 may be arranged in the inner side of the housing 5201*a* also on the back surface side of the LED backlight 102. Thus, since electrostatic shielding of the driver circuit board 5301 can also be conducted, influence of electromagnetic wave or the like on the driver circuit board 5301 is removed, so that a malfunction or the like of the driver circuit board 5301 can also be prevented.

Note that there is a case where dew condensation is generated on the surface of the coolant pipe 702 at the time of cooling the LED backlight 102. Then, in order to absorb drop of water generated on the surface of the coolant pipe 702, an absorbent material 5302 may be arranged below or near the coolant pipe 702. Thus, the LED backlight 102, the driver circuit board 5301, or the like can be prevented from being broken down by drop of water generated on the surface of the coolant pipe 702.

Figure 56A:
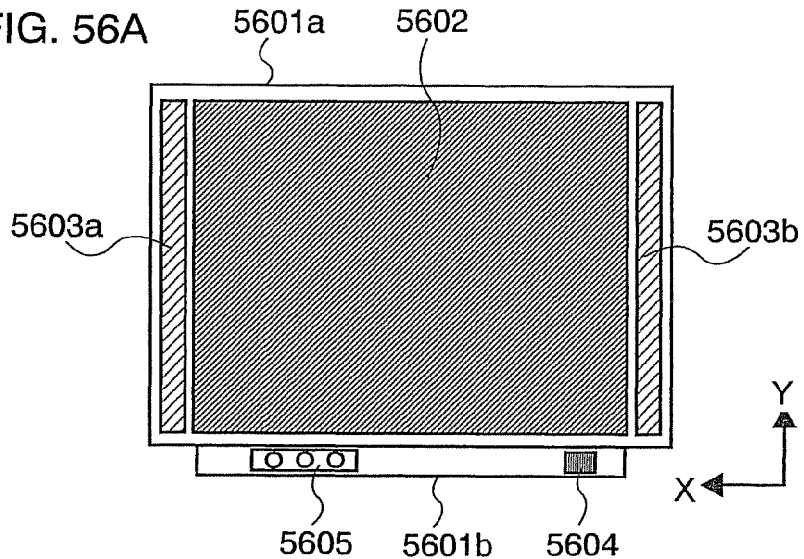
FIGS. 56A to 56C are diagrams showing a configurational example of a display device of the invention.
Figure 56B:
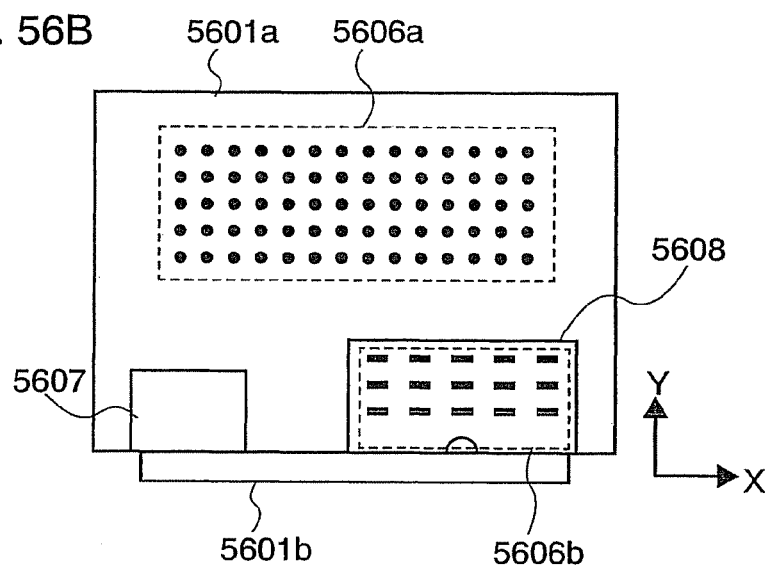
Figure 56C:
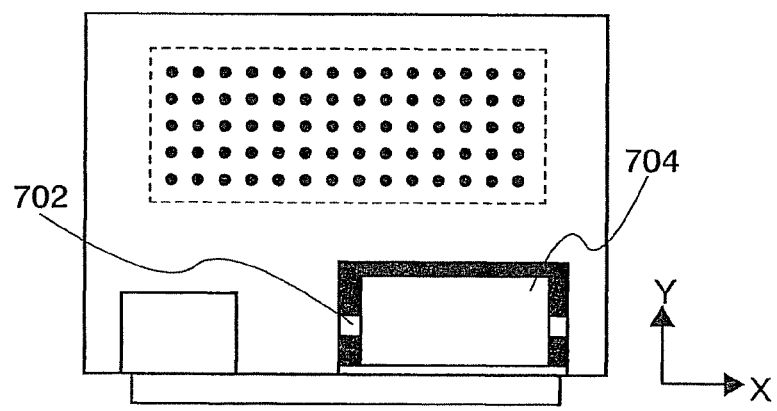

FIGS. 56A to 56C show a configurational example of a television as an example of the electronic devices in this embodiment mode. FIG. 56A shows a front view of the television in this embodiment mode and FIGS. 56B and 56C show rear views of the television in this embodiment mode.

The television in this embodiment mode includes housings 5601a and 5601b, a display portion 5602, speakers 5603a and 5603b, a power supply switch 5604, a video input terminal 5605, a cable connecting portion 5607, and the like.

The display portion 5602, the speakers 5603a and 5603b, the cable connecting portion 5607, and the like are mainly incorporated in the housing 5601a. In addition, the power supply switch 5604, the video input terminal 5605, and the like are mainly incorporated in the housing 5601b.

A vent 5606a is provided on a back surface side of the housing 5601a. By the vent 5606a, heat generated in an inside of the housing such as LED backlight can be efficiently radiated to an outside of the housing.

In FIGS. 56A to 56C, the coolant circulation pump 703 and the coolant tank 704 are arranged on an inner side of the housing 5601a. Note that a coolant tank cover 5608 is provided on a back surface side of the housing 5601a, and the coolant tank cover 5608 is usually closed and used (refer to FIG. 56B). In addition, in the case of supplying and replacing the coolant to the coolant tank 704, the coolant tank cover 5608 is usually opened and used (refer to FIG. 56C).

By arranging the coolant circulation pump 703 and the coolant tank 704 on the inner side of the housing 5601a in this manner, the space for arranging the coolant tank 704 is not needed to be specially provided on an outer side of the housing 5601a, and thus, useless space can be omitted. In addition, center of gravity of the television is lowered, and thus, stability is improved.

Note that a vent 5606b is arranged in the coolant tank cover 5608. Thus, the heat radiation from the coolant can be efficiently conducted.

Next, FIG. 57 shows a cross-sectional view of the television shown in FIGS. 56A to 56C. Note that FIG. 57 shows a cross-sectional view of the television shown in FIGS. 56A to 56C when it is seen from an X-axis side in FIGS. 56A to 56C.

Note that FIG. 57 shows a cross-sectional view of the television in the case of using the configurational examples shown in Embodiment Mode 1 as the LED backlight and the cooling device.

The inner side of the housing 5601a of the television shown in FIG. 57 includes the liquid crystal panel 101 having the display portion 5602, the LED backlight 102, the coolant pipe 702, a driver circuit board 5701, an optical sheet portion 5703, and the like, similarly to FIGS. 53 to 55. In addition, as an arrangement of these components, the liquid crystal panel 101, the optical sheet portion 5703, the LED backlight 102, the coolant pipe 702, and the driver circuit board 5701 are sequentially arranged from a display surface toward the back surface side.

The liquid crystal panel 101, the optical sheet portion 5703, the LED backlight 102, and the driver circuit board 5701 are arranged by being incorporated in the inner side of the housing 5601a.

The coolant pump 703 and the coolant tank 704 are arranged on the backmost surface side of an inside of the housing 5601a. In FIG. 57, the coolant pump 703 and the coolant tank 704 are arranged in space which is below or near a place in which the driver circuit board 5701 is arranged.

Note that by arranging the driver circuit board 5701 on the back surface side of the coolant pipe 702, the light emitted from the LED backlight can enter the liquid crystal panel 101 without being shielded. In addition, the driver circuit board 5701 can be cooled as well as the LED backlight 102 can be efficiently cooled by using the coolant pipe 702, and thus, heat generated from the driver circuit board 5701 can be suppressed.

Note that there is a case where dew condensation is generated on the surface of the coolant pipe 702 at the time of cooling the LED backlight 102. Then, in order to absorb drop of water generated on the surface of the coolant pipe 702, an absorbent material 5702 may be arranged below or near the coolant pipe 702. Thus, the LED backlight 102, the driver circuit board 5701, or the like can be prevented from being broken down by drop of water generated on the surface of the coolant pipe 702.

In addition, similarly to the televisions shown in FIGS. 54 and 55, the configurations shown in Embodiment Mode 3 or Embodiment Mode 5 may be employed as the LED backlight and the cooling device, for example. Here, FIGS. 58 and 59 show cross-sectional views of the television in the case of using the configurational example shown in Embodiment Mode 3 or Embodiment Mode 5 as the LED backlight and the cooling device.

Figure 58:
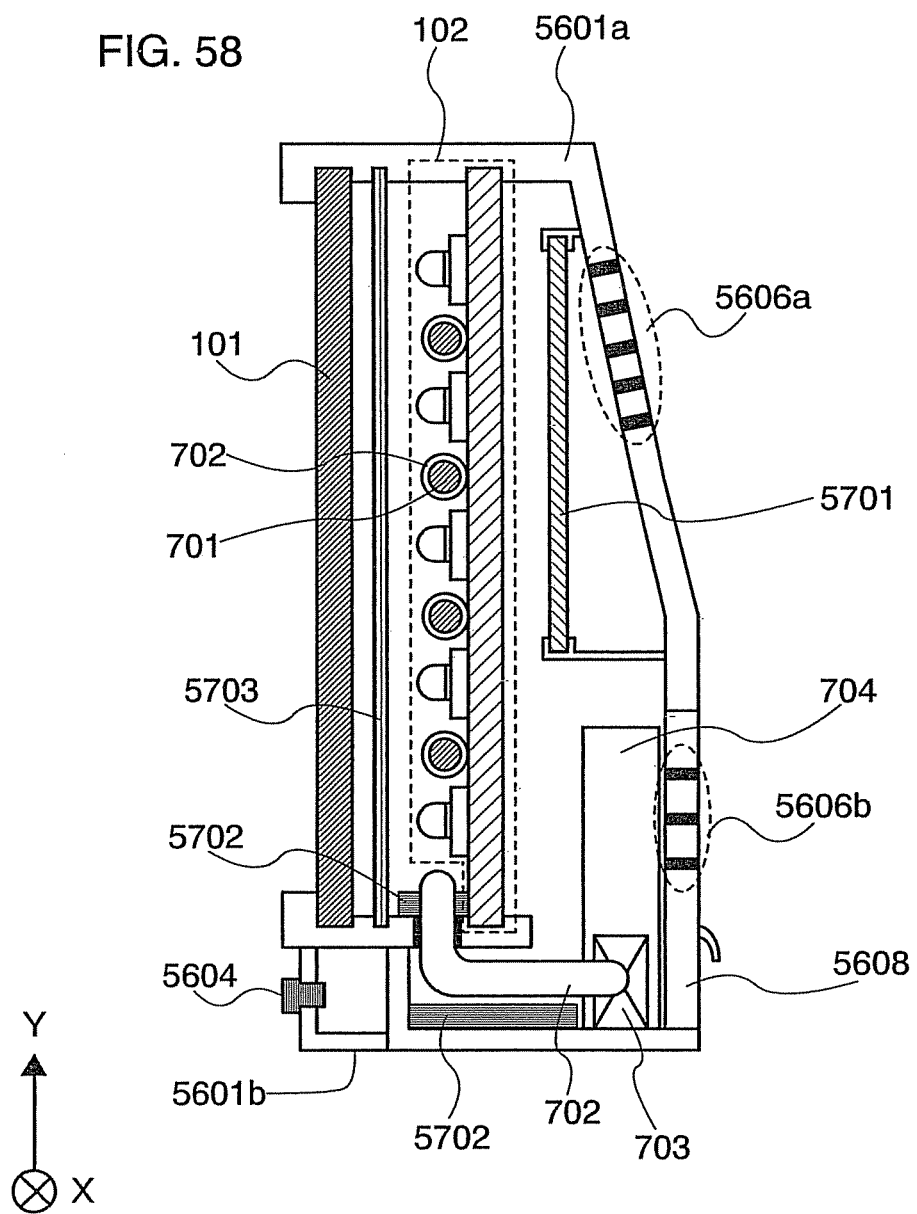
FIG. 58 is a diagram showing a configurational example of a display device of the invention.

FIG. 58 shows a cross-sectional view of the television in the case of using the configurational examples shown in Embodiment Mode 3 as the LED backlight and the cooling device. The coolant pipe 702 is arranged on the front surface side of the LED backlight 102 (between the LED arrays which are adjacent to each other), which is different from the television shown in FIG. 57.

Figure 59:
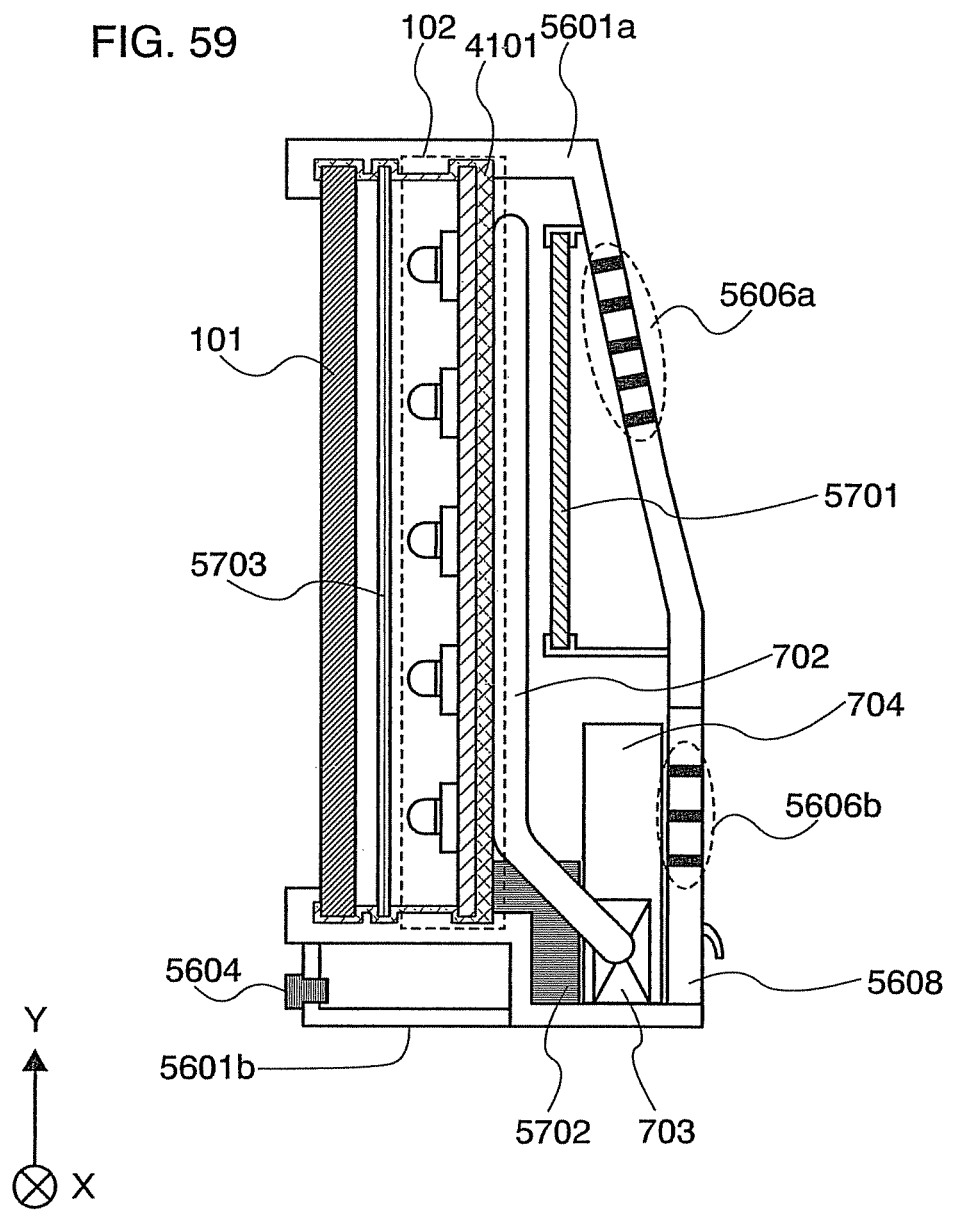
FIG. 59 is a diagram showing a configurational example of a display device of the invention.

FIG. 59 shows a cross-sectional view of the television in the case of using the configurational examples shown in Embodiment Mode 5 as the LED backlight and the cooling device. The thermal conductor 4101 is arranged between the LED backlight 102 and the coolant pipe 702, which is different from the television shown in FIG. 57.

By applying the display device using the LED backlight and the cooling device of the invention in this manner, a clear image with reduced display unevenness or color evenness can be viewed.

Note that each of the display device and the electronic device in this embodiment mode may have a function of displaying information on the amount or a water level of the coolant stored in the coolant tank, in the display portion. Further, the display device and the electronic device in this embodiment mode may have a function of displaying caution for promoting the supplement of the coolant in the display portion, in the case where the amount becomes smaller than a reference value or the water level of the coolant stored in the coolant tank becomes lower than a reference value.

Figure 60:
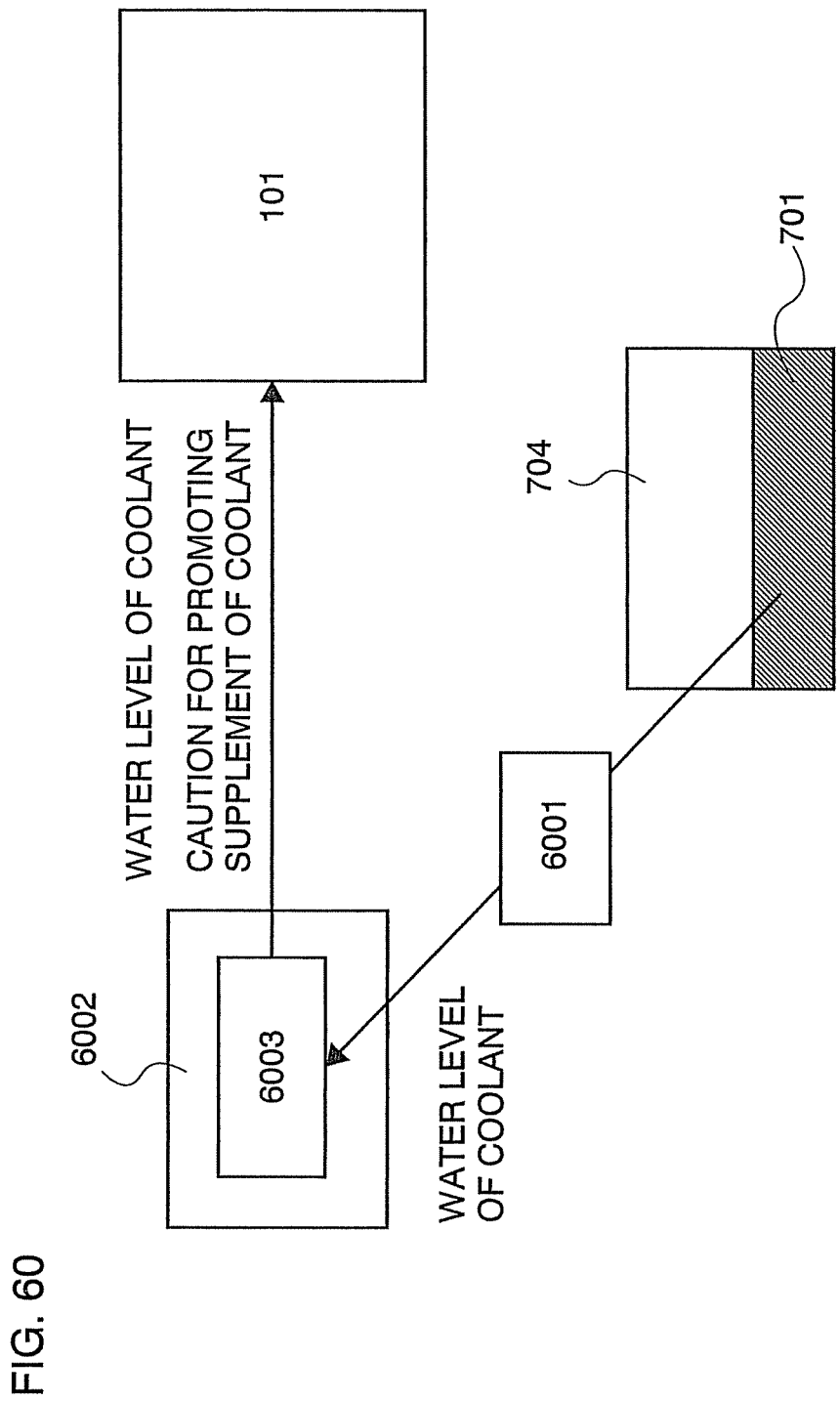
FIG. 60 is a block diagram showing a configurational example of a display device of the invention.

For example, by employing a method described below, information on the amount or a water level of the coolant stored in the coolant tank, the caution for promoting the supplement of the coolant, or the like can be displayed in the display portion. This method is described with reference to FIG. 60.

For example, a sensor 6001 is arranged in the coolant tank 704. The sensor 6001 detects the water level of the coolant 701 and outputs a signal based on the water level of the coolant. The signal output from the sensor 6001 is input into a controller 6003 arranged in a driver circuit board 6002. The controller 6003 generates a signal for displaying the water level of the coolant. In addition, in the case where the water level of the coolant stored in the coolant tank becomes lower than a reference value, a signal for displaying the caution for promoting the supplement of the coolant is generated. Then, a signal for displaying caution of the water level of the coolant and for promoting the supplement of the coolant is input into the liquid crystal panel 101 having the display portion. Thus, the caution of the water level of the coolant and for promoting the supplement of the coolant can be displayed in the display portions.

By displaying information on the amount or the water level of the coolant stored in the coolant tank, the caution for promoting the supplement of the coolant, or the like in the display portion in this manner, shortage of the coolant can be prevented beforehand, and thus, decrease of the cooling efficiency of the LED backlight caused by the shortage of the coolant can be prevented.

Note that with respect to a driving method of the LED backlight, a driving method where the LEDs are continuously turned on during one frame period displaying an image for one scene of pictures may be performed, or a driving method where some or all of the LEDs for forming the LED backlight are turned off every time an image is switched may be performed.

For example, by turning off the all of the LEDs forming the LED backlight every time the images are switched, a black image on the entire screen can be inserted between an image displayed at present and an image displayed next. Alternatively, by sequentially turning off some of the LEDs forming the LED backlight every time the images are switched, a black image on a part of the screen can be inserted between an image displayed at present and an image displayed next.

By turning off some or the all of the LEDs fainting the LED backlight every time the images are switched in this manner, a blur of a moving image caused by an after image which is perceived by retinas of a person can be improved, and thus, a moving image having excellent image quality can be displayed.

In addition, as the driving method of the LED backlight, field sequential driving where three colors of LEDs of R, and B are time-divided to be sequentially turned on in one frame period may be performed. By performing the field sequential driving, the light of three colors of R, G, and B easily mix with each other so that a high-definition image having high color reproductivity can be displayed.

Note that the configurational examples of the electronic devices shown in this embodiment mode are only just examples, and thus, the invention is not limited to the contents described in this embodiment mode.

Note that the contents described in this embodiment mode may be freely combined with the contents described in Embodiment Modes 1 to 5 and implemented.

Embodiment Mode 7

In addition to the examples illustrated in Embodiment Mode 6, a navigation system, an audio reproducing device (e.g., a car audio or audio component set), a computer such as a laptop computer, a game machine, an image reproducing device arranged with a recording medium (specifically, a device for reproducing a content of a recording medium such as a digital versatile disc (DVD) and having a display for displaying an reproduced image), and the like are given as electronic devices which apply a display device using the LED backlight and the cooling device of the invention. FIGS. 61A to 61D show specific examples of the electronic devices.

Figure 61A:
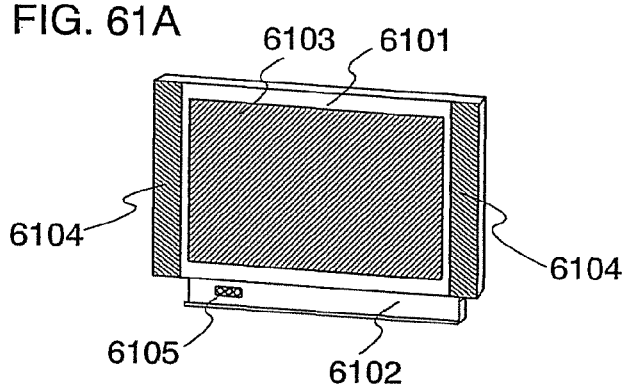
FIGS. 61A to 61D are views showing examples of electronic devices to which a display device of the invention can be applied.

FIG. 61A shows a display device for displaying information, which includes a housing 6101, a support medium 6102, a display portion 6103, a speaker portion 6104, a video input terminal 6105, and the like. The invention can be applied to a display device for forming the display portion 6103, and the clear image where the display unevenness or the color evenness is reduced can be viewed by employing the invention. Note that the display device for displaying information includes all of display devices for displaying information such as those for personal computers, television broadcast reception, and advertisement display.

In particular, by applying the LED backlight and the cooling device of the invention to a display device for displaying information used for digital television broadcast reception, an advantageous effect of decrease in the display unevenness or the color unevenness becomes greater so that clearer images can be viewed.

Figure 61B:
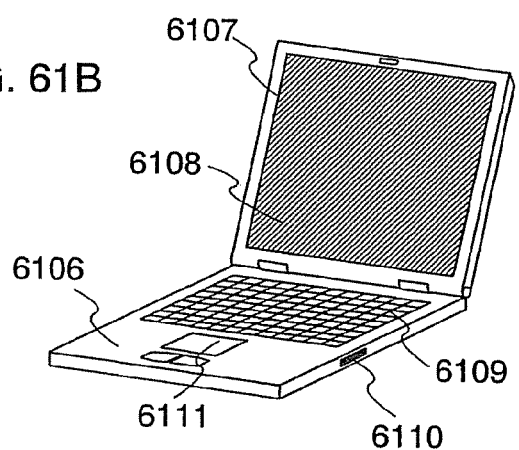

FIG. 61B shows a laptop computer, which includes a main body 6106, a housing 6107, a display portion 6108, a keyboard 6109, an external connecting port 6110, a pointing device 6111, and the like. The invention can be applied to a display device for forming the display portion 6108, and the clear image where the display unevenness or the color evenness is reduced can be viewed by employing the invention.

Figure 61C:
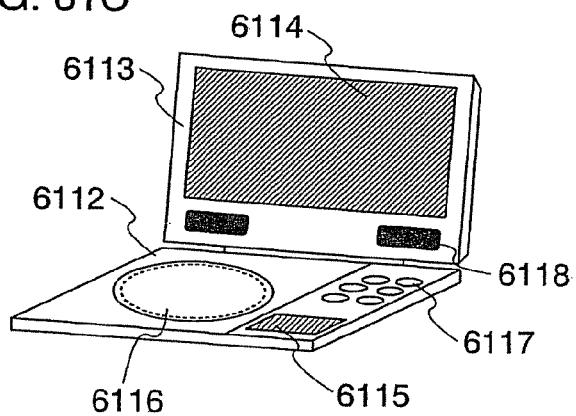

FIG. 61C shows a portable image reproducing device provided with a recording medium (specifically, a DVD player), which includes a main body 6112, a housing 6113, display portions A6114 and B36115, a recording medium (e.g., DVD) reading portion 6116, operating keys 6117, a speaker portion 6118, and the like. The display portion A6114 mainly displays image data and the display portion B6115 mainly displays textual data. The invention can be applied to a display device for forming the display portions A6114 and B6115 and the clear image where the display unevenness or the color evenness is reduced can be viewed by employing the invention. Note that the image reproducing device provided with the recording medium includes a home-use game machine and the like.

Figure 61D:
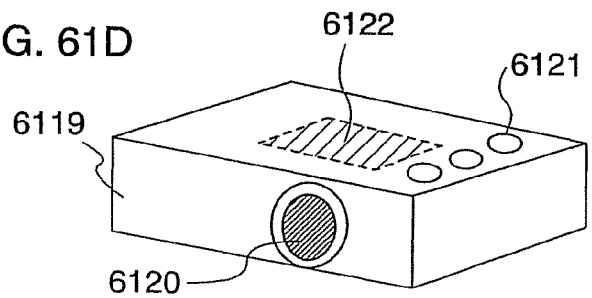

The LED backlight and the cooling device of the invention can be utilized not only as a backlight of a liquid crystal panel but also as a lighting device arranged with a cooling device. For example, FIG. 61D shows a projector, which includes a housing 6119, a lens 6120, operating buttons 6121, a light-emitting portion 6122, and the like. The invention can be applied to a lighting device forming the light-emitting portion 6122 which is incorporated inside of a projector. A high quality image where the display unevenness or the color evenness is reduced can be viewed by employing the invention.

In addition, in the case of utilizing the LED backlight and the cooling device of the invention as the lighting device, the liquid crystal panel is not necessary to be arranged. The LED backlight and the cooling device of the invention may be utilized as a lighting device such as room light, a lighting device for an inside of a car, or a display board.

Further, the cooling device of the invention may be utilized not only as the cooling device for cooling the LED backlight, but also as the cooling device of the display device. For example, it may be utilized as a cooling device of a display device using FED.

As described above, an application range of the invention is extremely wide and the invention can be applied to electronic devices in all fields. In addition, the electronic devices in this embodiment mode may employ any one of the configurations described in Embodiments Modes 1 to 6.

The present application is based on Japanese Patent application No. 2005-379956 filed on Dec. 28, 2005 with the Japanese Patent Office, the entire contents of which are hereby incorporated by reference.

What is claimed is:

1. A display device comprising:
a liquid crystal panel; and
a back light adjacent to the liquid crystal panel, the back light comprising:
a thermal conductor;
a first board over the thermal conductor;
a second board over the thermal conductor;
a first light-emitting diode over the first board;
a second light-emitting diode over the second board; and
a reflecting portion over the thermal conductor and between the first light-emitting diode and the second light-emitting diode,
wherein the first board and the second board do not overlap with each other,
wherein the first light-emitting diode does not overlap with the reflecting portion, and
wherein the second light-emitting diode does not overlap with the reflecting portion.

2. A display device according to claim 1, further comprising a pipe in which a coolant flows to cool the back light.

3. A display device according to claim 1, wherein the reflecting portion covers the first board and the second board.

4. A display device according to claim 1, wherein the liquid crystal panel includes a thin film transistor comprising In and O.

5. A display device according to claim 1, wherein the thermal conductor contains a metal selected from the group consisting of copper, iron, aluminum, and a stainless steel.

6. A display device according to claim 1, wherein the display device is incorporated in one selected from the group consisting of a television set, a computer, an image reproducing device, and a projector.

7. A display device comprising:
a liquid crystal panel; and
a back light adjacent to the liquid crystal panel, the back light comprising:
a thermal conductor;
a first board over the thermal conductor;
a second board over the thermal conductor;
a first light-emitting diode over the first board;
a second light-emitting diode over the second board; and
a reflecting portion containing a plastic over the thermal conductor and between the first light-emitting diode and the second light-emitting diode,
wherein the first board and the second board do not overlap with each other,
wherein the first light-emitting diode does not overlap with the reflecting portion, and
wherein the second light-emitting diode does not overlap with the reflecting portion.

8. A display device according to claim 7, further comprising a pipe in which a coolant flows to cool the back light.

9. A display device according to claim 7, wherein the reflecting portion covers the first board and the second board.

10. A display device according to claim 7, wherein the liquid crystal panel includes a thin film transistor comprising In and O.

11. A display device according to claim 7, wherein the thermal conductor contains a metal selected from the group consisting of copper, iron, aluminum, and a stainless steel.

12. A display device according to claim 7, wherein the display device is incorporated in one selected from the group consisting of a television set, a computer, an image reproducing device, and a projector.

13. A display device comprising:
a liquid crystal panel;
a back light adjacent to the liquid crystal panel, the back light comprising:
a thermal conductor;
a first board over the thermal conductor;
a second board over the thermal conductor;
a first light-emitting diode over the first board;
a second light-emitting diode over the second board; and
a reflecting portion over the thermal conductor and between the first light-emitting diode and the second light-emitting diode,
a diffusion film;
a prism sheet; and
a polarizing film,
wherein the diffusion film, the prism sheet and the polarizing film are interposed between the liquid crystal panel and the back light,
wherein the first board and the second board do not overlap with each other
wherein the first light-emitting diode does not overlap with the reflecting portion, and
wherein the second light-emitting diode does not overlap with the reflecting portion.

14. A display device according to claim 13, further comprising a pipe in which a coolant flows to cool the back light.

15. A display device according to claim 13, wherein the reflecting portion covers the first board and the second board.

16. A display device according to claim 13, wherein the liquid crystal panel includes a thin film transistor comprising In and O.

17. A display device according to claim 13, wherein the thermal conductor contains a metal selected from the group consisting of copper, iron, aluminum, and a stainless steel.

18. A display device according to claim 13, wherein the display device is incorporated in one selected from the group consisting of a television set, a computer, an image reproducing device, and a projector.

19. A display device comprising:
a liquid crystal panel; and
a back light adjacent to the liquid crystal panel, the back light comprising:
a thermal conductor;
a first board over the thermal conductor;
a second board over the thermal conductor;
a first light-emitting diode over the first board;
a second light-emitting diode over the second board; and
a reflecting portion containing a plastic over the thermal conductor and between the first light-emitting diode and the second light-emitting diode;
a diffusion film;
a prism sheet; and
a polarizing film,
wherein the diffusion film, the prism sheet and the polarizing film are interposed between the liquid crystal panel and the back light,
wherein the first board and the second board do not overlap with each other,
wherein the first light-emitting diode does not overlap with the reflecting portion, and
wherein the second light-emitting diode does not overlap with the reflecting portion.

20. A display device according to claim 19, further comprising a pipe in which a coolant flows to cool the back light.

21. A display device according to claim 19, wherein the reflecting portion covers the first board and the second board.

22. A display device according to claim 19, wherein the liquid crystal panel includes a thin film transistor comprising In and O.

23. A display device according to claim 19, wherein the thermal conductor contains a metal selected from the group consisting of copper, iron, aluminum, and a stainless steel.

24. A display device according to claim 19, wherein the display device is incorporated in one selected from the group consisting of a television set, a computer, an image reproducing device, and a projector.

25. A display device according to claim 1, further comprising a third light-emitting diode over the first board.

26. A display device according to claim 7, further comprising a third light-emitting diode over the first board.

27. A display device according to claim 13, further comprising a third light-emitting diode over the first board.

28. A display device according to claim 19, further comprising a third light-emitting diode over the first board.

* * * * *

UNITED STATES PATENT AND TRADEMARK OFFICE
CERTIFICATE OF CORRECTION

| | | |
|---|---|---|
| PATENT NO. | : 8,564,741 B2 | Page 1 of 1 |
| APPLICATION NO. | : 12/834152 | |
| DATED | : October 22, 2013 | |
| INVENTOR(S) | : Hajime Kimura et al. | |

It is certified that error appears in the above-identified patent and that said Letters Patent is hereby corrected as shown below:

In the Specification:

Column 5, line 32; Change "showing, a" to --showing a--.
Column 6, line 60; Change "diagrams, showing" to --diagrams showing--.
Column 8, lines 43-44; Change "R, B," to --R, G, B,--.
Column 8, line 57; Change "R, and B" to --R, G, and B--.
Column 19, line 2; Change "cooling, device" to --cooling device--.
Column 21, line 41; Change "and, the" to --and the--.
Column 28, line 41; Change "R, and B" to --R, G, and B--.
Column 30, line 26; Change "in. FIGS." to --in FIGS.--.
Column 37, line 36; Change "fainting" to --forming--.
Column 37, lines 43-44; Change "R, and B" to --R, G, and B--.

Signed and Sealed this
Eighteenth Day of March, 2014

Michelle K. Lee
*Deputy Director of the United States Patent and Trademark Office*